United States Patent
Nikitin

(10) Patent No.: US 8,694,273 B2
(45) Date of Patent: Apr. 8, 2014

(54) METHOD AND APPARATUS FOR ADAPTIVE REAL-TIME SIGNAL CONDITIONING AND ANALYSIS

(75) Inventor: Alexei V. Nikitin, Lawrence, KS (US)

(73) Assignee: Avatekh, Inc., Lawrence, KS (US)

( * ) Notice: Subject to any disclaimer, the term of this patent is extended or adjusted under 35 U.S.C. 154(b) by 0 days.

(21) Appl. No.: 12/927,149

(22) Filed: Nov. 8, 2010

(65) Prior Publication Data

US 2011/0112784 A1     May 12, 2011

Related U.S. Application Data

(60) Provisional application No. 61/280,821, filed on Nov. 9, 2009, provisional application No. 61/280,833, filed on Nov. 9, 2009, provisional application No. 61/399,040, filed on Jul. 6, 2010, provisional application No. 61/455,481, filed on Oct. 21, 2010.

(51) Int. Cl.
    *H01H 1/00*           (2006.01)
    *H03H 11/04*        (2006.01)

(52) U.S. Cl.
    CPC ............................. *H03H 11/0405* (2013.01)
    USPC ............................................................ 702/70

(58) Field of Classification Search
    CPC .......................... H03H 11/0405; H03H 11/04
    USPC ............................................................ 702/70
    See application file for complete search history.

(56) References Cited

U.S. PATENT DOCUMENTS

| | | | | |
|---|---|---|---|---|
| 3,654,563 | A | * | 4/1972 | Hesler et al. ................... 327/552 |
| 5,315,171 | A | * | 5/1994 | Blauer et al. ..................... 327/71 |
| 6,262,623 | B1 | * | 7/2001 | Molnar .......................... 327/552 |
| 6,768,969 | B1 | | 7/2004 | Nikitin |
| 6,904,390 | B2 | | 6/2005 | Nikitin |
| 7,107,306 | B2 | | 9/2006 | Nikitin |
| 7,133,568 | B2 | | 11/2006 | Nikitin |
| 7,188,053 | B2 | | 3/2007 | Nikitin |
| 7,242,808 | B2 | | 7/2007 | Nikitin |

(Continued)

OTHER PUBLICATIONS

A. Diaz-Sanchez, et. al., A Fully Parallel CMOS Analog Median Filter, IEEE Trans, Circuits & Systems II., vol. 51:116-123, Mar. 2004.

P.J.S.G Ferreria., Sorting Continuous-time Signal and the Analog Median Filter. IEEE Signal Processing Letters, 7(10):281-283, 2000.

(Continued)

*Primary Examiner* — Jonathan C. Teixeira Moffat
*Assistant Examiner* — Regis Betsch
(74) *Attorney, Agent, or Firm* — Erickson Kernell Derusseau & Kleypas, LLC

(57) ABSTRACT

The present invention constitutes a method, processes, and apparatus for measurement and analysis of variables of different type and origin. In particular, the invention presents a method and apparatus for real-time signal conditioning and analysis in the presense of impulsive, or sparse interferences. The present invention overcomes limitations of the prior art by providing a novel method for identifying and discriminating between, in real time, the conditions of the signal with and without impulsive disturbances. This method can be implemented without substantial changes in the signal processing chain of a communication or data acquisition system.

The present invention also overcomes the shortcomings of the prior art through the introduction of the novel SPART filters, which can replace the corresponding analog linear filters in the signal chain of a device. SPART filters have the ability to sense and discriminate between, in real time, the conditions of the signal with and without impulsive disturbances, and temporarily adjust their behavior in a manner which reduces the power of these disturbances.

64 Claims, 47 Drawing Sheets

(56) References Cited

U.S. PATENT DOCUMENTS

| | | |
|---|---|---|
| 7,418,469 B2 | 8/2008 | Nikitin |
| 7,617,270 B2 | 11/2009 | Nikitin |
| 2009/0259709 A1* | 10/2009 | Nikitin .......................... 708/801 |

OTHER PUBLICATIONS

A.V. Nikitin, On the Impulsive nature of Interchannel Interference in Digital Communication Systems; Radio and Wireless Symposium (RWS) IEEE, 2011.

A.V. Nikitin, Signal Analysis through Analog Representation; Proc. R. Soc. London; A, 459 (2033): 1171-1192, 2003.

A. V. Nikitin, et. al.; Adaptive Approximation of Feedback Rank Filters for Continuous Signals; Signal Processing, 84 (4):805-811, 2004.

A. V. Nikitin, et. al; Analog Multivariate Counting Analyzers; Nucl. Instr. & Meth.; A496 (2-3):45-480, 2003.

S. Paul and K. Huper; Analog Rank Filtering; IEEE Trans.; Circuits Syst.—I, 40 (7):469-476, Jul. 1993.

S.O. Rice; Mathematical Analysis of Random Noise; Bell System Technical Journal, 23: 282-332, 1944. Ibid, 24-46-156, 1945. Reprinted in: Nelson Wax, Selected Papers on Noise and Stochastic Processes; Dover, New York, 1954.

R. P. Sallen and E. I. Key; A Practical Method of Designing RC Active Filters; IRE Transactions on Circuit Theory, CT-2, 1955.

C.E. Shannon; Communication in the Presence of Noise; Proc. Institute of Radio Engineers, 37(1):10-21, Jan. 1949.

S. Vassis, et. al; Analog Implementaion of Eroision/Dilation, Median, and Order Statistics Fliters; Pattern Recognition; 33(6):1023-1032, 2000.

* cited by examiner

METHOD AND APPARATUS FOR ADAPTIVE REAL-TIME SIGNAL CONDITIONING AND ANALYSIS

CROSS REFERENCES TO RELATED APPLICATIONS

This application claims the benefit of the U.S. Provisional Patent Application No. 61/280,821 filed on Nov. 9, 2010, No. 61/280,833 filed on Nov. 9, 2010, No. 61/399,040 filed on Jul. 6, 2010, and No. 61/455,481 filed on Oct. 21, 2010, which are incorporated herein by reference in their entirety.

STATEMENT REGARDING FEDERALLY SPONSORED RESEARCH OR DEVELOPMENT

None.

COPYRIGHT NOTIFICATION

Portions of this patent application contain materials that are subject to copy-right protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to methods, processes and apparatus for real-time measuring and analysis of variables. In particular, it relates to adaptive real-time signal conditioning, processing, analysis, quantification, comparison, and control. This invention also relates to generic measurement systems and processes, that is, the proposed measuring arrangements are not specially adapted for any specific variables, or to one particular environment. This invention also relates to methods and corresponding apparatus for measuring which extend to different applications and provide results other than instantaneous values of variables. The invention further relates to post-processing analysis of measured variables and to statistical analysis.

BACKGROUND OF THE INVENTION

Signals of interest in various data acquisition and processing devices are always affected by various interferences (noise) from natural and man-made sources. Be it a signal from a sensor, or a signal from a transmitter in a communication chain, the amount of noise affecting the signal needs to be reduced in order to improve the signal quality.

Since a signal of interest typically occupies a different and/or narrower frequency range than the noise, linear filters are applied to the incoming mixture of the signal and the noise in order to reduce the frequency range of the mixture to that of the signal. This reduces the power of the interference to a fraction of the total, limited to the frequency range of the signal.

However, the noise having the same frequency power spectrum can have various peakedness, and be impulsive or non-impulsive. For example, white shot noise is much more impulsive than white thermal noise, while both have identically flat power spectra. Linear filtering in the frequency domain does not discriminate between impulsive and non-impulsive noise contributions, and does not allow mitigation of the impulsive noise relative to the non-impulsive. In addition, reduction in the bandwidth of an initially impulsive noise by linear filtering makes the noise less impulsive, decreasing the ability to separate the signal from the noise based on their peakedness.

Effective suppression of impulsive interferences typically requires nonlinear means, for example, processing based on order statistics. These means can be employed either through digital signal processing, or in the analog signal chain. The nonlinear filters in the analog signal chain can range from simple slew rate limiting filters to more sophisticated analog rank filters described, for example, in U.S. Pat. Nos. 7,133,568 and 7,242,808, referenced as (Nikitin and Davidchack, 2006 and 2007), and U.S. Pat. Nos. 7,107,306, 7,418,469, and 7,617,270, referenced as (Nikitin, 2006, 2008, and 2009).

However, the practical use of nonlinear filters is limited as it typically results in complicated design considerations and in multiple detrimental effects on normal signal flow. These filters cause various nonlinear distortions and excessive attenuation of the signal, and their effect on the useful signal components is typically unpredictable and depends on the type and magnitude of the interfering signal.

A particular example of impulsive interference is the electromagnetic interference (EMI), also called radio frequency interference (RFI). It is a widely recognized cause of reception problems in communications and navigation devices.

EMI is a disturbance that affects an electrical circuit due to either conduction or radiation emitted from a source internal or external to the device. EMI may interrupt, obstruct, or otherwise degrade the effective performance of the device, and limit its link budget. The detrimental effects of EMI are broadly acknowledged in the industry and include: (i) reduced signal quality to the point of reception failure, (ii) increased bit errors which degrade the system resulting in lower data rates and decreased reach, and (iii) increased power output of the transmitter, which reduces the battery life and increases its interference with nearby receivers.

A major and rapidly growing source of EMI in communication and navigation receivers is other transmitters that are relatively close in frequency and/or distance to the receivers. Multiple transmitters and receivers are increasingly combined in single devices which produces mutual interference A typical example is a smartphone equipped with cellular, WiFi, Bluetooth, and GPS receivers. Other typical sources of strong EMI are on-board digital circuits, clocks, buses, and power supplies.

Most state-of-the-art analog mitigation methods of EMI focus on reducing the interference before it reaches the receiver, and none of these methods allows effective EMI filtering once it has entered the receiver chain. After the interference has entered the signal path, only computationally and silicon intensive nonlinear, non-real-time digital signal processing solutions are offered.

Other systems impeded by the impulsive noise and artifacts are various sensor systems, including all coherent imaging systems. A common example is various medical imaging systems such as ultrasonic, which are generally affected by multiplicative shot (or speckle) noise. Typically, various methods of reduction of the speckle noise involve non-real-time adaptive and non-adaptive speckle filtering of the acquired images, or multi-look processing.

BRIEF SUMMARY OF THE INVENTION

Due to the sporadic and transient nature of impulsive interferences, their effective suppression can be achieved by using filters which behave nonlinearly only during the occurrence of relatively high power disturbances, and maintain linear behavior otherwise. The present invention overcomes limitations of the prior art by providing a novel method for identifying and discriminating between, in real time, the conditions of the signal with and without impulsive disturbances. This method can be implemented without substantial changes in the signal processing chain of a communication or data acquisition system.

The present invention also overcomes the shortcomings of the prior art through the introduction of the novel SPART filter family. This filter family can be considered a novel non-obvious improvement on the Single Point Analog Rank Tracker (SPART) filter initially described in (Nikitin, 2006, 2008, and 2009), with which the new filters share some methodological similarities. In this disclosure, reference to "SPART'" and "FrankenSPART'" filters shall mean those of the present invention SPART filter family, and not the SPART filter disclosed in (Nikitin, 2006, 2008, and 2009), which we may refer to in this application as "prior-SPART'".

The present invention SPART filters have the following useful properties:
(i) a SPART filter can replace a corresponding analog linear filter in the signal chain of a device;
(ii) a SPART filter has the ability to sense and discriminate between, in real time, the conditions of the signal with and without impulsive disturbances;
(iii) when the mixture of the signal and the noise is non-impulsive, a SPART filter acts just like the linear filter it replaces; and
(iv) a SPART filter senses the spurious impulsive disturbances in real time, and adjusts its behavior for the duration of those disturbances in a manner which reduces the power of the disturbances.

When an interference contains an impulsive component, SPART filters have the ability to improve the signal-to-noise ratio even if the spectral density of the noise lies entirely within the passband of the signal.

SPART filters can also be implemented digitally, without memory and high computational cost limitations of the nonlinear processing found in the existing art.

Further scope of the applicability of the invention will be clarified through the detailed description given hereinafter. It should be understood, however, that the specific examples, while indicating preferred embodiments of the invention, are presented for illustration only. Various changes and modifications within the spirit and scope of the invention should become apparent to those skilled in the art from this detailed description. Furthermore, all the mathematical expressions and the examples of hardware implementations are used only as a descriptive language to convey the inventive ideas clearly, and are not limitative of the claimed invention.

DETAILED DESCRIPTION OF THE INVENTION

Figure 1:
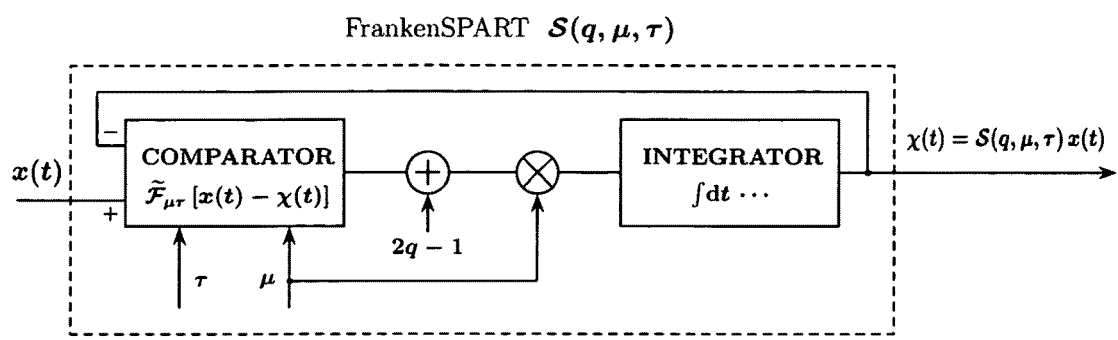
FIG. 1. Simplified block diagram of implementation of a FrankenSPART method and/or circuit.

1 Intermittently Nonlinear Analog Filters for Suppression of Impulsive Interferences Effective suppression of impulsive interferences in a signal chain of a communication receiver typically requires nonlinear means, for example, median or slew rate limiting filters. However, usage of nonlinear filters typically results in multiple detrimental effects on normal signal flow, such as nonlinear distortions and excessive attenuation of the signal. The effect of nonlinear filters on the useful signal components is typically unpredictable since it depends on the type and magnitude of the interfering signal.

Due to the sporadic nature of impulsive interferences, their effective suppression can be achieved by using analog filters which behave nonlinearly only during the occurrence of relatively high power disturbances, and maintain linear behavior otherwise. We here describe such intermittently nonlinear analog filters.

1.1 Intermittently Nonlinear RC Integrator: FrankenSPART

Let us consider a modification of the Single Point Analog Rank Tracker (SPART) filter initially described in (Nikitin, 2006, 2008, and 2009) (herein "prior-SPART"). This modification, to which we may refer further as "FrankenSPART", constitutes the main building block of the SPART filter family described in this disclosure.

The FrankenSPART filter can be represented by the operator $\underset{\sim}{S} = \underset{\sim}{S}(q,\mu,\tau)$ such that $$\underset{\sim}{S}(q,\mu,\tau)x(t) = \chi(q,\mu,\tau)(t) = \mu \int dt \{ \tilde{\mathcal{F}}_{\mu\tau}[x(t) - \chi(q,\mu,\tau)(t)] + 2q - 1 \}, \quad (1)$$

where $\int dt \ldots$ denotes the primitive (antiderivative), $x(t)$ is the input signal, $\chi(q,\mu,\tau)(t)$ is the output, and the comparator function $\tilde{\mathcal{F}}_\alpha(x)$ with the resolution (linear range) parameter $\alpha$ is $$\tilde{\mathcal{F}}_\alpha(x) = \begin{cases} \dfrac{x}{\alpha} & \text{for } |x| < \alpha \\ \operatorname{sgn}(x) & \text{otherwise,} \end{cases} \quad (2)$$

where $\operatorname{sgn}(x)$ is the sign function. The parameters $\tau$, $\mu$, and $q$ are the time constant, slew rate, and quantile parameters of the filter, respectively. Equation (1) can also be written in the form of a differential equation as follows:

$$\frac{d}{dt}\chi(q,\mu,\tau)(t) = \mu\{\tilde{\mathcal{F}}_{\mu\tau}[x(t) - \chi(q,\mu,\tau)(t)] + 2q - 1\}. \quad (3)$$

Equation (1) and/or equation (3) can be used as a basis for the following implementation of FrankenSPART:

(i) apply the comparator function $\tilde{\mathcal{F}}_{\mu\tau}(x)$ given by equation (2) to the difference $x(t) - \chi(q,\mu,\tau)(t)$ of the input signal $x(t)$ and the feedback of the output $\chi(q,\mu,\tau)(t)$;

(ii) linearly transform the output of Step (i) by adding the offset $2q-1$ indicative of the quantile parameter $q$, then multiplying the result by the slew rate parameter $\mu$; and (iii) integrating said linearly transformed output of the comparator to obtain the output of the filter $\chi(q,\mu,\tau)(t)$.

A simplified block diagram of an implementation of a FrankenSPART method and/or circuit is shown in FIG. 1.

An example of a numerical algorithm implementing a finite-difference version of a FrankenSPART filter is given by the following MATLAB function:

```
function Dq = S_undertilde(x,t,q,mu,tau)
   Dq = zeros(size(x)); alpha = mu*tau; Dq(1) = x(1) + alpha*(2*q-1);
   for i = 2:length(x);
      FF = (x(i)-Dq(i-1))/alpha;
      if abs(FF)>1, FF = sign(FF); end
      Dq(i) = Dq(i-1) + mu * ( FF + 2*q - 1 ) * (t(i)-t(i-1));
   end
return
```

Note that, given the three parameters $\tau$, $\mu$, and $q$, obtaining the value of the output for the current time and input values requires only a few simple operations, and the knowledge of just two previous values: the time and the output.

1.1.1 In Linear Regime FrankenSPART is an RC Integrator

When the condition that the absolute value of the difference between the input and the output does not exceed the resolution of the comparator, $|x(t)-\chi(q,\mu,\tau)(t)| \leq \mu\tau$, holds, solving equation (3) leads to $$\chi(q, \mu, \tau)(t) = h_\tau(t) * x(t) + \mu\tau(2q - 1), \quad (4)$$

where $$h_\tau(t) = \frac{1}{\tau} e^{-t/\tau} \theta(t) \quad (5)$$

is the impulse response of an RC integrator with RC=$\tau$.

In median mode q=1/2, and $$\chi\left(\frac{1}{2}, \mu, \tau\right)(t) = h_\tau(t) * x(t) \text{ if } \left|\frac{d}{dt} h_\tau(t) * x(t)\right| \leq \mu. \quad (6)$$

That is, given an input signal x(t), the output of the filter $$\underline{S}\left(\frac{1}{2}, \mu, \tau\right)$$

will be equal to the output of an RC integrator with RC=$\tau$ if the absolute value of the slew rate of the latter does not exceed $\mu$.

1.1.2 In Nonlinear Mode Median FrankenSPART Produces an Output with Constant Slew Rate When the absolute value of the difference between the input and output of the filter $$\underline{S}\left(\frac{1}{2}, \mu, \tau\right)$$

exceeds the linear range (resolution) of the comparator $\tilde{\mathcal{F}}_{\mu\tau}$, the filter switches into the nonlinear mode, producing an output with constant slew rate. The filter remains in this constant slew rate mode until the difference between the input and output of the filter returns to the linear range.

Figure 2:
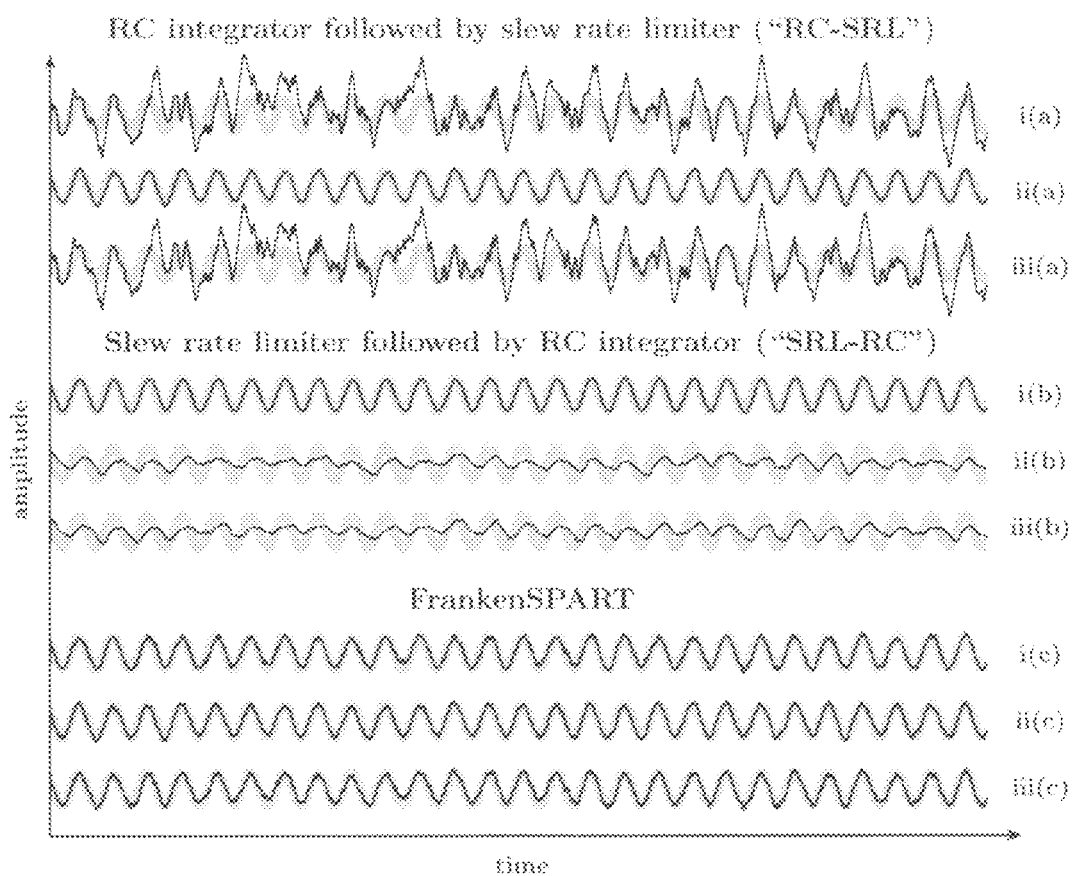
FIG. 2. Comparison of FrankenSPART with series combinations of RC integrator and slew rate limiter. The input signal is a harmonic tone affected by (i) an additive broadband white impulsive noise, (ii) a broadband white nonimpulsive noise, and (iii) by the sum of (i) and (ii). The input is filtered by (a) an RC integrator followed by a slew rate limiter ("RC-SRL"), (b) a slew rate limiter followed by an RC integrator ("SRL-RC"), and (c) by a FrankenSPART filter with the corresponding time constant and slew rate parameters. The gray lines in all traces show the outputs when the input is a pure tone unaffected by the noise. One can see that, while the RC-SRL is effective against the nonimpulsive noise, and the SRL-RC is effective against the impulsive noise, these combinations fail in the presence of the noise which is the sum of both impulsive and nonimpulsive. FrankenSPART, on the other hand, performs well in all three cases.

1.1.3 Median FrankenSPART is not a Combination of an RC Integrator and a Slew Rate Limiter Even though the median FrankenSPART filter acts as either, its performance cannot be replicated through any combination, series and/or parallel, of an RC integrator and a slew rate limiter. To illustrate that, let us consider a simplified example shown in FIG. 2, where the input signal is a harmonic tone affected by (i) an additive broadband white impulsive noise, (ii) a broadband white nonimpulsive noise, and (iii) by the sum of (i) and (ii). The input is filtered by (a) an RC integrator followed by a slew rate limiter ("RC-SRL"), (b) a slew rate limiter followed by an RC integrator ("SRL-RC"), and (c) by a FrankenSPART filter with the corresponding time constant and slew rate parameters. The gray lines in all traces show the outputs when the input is a pure tone unaffected by the noise. One can see that, while the RC-SRL is effective against the nonimpulsive noise, and the SRL-RC is effective against the impulsive noise, these combinations fail in the presence of the noise which is the sum of both impulsive and nonimpulsive. FrankenSPART, on the other hand, performs well in all three cases.

Figure 3:
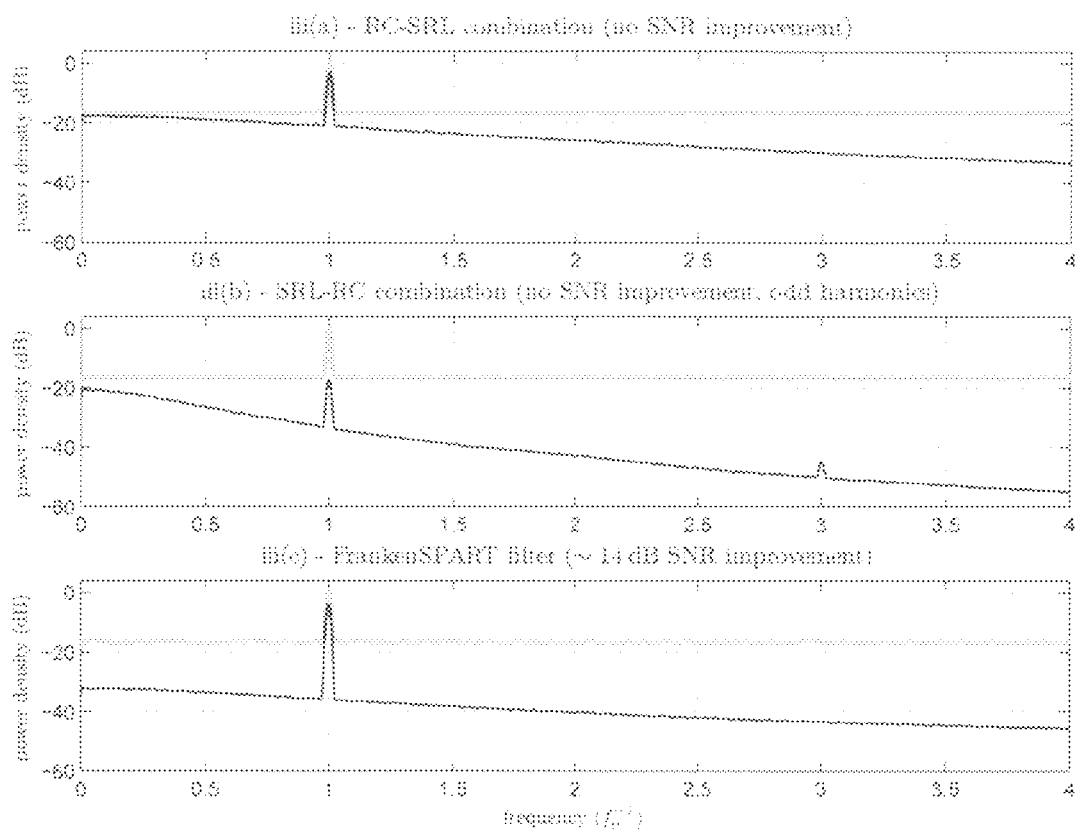
FIG. 3. Comparison of FrankenSPART with series combinations of RC integrator and slew rate limiter. The input signal is a harmonic tone affected by the sum of broadband white impulsive and nonimpulsive noises, corresponding to case (iii) in FIG. 2. The input is filtered by (a) an RC integrator followed by a slew rate limiter ("RC-SRL"), (b) a slew rate limiter followed by an RC integrator ("SRL-RC"), and (c) by a median FrankenSPART filter with the corresponding time constant and slew rate parameters. The gray lines in all traces show the power density of the sum of the signal and the noise before filtering. One can see that the FrankenSPART filter lowers the noise floor even in the signal passband, without affecting the signal, resulting in the SNR improvement.

FIG. 3 provides the frequency domain picture for case (iii). Neither RC-SRL nor SRL-RC improves the SNR, while the FrankenSPART filter lowers the noise floor even in the signal passband, without affecting the signal, resulting in the SNR improvement.

1.2 FrankenSPART Mitigation of Interchannel Interference

1.2.1 Impulsive Nature of Interchannel Interference

Interchannel interference in digital communications is typically impulsive. Consider, for example, a simplified measuring setup shown in FIG. 4. In the left-hand panel of the figure, the transmitter emits a single 1.2 GHz tone with the amplitude modulated by a random raised cosine-shaped 10 Mbit/s message. As illustrated in the upper right-hand panel, the total instantaneous power of the in-phase and quadrature components of an in-band quadrature receiver (Proakis and Manolakis, 2006) is proportional to the squared modulating signal. However, as shown in the lower right-hand panel, the total instantaneous power in an out-of-band receiver tuned to 1 GHz is an impulsive pulse train with multiple of 100 ns distance between the pulses. Note that there is no apparent relationship between the magnitude of the modulating signal and the magnitude of the pulses.

Figure 4:
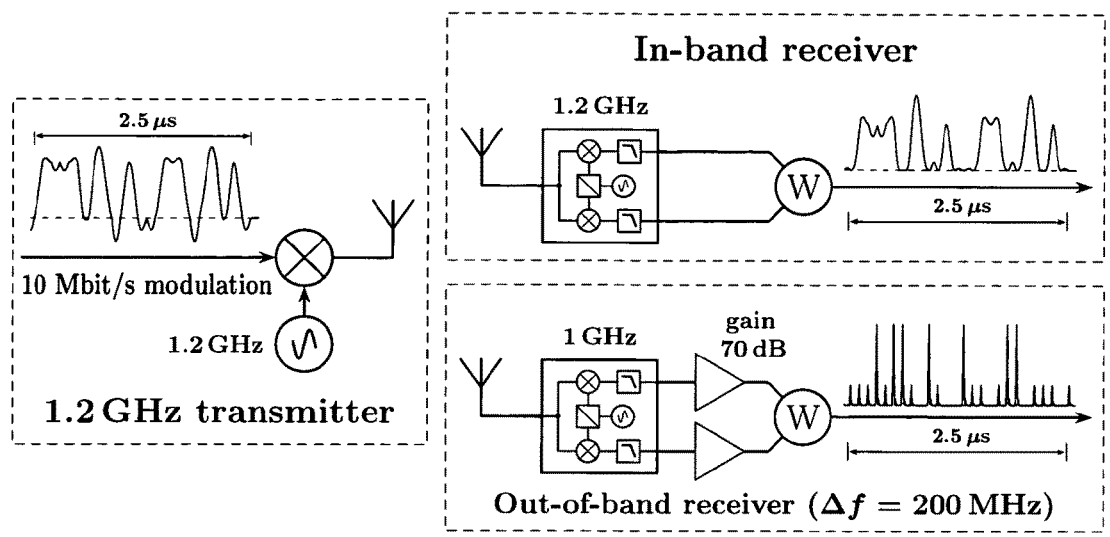
FIG. 4. Simplified setup for demonstration of the impulsive nature of interchannel interference.

It needs to be pointed out that the narrowness of pulses in the impulsive pulse train of FIG. 4 is due to the fact that, in this example, the bandwidth of the baseband filters in the receiver is about twice the bandwidth of the modulating signal. If one further reduces the bandwidth of the low-pass filters, the power of the interference will be reduced proportionally to the decrease in the bandwidth, and the interference will have an appearance of much less impulsive, "Gaussian-like" bandpass noise. If, however, the reduction in the bandwidth is accomplished by using a FrankenSPART in place of the first pole of the filter, the suppression of the interference can be much higher. This is illustrated in the example below.

1.2.2 Suppression of Interference: Illustrative Example

Figure 5:
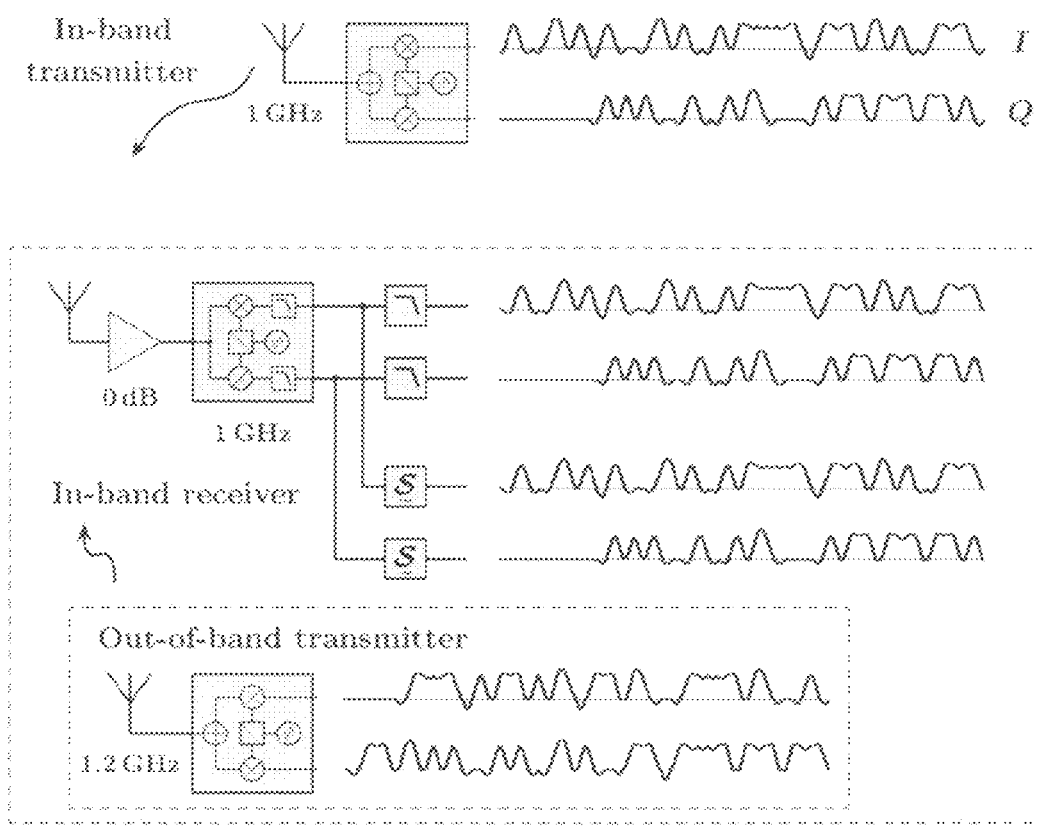
FIG. 5. Two equal-power transmitters are sending messages simultaneously, and the path attenuation is equal. Since the power of the out-of-band interference is much smaller than the in-band signal, the received message is uncorrupted and accurately represents the in-band transmitted message indicated by traces I and Q.
Figure 6:
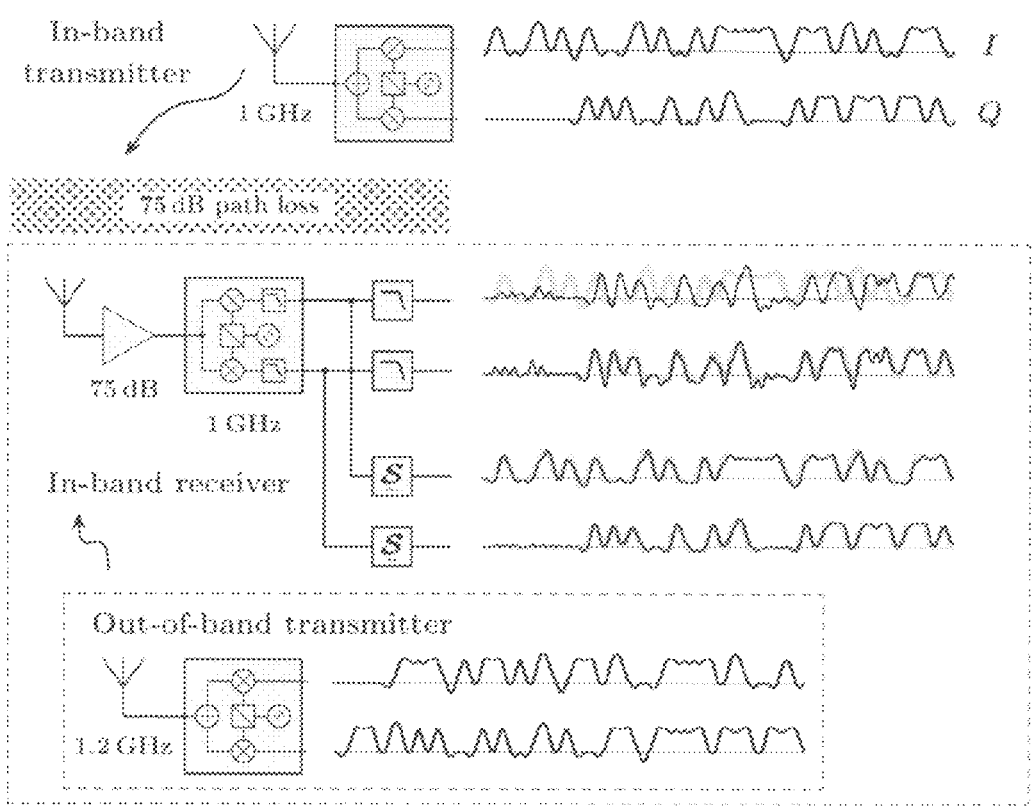
FIG. 6. With 75 dB gain in the receiver to compensate for the additional 75 dB path loss of the in-band transmitter, the out-of-band interference becomes strong enough to disrupt the message in the receiver using the linear baseband filters. The receiver with the FrankenSPART filters is largely unaffected by the interference. (The gray traces show the uncorrupted receiver signals I and Q.)
Figure 7:
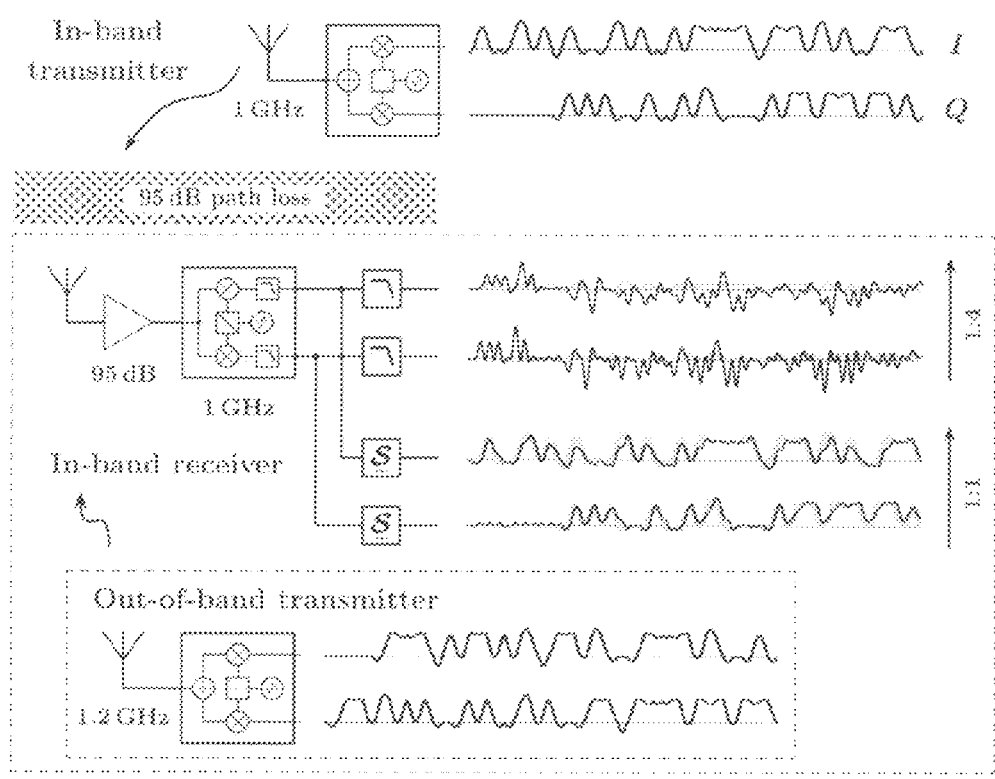
FIG. 7. With 95 dB gain in the receiver to compensate for the additional 95 dB path loss of the in-band transmitter, the out-of-band interference completely overpowers the message in the linear receiver, while the receiver with the FrankenSPART filters still maintains quality signal. (The gray traces show the uncorrupted receiver signals I and Q.)

FIGS. 5 through 7 provide an illustrative example of suppression of interchannel interference by FrankenSPART filters.

In FIG. 5, two equal-power transmitters are sending messages simultaneously, and the path attenuation is equal. Since the power of the out-of-band interference is much smaller than the in-band signal, the received message is uncorrupted and accurately represents the in-band transmitted message indicated by traces I and Q. As shown in FIG. 6, with 75 dB gain in the receiver to compensate for the additional 75 dB path loss of the in-band transmitter, the out-of-band interference becomes strong enough to disrupt the message in the receiver using the linear baseband filters. The receiver with the FrankenSPART filters is largely unaffected by the interference. (The gray traces show the uncorrupted receiver signals I and Q.) FIG. 7 shows that, with 95 dB gain in the receiver to compensate for the additional 95 dB path loss of the in-band transmitter, the out-of-band interference completely overpowers the message in the linear receiver, while the receiver with the FrankenSPART filters still maintains quality signal. (The gray traces show the uncorrupted receiver signals I and Q.)

1.3 Mitigation of Impulsive Noise by SPART Filters

Let us outline a general list of properties of a SPART filter (which we here denote as an operator $\mathcal{L}$) useful for mitigation of impulsive noise in the analog signal chain of a communication receiver:

(i) $\mathcal{L}$ can replace a corresponding analog linear filter in the signal chain of a receiver;

(ii) $\mathcal{L}$ has the ability to sense and discriminate between, in real time, the conditions of the signal with and without impulsive disturbances;

(iii) when the noise is purely thermal or otherwise non-impulsive, $\mathcal{L}$ acts just like the linear filter it replaces, and (iv) $\mathcal{L}$ senses the spurious impulsive disturbances in real time, and adjusts its behavior for the duration of those disturbances in a manner which reduces the power of the disturbances.

Let us now provide an example of how a combination of FrankenSPART filters $\mathcal{S}$ can be used to construct a SPART filter $\mathcal{L}$ satisfying the conditions ((i)) through ((iv)).

1.3.1 Discriminating Between Stationary State and Impulsive Disturbances

Let $D_q^x(t) = Q(q, \overline{T})x(t)$ be the qth quantile of x(t) in some time interval $[t-\overline{T}, t]$ such that $\overline{T}^{-1}$ is much smaller than the bandwidth of the input signal x(t), $$\langle \theta[D_q^x(t) - x(\tilde{t})] \rangle_{\overline{T}} = \langle \theta[Q(q,\overline{T})x(t) - x(\tilde{t})] \rangle_{\overline{T}} = q, \quad (7)$$

where $\theta(x)$ is the Heaviside unit step function, $Q(q,\overline{T})$ is an analog quantile filter, and $$\langle \ldots \rangle_T = \frac{1}{T} \int_{t-T}^{t} d\tilde{t} \ldots$$

denotes time averaging. (See references (Nikitin and Davidchack, 2003), (Nikitin, 2006, 2008, and 2009), and (Nikitin and Davidchack, 2006 and 2007) for more general definitions and detailed discussion of analog quantile filters.) Then, if the product $\overline{\mu}\overline{\tau}$ and the slew rate $\overline{\mu}$ are much smaller than the interquartile range (IQR) of the signal x(t) and its time derivative $\dot{x}(t)$, respectively, $$\overline{\mu}\overline{\tau} \ll D_{3/4}^x(t) - D_{1/4}^x(t) \text{ and } \overline{\mu} \ll D_{3/4}^{\dot{x}}(t) - D_{1/4}^{\dot{x}}(t), \quad (8)$$

it follows from equation (3) that $$\langle \text{sgn}[x(t) - \chi(q,\overline{\mu},\overline{\tau})(t)] \rangle_{\overline{T}} \approx 1 - 2q, \quad (9)$$

and thus the filter $\mathcal{S}(q,\overline{\mu},\overline{\tau})$ approximates an analog quantile filter for x(t):

$$\mathcal{S}(q,\overline{\mu},\overline{\tau})x(t) = \chi(q,\overline{\mu},\overline{\tau})(t) \approx Q(q,\overline{T})x(t) = D_q^x(t). \quad (10)$$

Therefore, if the product $\overline{\mu}\overline{\tau}$ and the slew rate $\overline{\mu}$ are sufficiently small, the filters $$\mathcal{S}\left(\frac{3}{4}, \overline{\mu}, \overline{\tau}\right) \text{ and } \mathcal{S}\left(\frac{1}{4}, \overline{\mu}, \overline{\tau}\right)$$

can be employed as quartile filters to measure the interquartile range of the signal x(t) and/or its time derivative $\dot{x}(t)$. The interquartile range is a robust statistic with the breakdown point of 25%, and it can be used to reliably discriminate between the stationary state of the signal and its outliers (impulsive disturbances). For example, for the normal distribution, the interval $\pm 2[D_{3/4}(t) - D_{1/4}(t)]$ (approximately $\pm 2.698\sigma$) encompasses approximately 99.3% of the signal values, and the values outside of this range can be considered outliers.

1.3.2 Acting as Linear RC Filter when the Noise is Purely Thermal or Otherwise Non-Impulsive The filters $$\mathcal{S}\left(\frac{3}{4}, \overline{\mu}, \overline{\tau}\right) \text{ and } \mathcal{S}\left(\frac{1}{4}, \overline{\mu}, \overline{\tau}\right)$$

can be employed as quartile filters to measure the interquartile range of the signal $h\tau(t)*x(t)$ and/or its time derivative. This measured IQR allows us to determine the "normal" range of the slew rate $\mu$ for the filter $$\mathcal{S}\left(\frac{1}{2}, \mu, \tau\right)$$

so that it will behave as an RC integrator with RC=$\tau$ unless it encounters an impulsive disturbance (outlier).

1.3.3 Sensing and Mitigating Spurious Disturbances

When, during an impulsive disturbance, the absolute value of the difference between the input and output of the filter $$\mathcal{S}\left(\frac{1}{2}, \mu, \tau\right)$$

exceeds the linear range (resolution) of the comparator $\tilde{\mathcal{F}}_{\mu\tau}$, the filter switches into the nonlinear mode, producing an output with a constant rate of change. The filter remains in this constant slew rate mode until the difference between the input and output of the filter returns to linear range. There are various advantages of such mitigation by limiting the slew rate of the outliers as opposed to simply confining the output of the filter to the range determined by measuring the IQR.

Figure 8:
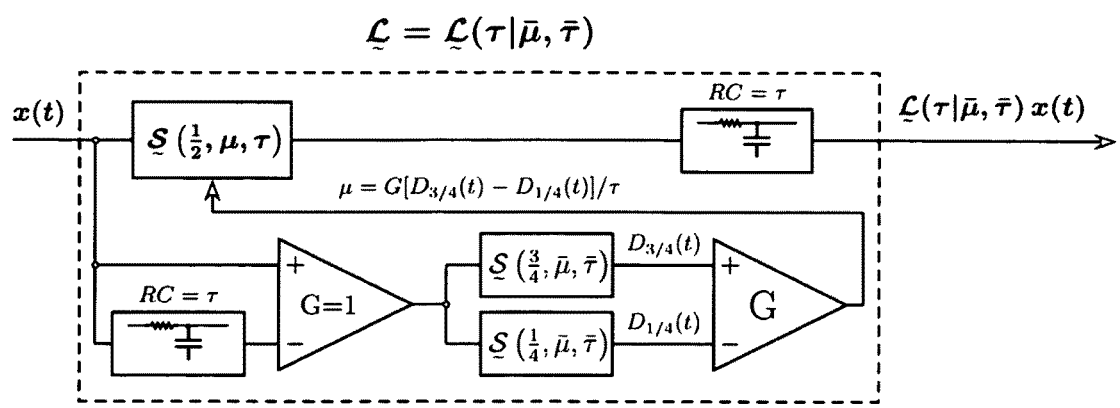
FIG. 8. Example of a SPART filter $\mathcal{L}$ comprising a combination of FrankenSPART filters $\mathcal{S}$ and satisfying the conditions (i) through (iv) of Section 1.3. In linear regime $\mathcal{L}$ behaves as a low-pass filter with the cutoff frequency $(2\pi\tau rl;\sqrt{1+rl;\sqrt{2}rlxrlx})^{-1} \approx (10\tau)^{-1}$. The slew rate parameter $\mu$ is controlled by the measured IQR of the differences between the input signal $x(t)$ and the output of a first-order low-pass filter $h_\tau(t)*x(t)$. The gain G sets the range of linear behavior of $\mathcal{L}$..

The block diagram shown in FIG. 8 provides and example of a SPART filter $\mathcal{L}$ comprising a combination of the FrankenSPART filters $\mathcal{S}$ and satisfying the conditions ((i)) through ((iv)). In this example, in linear regime $\mathcal{L}$ behaves as a low-pass filter with the cutoff frequency $(2\pi\tau\, rl;\sqrt{1+rl};\sqrt{2rlxrlx})^{-1} \approx (10\tau)^{-1}$. The slew rate parameter $\mu$ is controlled by the measured IQR of the differences between the input signal x(t) and the output of a first-order low-pass filter $h_\tau(t)*x(t)$. The gain G sets the range of linear behavior of $\mathcal{L}$. For example, for the input signal which is essentially Gaussian in statistical properties, the gain G can be calculated from the percentile 'confidence' of this range p as $$G = \frac{\text{erf}^{-1}(p)}{2\text{erf}^{-1}(1/2)}. \tag{11}$$

Figure 9:
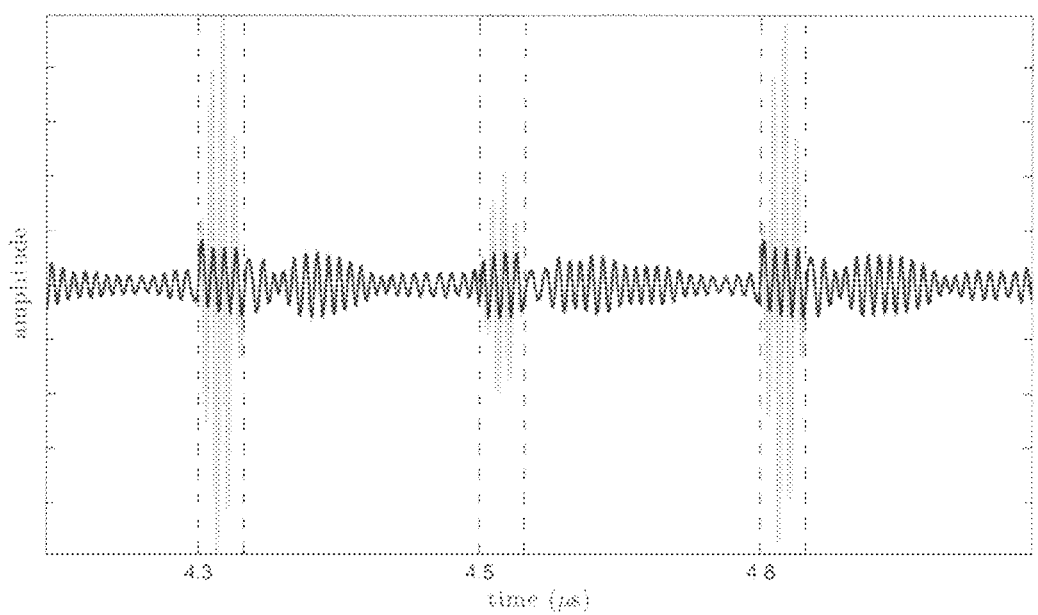
FIG. 9. Mitigation of impulsive noise by the SPART filter $\mathcal{L}$ shown in FIG. 8 in comparison with the corresponding linear filter. One can see that during impulsive disturbances (indicated by the gray shaded intervals between the vertical dashed lines) the filter $\mathcal{L}$ switches into the nonlinear mode, limiting the rate of change of the output. The filter remains in this mode until the difference between the input and output of the filter returns to linear range.
Figure 10:
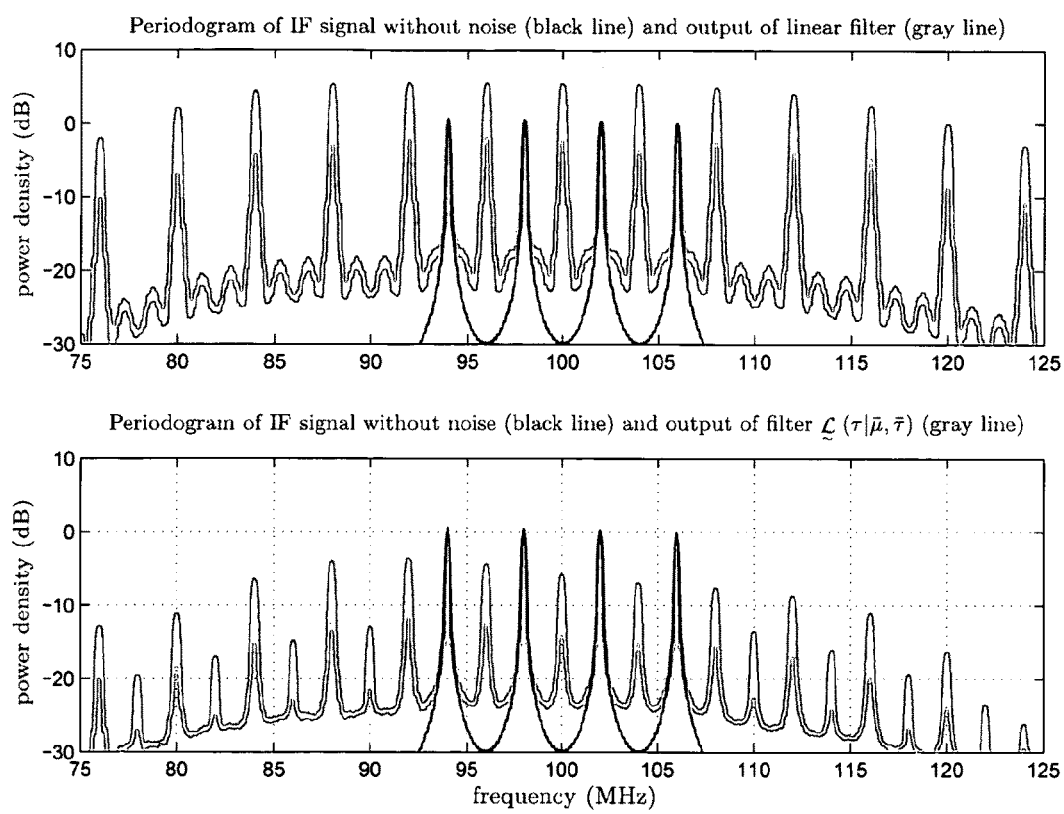
FIG. 10. Mitigation of impulsive noise by the SPART filter $\mathcal{L}$ shown in FIG. 8 in comparison with the corresponding linear filter. The filter $\mathcal{L}$ reduces the total power of the noise in the passband of the signal by about an order of magnitude in comparison with the linear filter, without noticeable attenuation of the signal.

FIGS. 9 and 10 illustrate the performance of the SPART filter $\mathcal{L}$ shown in FIG. 8 in comparison with the corresponding linear filter. For the sake of simplicity, as the "native" communication signal we use four harmonic tones located 4 MHz apart near 1 GHz. The incoming signal is an analog 100 MHz intermediate frequency signal (IF) of one of the channels of the receiver. The Gaussian component of the noise is the thermal noise, and the impulsive component is due to the 2 GHz tone amplitude-modulated by a random bit sequence at 4 Mbit/s (T=250 ns). The pulse shaping is the same raised cosine shaping used in the previous examples.

1.4 Modification of Nonlinear Behavior to Address Specific Problems

The nonlinear behavior of a SPART filter can be modified to improve performance when addressing particular problems. These modifications can in general relate to (i) changes in the measurement of the interquartile range, (ii) changes in the comparator function, and/or (iii) introduction of threshold filtering.

For example, for a relatively narrow passband, the interquartile range of the slew rate can be determined simply by measuring the interquartile range of the input signal and mitiplying it by the central frequency. Also, if the distribution of the non-impulsive component is known to be an even function (for example, Gaussian), it may be sufficient to measure a single non-median percentile in order to determine the interquartile range.

A FrankenSPART filter with q=1/2 and the comparator function of the form $$\tilde{\mathcal{F}}_\alpha(x) = \begin{cases} \frac{x}{\alpha} & \text{for } |x| < \alpha \\ 0 & \text{otherwise} \end{cases} \tag{12}$$

will produce a constant (instead of linearly changing) output during its non-linear operation.

Threshold filtering is the most flexible modification of the SPART filters, as illustrated in the example below.

Figure 11:
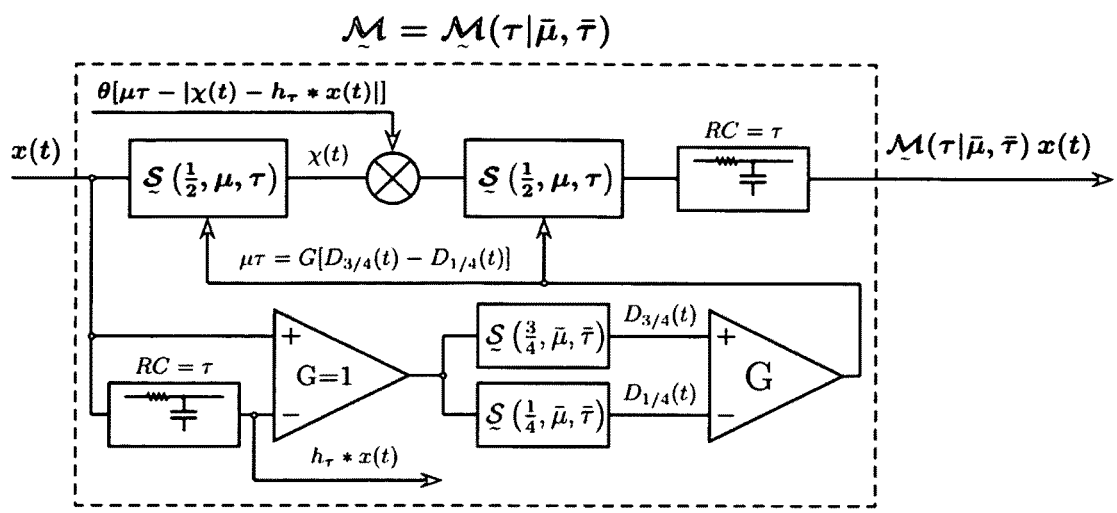
FIG. 11. Example of a SPART filter modification $\mathcal{M}$ designed to suppress the output during the impulsive disturbances. The absolute value of the difference between the intermediate signals $\chi(t)$ and $h_\tau*x(t)$ is compared with the product $\mu\tau$. This value exceeding the product $\mu\tau$ indicates the nonlinear regime of the first median-mode FrankenSPART filter $\mathcal{S}$ (on the left). Applying the multiplier θ[μτ−|χ(t)−$h_r$*x(t)|] to the output of the first filter $\mathcal{S}$ results in suppression of the output during the nonlinear behavior of the first filter $\mathcal{S}$. The second median-mode FrankenSPART filter $\mathcal{S}$ (on the right) removes the short-duration residual non-zero output during the impulsive disturbances.

The SPART filter $\mathcal{M}$ shown in FIG. 11 provides an example of such a modification designed to suppress the output during the impulsive disturbances. The absolute value of the difference between the intermediate signals $\chi(t)$ and $h_\tau*x(t)$ is compared with the product $\mu\tau$. This value exceeding the product $\mu\tau$ indicates the nonlinear regime of the first median-mode FrankenSPART filter $\mathcal{S}$ (on the left). Applying the multiplier $$\theta[\mu\tau - |\chi(t) - h_\tau*x(t)|] \tag{13}$$

to the output of the first FrankenSPART results in suppression of the output during the nonlinear behavior of the first filter. The second median-mode FrankenSPART filter $\mathcal{S}$ (on the right) removes the short-duration residual non-zero output during the impulsive disturbances.

One skilled in the art would recognize that other modifications can be implemented in a similar manner.

Figure 12:
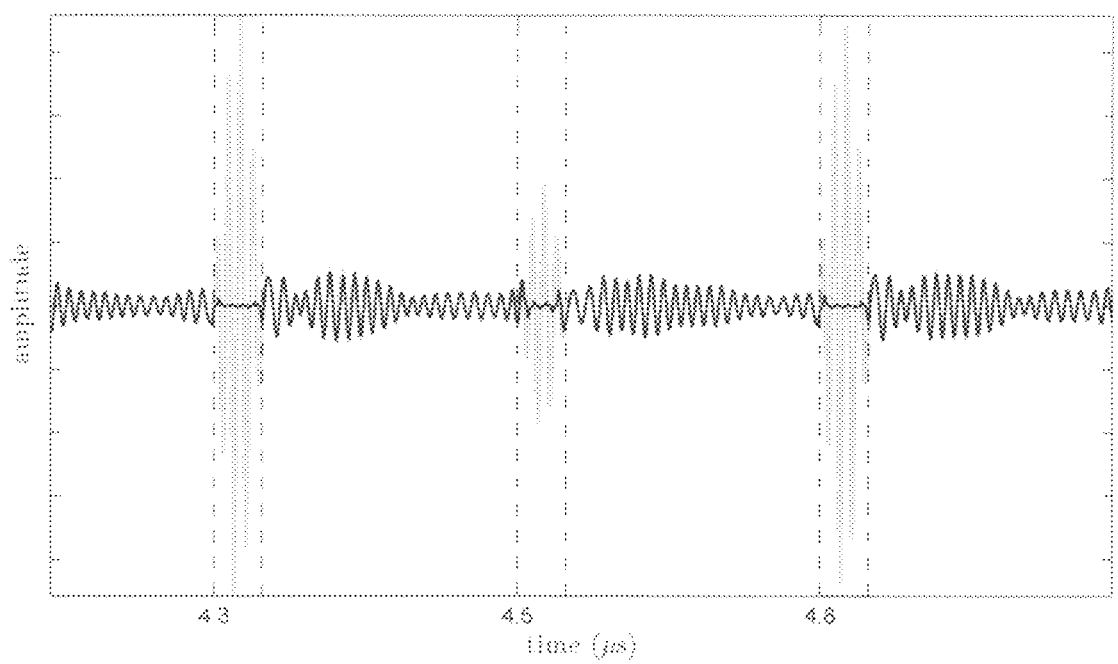
FIG. 12. Mitigation of impulsive noise by the SPART filter $\mathcal{M}$ shown in FIG. 11 in comparison with the corresponding linear filter. One can see that during impulsive disturbances (indicated by the gray shaded intervals between the vertical dashed lines) the filter $\mathcal{M}$ switches into the nonlinear mode, suppressing the output. The filter remains in this mode until the difference between the input and output of the filter returns to linear range.
Figure 13:
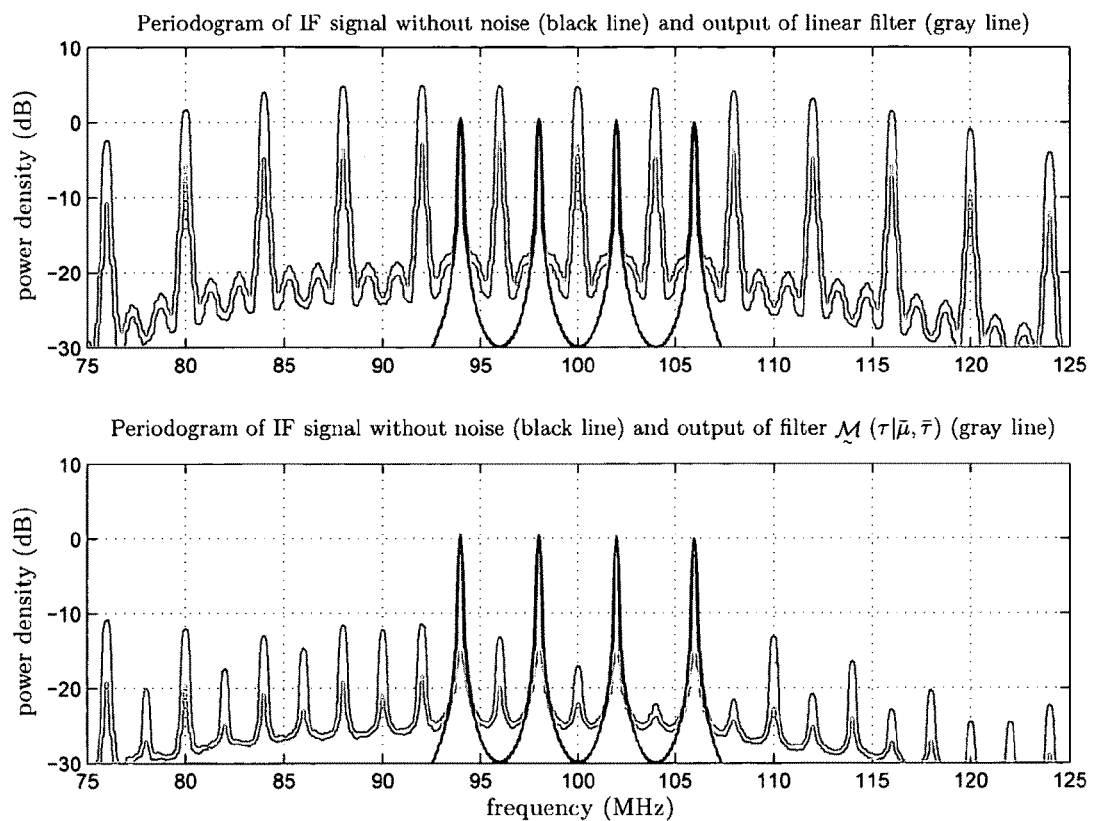
FIG. 13. Mitigation of impulsive noise by the SPART filter $\mathcal{M}$ shown in FIG. 11 in comparison with the corresponding linear filter.

FIGS. 12 and 13, which correspond to the FIGS. 9 and 10, respectively, illustrate the performance of the SPART filter $\mathcal{M}$ shown in FIG. 11 in comparison with the corresponding linear filter.

2 Sparse Noise and its Mitigation by Intermittently Nonlinear Filters

Section 2 describes the following: (i) impulsive interferences can be modelled as mixtures containing both nonsparse and sparse components; (ii) sparse and nonsparse components can be separated (in the time domain), and the sparse component of the interference can be mitigated by nonlinear means, leading to improvement in signal quality, and (iii) the reduction in the bandwidth results in the reduction in sparsity, and thus the nonlinear filtering should be performed either before the final reduction in the bandwidth, or as part of the bandwidth reduction.

Signals with high degree of peakedness, or impulsive, can be modeled using the concept of sparse signals. The amplitude distribution of an idealized sparse signal contains a Dirac $\delta$-function at zero, and thus a sparse signal contains a finite fraction of its values at zero. Sparse signal approximation can be used for a variety of naturally occurring and/or man-made signals, for example, the shot noise, or the signal due to interchannel interference in digital communication systems (Nikitin, 2011).

Impulsive signal can be approximated as a mixture of non-sparse and sparse signals, and analysis of such an approximation provides opportunities for designing effective schemes for mitigation of impulsive interferences. In particular, the use of intermittently nonlinear filters for this purpose is demonstrated.

2.1 Sparse Noise

2.1.1 Continuous Sparse Signal

Let us consider a zero-mean density function $\phi(x)$ with the variance $\sigma^2 > 0$, such that $$\lim_{\varepsilon \to 0} \int_{-\varepsilon}^{\varepsilon} dx \varphi(x) = 0. \tag{14}$$

Then, if a continuous signal X(t) in an arbitrary time interval [0,T] is described by the density function (Nikitin and Davidchack, 2003)

$$\varphi_s(x) = \frac{1}{T}\int_0^T dt \delta[x - X(t)] = (1 - s^{-2})\delta(x) + s^{-3}\varphi(s^{-1}x), \tag{15}$$

where $\delta(x)$ is the Dirac $\delta$-function (Dirac, 1958), it can be viewed as a zero-mean sparse signal with the average power $\delta^2 > 0$ and the sparsity factor $s^2 \geq 1$. Note that a sparse signal can be deterministic as well as stochastic.

The density function $\phi_s(x)$ represents the probability density for a value of a random sample (that is, a sample taken at a random time) in the interval [0,T]. Thus, in a sparse signal, there is non-zero probability to find the value of the signal at exactly zero.

2.1.2 Discrete White Sparse Noise

A white noise has the property that each sample is perturbed independently of all the others. Then in an ideal discrete white sparse noise each amplitude $X_i$ is a random variable with the probability density function $\phi_s(x)$ given by equation (15).

The moments of $\phi_s(x)$ relate to the moments of $\phi(x)$ through the sparsity factor as $$\langle x^n \rangle_{\varphi_s} = s^{n-2} \langle x^n \rangle_{\varphi}. \tag{16}$$

The peakedness of the discrete sparse noise can be defined through the kurtosis (Abramowitz and Stegun, 1972) of its distribution as $$K_{\varphi_s} = \frac{\langle x^4 \rangle_{\varphi_s}}{3\sigma^4} = s^2 \frac{\langle x^4 \rangle_{\varphi}}{3\sigma^4} = s^2 K_{\varphi}, \tag{17}$$

and it is proportional to the sparsity factor. Since the peakedness of the Gaussian distribution is unity, the peakedness of the sparse Gaussian noise equals to its sparsity factor. The peakedness of a zero-mean signal in units "decibels relative to Gaussian" can be expressed as $$K_{dBG} = 10 lg\left(\frac{\langle x^4 \rangle}{3\sigma^4}\right), \tag{18}$$

and thus $K_{dBG}$ equals zero for the Gaussian distribution.

2.1.3 Band-Limited Continuous Sparse Noise

Since an impulse response of a band-limited linear system has infinite duration, it is impossible for an analog band-limited white noise to have a density function containing a Dirac δ-function at zero. Equation (15), however, can often be used as a reasonable approximation to the density function of a continuous sparse noise, and thus the concept of sparsity can be extended to analog signals.

An ideal discrete white sparse noise can be viewed as a Nyquist-sampled analog sparse noise of bandwidth W, and the analog noise can be reconstructed using the Whittaker-Shannon interpolation formula (Shannon, 1949):

$$x_s(t) = \sum_i X_i h(t - t_i), \tag{19}$$

where $h(t) = \frac{\sin(2\pi W t)}{2\pi W t}$, and $t_i = \frac{i}{2W}$.

Figure 14:
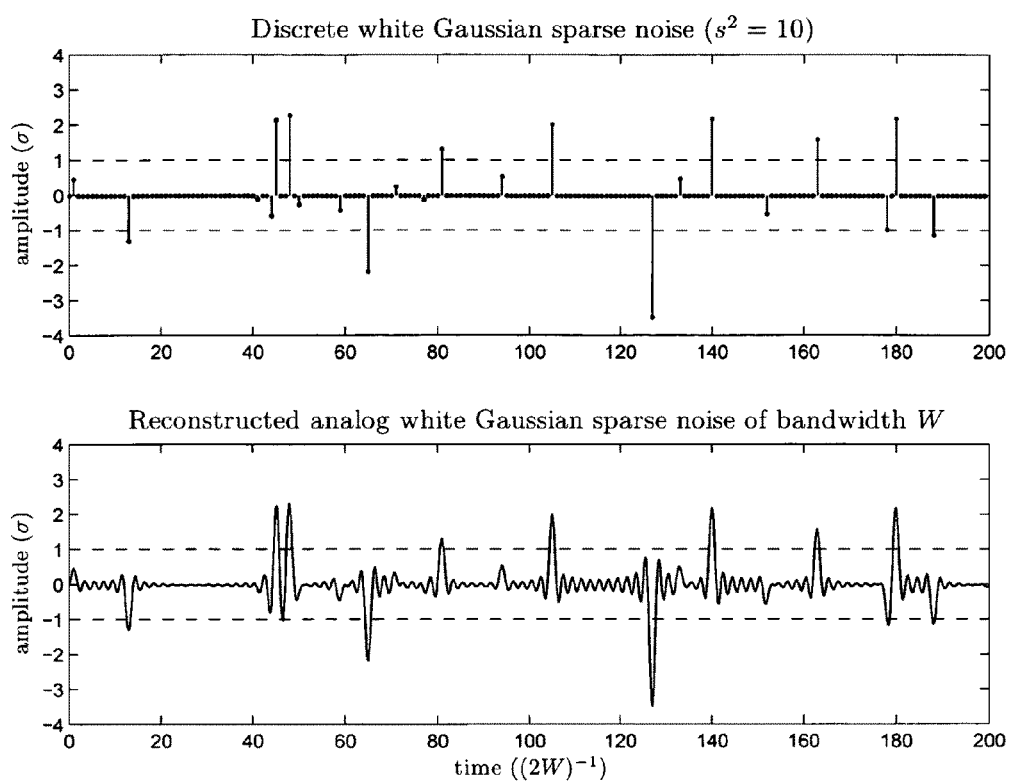
FIG. 14. Analog band-limited white Gaussian sparse noise of bandwidth W (lower panel) reconstructed from an ideal discrete sparse noise with the sparsity factor $s^2=10$ (upper panel).

FIG. 14 provides an example of an analog band-limited white Gaussian sparse noise of bandwidth W (solid line) reconstructed from an ideal discrete sparse noise with $s^2=10$ (dots). Since $$\int_{-\infty}^{\infty} dt\, h(t - t_i) h(t - t_j) = \frac{1}{2W} \delta_{ij}, \tag{20}$$

where $\delta_{ij}$ is Kronecker delta, the average power of the analog noise equals that of the discrete, $\langle x_s^2(t) \rangle = \sigma^2$.

In the Nyquist-sampled sparse noise of bandwidth W, the average time interval between the non-zero samples is $s^2/(2W)$. For high sparsity, the overlap of the pulses in the pulse train given by equation (19) is insignificant, and the forth cumulant of $x_s(t)$ can be expressed as $$\langle x_s^4(t) \rangle = \frac{2}{3} s^2 \langle x^4 \rangle_\varphi (\text{for } s^2 \gg 1).$$

The peakedness of the band-limited continuous noise of high sparsity can now be expressed through the peakedness of the discrete sparse noise as $$K_{x_s} = \frac{\langle x_s^4(t) \rangle}{3 \langle x_s^2(t) \rangle^2} = \frac{2}{3} s^2 K_\varphi \text{ for } s^2 \gg 1, \tag{21}$$

where the angle brackets denote time averaging.

Thus, for high sparsity, the density of the continuous white sparse noise can be approximated by the density of the Nyquist-sampled discrete sparse noise with the sparsity factor $$\frac{2}{3} s^2.$$

Figure 15:
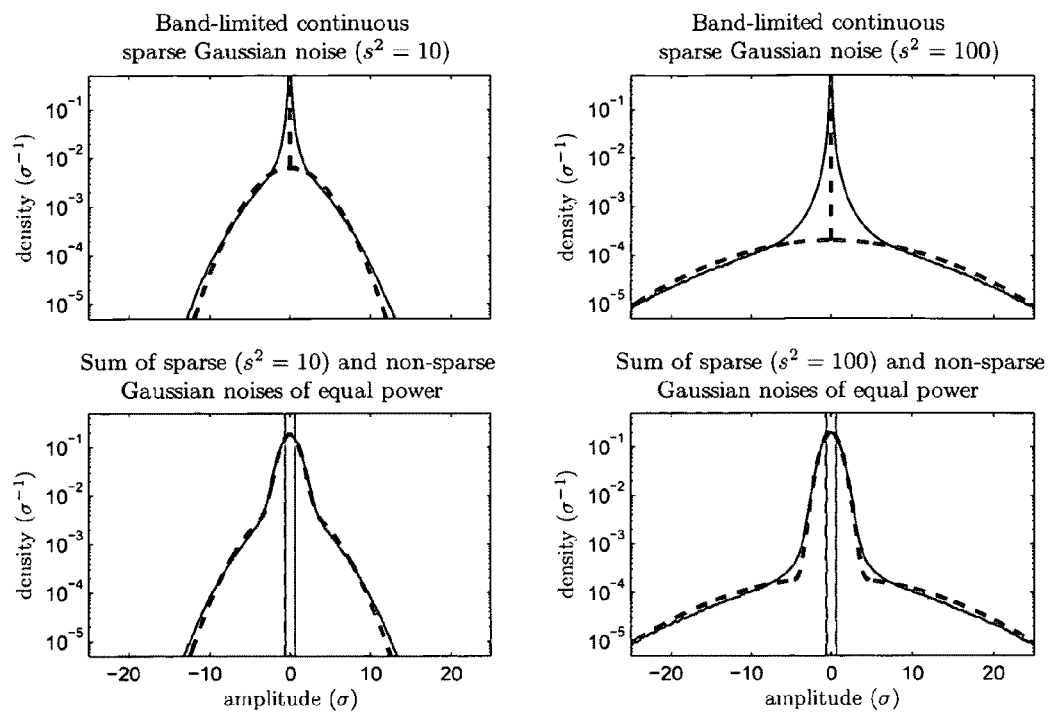
FIG. 15. Upper panels: Simulated densities of band-limited continuous sparse Gaussian noises with the sparsity factors $s^2=10$ and $s^2=100$ (solid lines), and their respective idealized approximations according to equation (15) (dashed lines). Lower panels: Approximation of equation (22) (dashed lines) in comparison with the simulated densities (solid lines) for the equal-power additive mixtures of the sparse and non-sparse band-limited continuous Gaussian noises. Vertical dashed lines indicate the first and third quartiles of the non-sparse component, and the gray bands fill the interquartile ranges of the mixtures of the sparse and non-sparse noses.

This is illustrated in the upper panels of FIG. 15, which show the simulated densities of band-limited continuous sparse Gaussian noises with the sparsity factors 10 and 100 (solid lines), and their respective idealized approximations according to equation (15) (dashed lines).

2.2 Mixture of Random Noise and Sparse Signal

The validity of such an approximation must be considered in the context of the noise containing both sparse and non-sparse components. For example, for an additive mixture of a non-sparse random noise and a sparse signal, the idealized approximation to the sparse density function is adequate if both following conditions are met: (i) the sparsity is high ($s^2 \gg 1$), and (ii) the total power of the sparse signal is not much higher than the power of the non-sparse noise. In that case, the density of the mixture $\phi_{n+s}(x)$ can be represented as follows:

$$\phi_{n+s}(x) = \phi_n(x) * \phi_s(x) = (1 - s^{-2}) \phi_n(x) + s^{-3} \phi_n(x) * \phi(s^{-1} x), \tag{22}$$

where $\phi_n(x)$ and $\phi_s(x)$ are the amplitude densities of the random noise and the sparse signal, respectively, and the asterisk denotes convolution. The lower panels of FIG. 15 show the approximation of equation (22) (dashed lines) in comparison with the simulated densities (solid lines) for the equal-power additive mixtures of the sparse and non-sparse band-limited continuous Gaussian noises.

2.3 Quantile Range

Let $x_q$ and $x'_q = x_q + \delta x_q$ be the qth quantiles, $q < 1/2$, of the cumulative distributions of the non-sparse noise and the mixture, respectively. Assuming that $\phi_n(x)$ is continuous, we can write $$\Phi_n(x_q) = q, \Phi_n(x'_q) \approx q + \delta x_q \cdot \varphi_n(x_q), \tag{23}$$

and

-continued $$\Phi_{n+s}(x'_q) = \left(1 - \frac{1}{s^2}\right)\Phi_n(x'_q) + \frac{1}{s^2}\Phi_*(x'_q) = q, \quad (24)$$

where $\Phi^*(x) = \phi_n(x) * \Phi(x)$. Then, since $$\frac{1}{1-s^{-2}} \approx 1 + s^{-2}$$

for large $s^2$, $$\delta x_q = \frac{1}{s^2 \varphi_n(x_q)}[q - \Phi_*(x'_q)], \quad (25)$$

and, for even $\phi(x)$, $$\frac{x'_{1-q} - x'_q}{x_{1-q} - x_q} =$$

$$1 + \frac{(1-2q) - [\Phi_*(x'_{1-q}) - \Phi_*(x'_q)]}{s^2 \varphi_n(x_q)(x_{1-q} - x_q)} < 1 + \frac{1-2q}{s^2 \varphi_n(x_q)(x_{1-q} - x_q)}. \quad (26)$$

For large $s^2$, the second term in the right-hand side of equation (26) vanishes, and the quantile range for the mixture becomes equal to that of the non-sparse component regardless the density and/or power of the sparse component.

For example, for Gaussian noise $$\varphi_n(x) = \frac{1}{\sigma\sqrt{2\pi}} e^{-\frac{x^2}{2\sigma^2}},$$

and $x_q = \sigma\sqrt{2}\,\text{erf}^{-1}(1-2q)$. Then the interquartile ranges for the mixture and the non-sparse Gaussian noise relate as $$\frac{Q'_3 - Q'_1}{Q_3 - Q_1} < 1 + \frac{\sqrt{\pi}\exp\left\{\left[\text{erf}^{-1}\left(\frac{1}{2}\right)\right]^2\right\}}{4s^2 \text{erf}^{-1}\left(\frac{1}{2}\right)} < 1 + 1.17 s^{-2}, \quad (27)$$

and, for large $s^2$ they are approximately equal regardless the power of the sparse component. This is illustrated in the lower panels of FIG. 15, where the vertical dashed lines indicate the first and third quartiles of the non-sparse component, and the gray bands fill the interquartile ranges of the mixtures of the sparse and non-sparse noses.

2.4 Mitigation of Impulsive (Sparse) Interference

Most of the power of a sparse noise of high sparsity comes from relatively short ('sparse') intervals of the duration $\Delta t_i$ approximately equal to the inverse of the noise bandwidth $\Delta W$, $$\Delta t_i = \frac{\kappa}{\Delta W}, \quad (28)$$

where $\kappa$ is a small constant in the neighborhood of unity. Since $\Sigma \Delta t_i = s^{-2} T$ for large T, the average rate of occurrence $\mathcal{R}$ of these pulses is $$\mathcal{R} = \frac{\Delta W}{\kappa s^2}. \quad (29)$$

Figure 16:
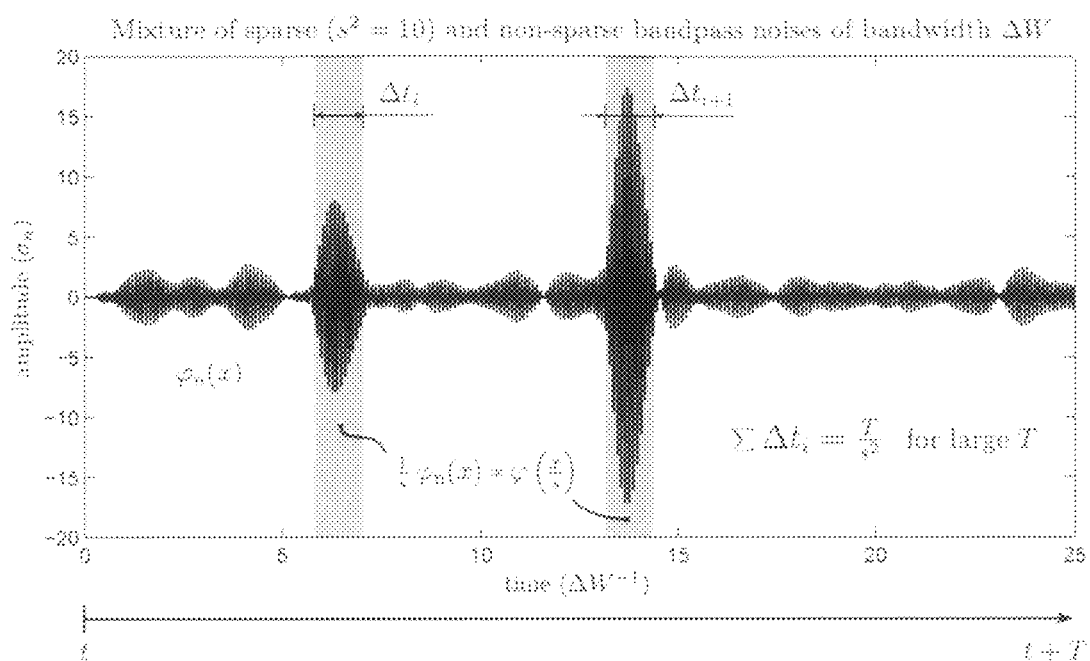
FIG. 16. Mixture of sparse (sparsity factor $s^2=10$) and non-sparse bandpass Gaussian noises of bandwidth ΔW.

In an additive mixture of uncorrelated sparse and non-sparse noises, the power averaged over the sparse intervals of the sparse component will be larger than the total average power of the mixture. FIG. 16 shows an example of a mixture of sparse ($s^2=10$) and non-sparse bandpass Gaussian noises of bandwidth $\Delta W$.

In a mixture of sparse and non-sparse noises, the power averaged over the non-sparse intervals equals that of the non-sparse component of the mixture, $$\langle P_{n+s} \rangle_\tau = \langle P_n \rangle. \quad (30)$$

On the other hand, the power averaged over the sparse intervals is always greater, $$\langle P_{n+s} \rangle_s = \langle P_n \rangle s^2 \langle P_s \rangle, \quad (31)$$

where, for high sparsity, the second term on the right-hand side can be relatively large even if the total power of the sparse component is low.

The sparse intervals can be identified, for example, using the fact that the interquartile range of the mixture depends only weakly on the sparse component, and its upper bound is independent of the total power of the sparse component (see Section 2.3). By excluding (or otherwise reducing the power of) the sparse intervals, one can improve overall signal-to-noise ratio for a signal affected by the mixture of the sparse and non-sparse interferences by a factor $1+\langle P_s \rangle/\langle P_n \rangle$.

The mitigation of the sparse interference then can be accomplished by the procedure outlined below.

First, one can identify the characteristics of a linear filter which would be used in the device in the absence of sparse interference (the "designed" linear filter). If the statistical properties of the mixture of the signal and the non-sparse noise are known, one can determine the range of the difference between the input signal and the output of said linear filter.

Then, one can configure an intermittently nonlinear circuit with compares the feedback of its output with the input signal and operates linearly or nonlinearly based on this comparison. In particular, when the difference between the input and the feedback of the output is within said range corresponding to the non-sparse intervals of the input signal, said intermittently nonlinear circuit behaves as said designed linear filter. This will ensure that the output of said intermittently nonlinear circuit during the non-sparse intervals is equal to that of the designed linear filter.

When said difference is outside of said range, it indicates the presense of the sparse interference. Then said circuit behaves nonlinearly and can be configured to provide an output which can be utilized in a manner which mitigates said sparse interference.

When the range of said difference between the input signal and the output of said linear filter in the absence of the sparse interference is not known a priori, one can configure a nonlinear circuit which outputs, given the input mixture of the signal and both sparse and non-sparse interferences, a control level signal indicative of said range of the difference between the input and the output in the absence of the sparse interference.

FIGS. 8 and 11 provide examples of implementations of the procedure outlined above.

In both examples, the range of the difference between the input and the linear output in the absence of the sparse interference is determined by measuring the interquartile range of said difference for the mixture of the signal and both sparse and non-sparse interferences. As illustrated in Section 2.3, the use of this measure is justified by its insensitivity to the sparse component.

In the example of FIG. 8, the mitigation is achieved by limiting the slew rate of the output during the impulsive disturbances. In the example of FIG. 11, during the impulsive disturbances the output is suppressed.

2.5 Effect of Linear Filtering on Sparsity and Peakedness

While the quantitative relation of sparsity to peakedness given by equation (17) is accurate only for high sparsity, the dependence of peakedness on sparsity remains monotonic for low sparsity. Thus peakedness can be used as a measure of sparsity.

While sparsity remains high, reduction of the signal's bandwidth through linear filtering proportionally reduces its peakedness and, therefore, sparsity. At a bandwidth $\Delta W$ such that $$\Delta W \ll \frac{W}{s^2} \qquad (32)$$

any random white noise becomes non-sparse band-limited Gaussian for any density function $\phi(x)$ (Rice, 1944). We can thus define the sparsity cutoff bandwidth for a sparse noise of given initial sparsity $s^2$ and initial bandwidth $W$ as $$\Delta W_c = \frac{W}{s^2}, \qquad (33)$$

and view the noise with the bandwidth below and above the cutoff as non-sparse and sparse, respectively.

Figure 17:
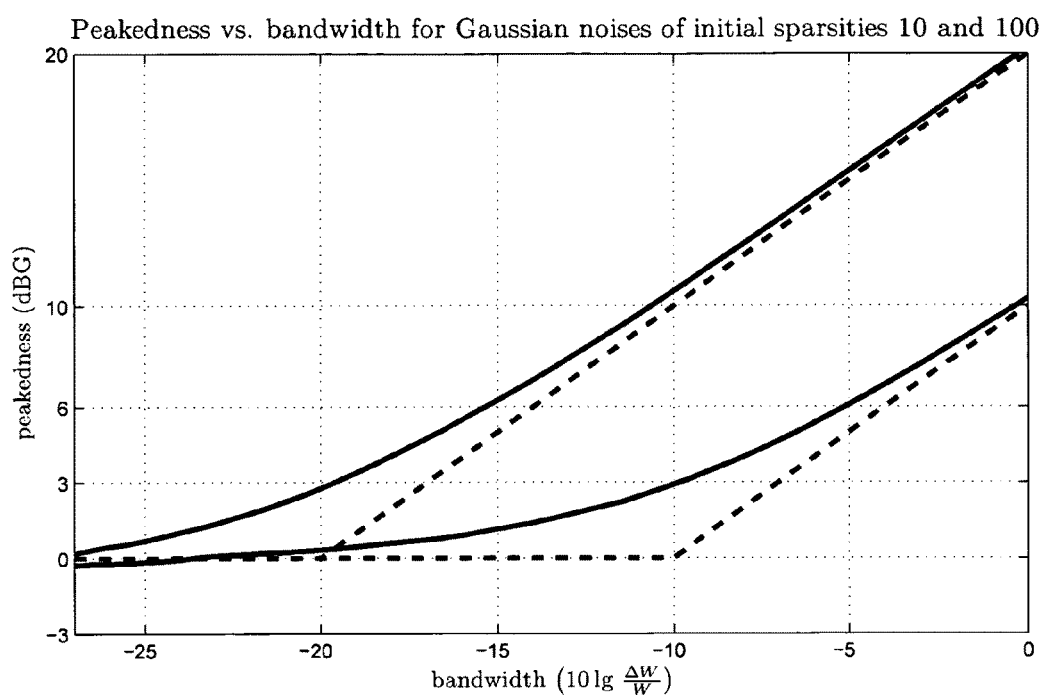
FIG. 17. Peakedness as function of bandwidth for the sparse Gaussian noises of the initial sparsity $s^2=10$ and $s^2=100$. The dashed lines indicate the respective horizontal and oblique asymptotes.

FIG. 17 plots peakedness as function of bandwidth for the sparse Gaussian noises of the initial sparsity 10 and 100. The dashed lines indicate the respective horizontal and oblique asymptotes.

Figure 18:
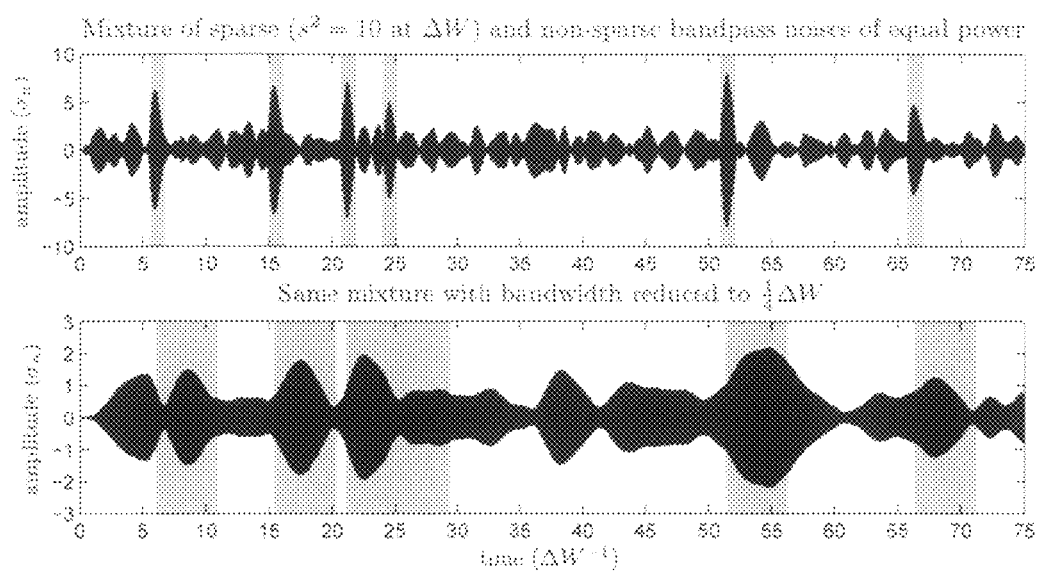
FIG. 18. When a mixture of sparse and non-sparse components undergoes reduction in bandwidth, it becomes less impulsive and the distinction between the non-sparse intervals and those affected by the sparse component diminishes. The gray bands indicate the sparse intervals of the mixture.

As illustrated in FIG. 18, when a mixture of sparse and non-sparse components undergoes reduction in bandwidth, it becomes less impulsive and the distinction between the non-sparse intervals and those affected by the sparse component diminishes. The gray bands indicate the sparse intervals of the mixture.

As was shown in Section 2.4, sparse noise can be mitigated using nonlinear filtering techniques. Thus, if a wide-bandwidth noise in the signal chain of a device can be viewed as a mixture of non-sparse and sparse components, it is advantageous to apply those techniques to reduce the impulsive interference before reducing the bandwidth to within the specifications of the device.

3 Impulsive Nature of Interchannel Interference in Digital Communication Systems Impulsiveness, or a high degree of peakedness, of interchannel interference in digital communication systems typically results from the non-smooth nature of any physically realizable modulation scheme designed to transmit a discrete (discontinuous) message. Even modulation schemes painstakingly designed to be 'smooth' are not. The non-smoothness of the modulation can be caused by a variety of hardware non-idealities and, more fundamentally, by the very nature of any modulation scheme for digital communications. In order to transmit a discrete message, such a scheme must be causal and piecewise, and cannot be smooth, or infinitely differentiable.

Recursive differentiation of a non-smooth transmitted signal eventually leads to discontinuities. When observed by an out-of-band receiver, the transmissions from these discontinuities may appear as strong transients with the peak power noticeably exceeding the average power, and the received signal will have a high degree of peakedness. This impulsive nature of the interference provides an opportunity to reduce its power.

3.1 Demonstration Setup

Let us consider a simplified measuring setup shown in FIG. 4. In the left-hand panel of the figure, the transmitter emits a single 1.2 GHz tone with the amplitude modulated by a random raised cosine-shaped 10 Mbit/s message. As illustrated in the upper right-hand panel, the total instantaneous power of the in-phase and quadrature components of an in-band quadrature receiver (Proakis and Manolakis, 2006) is proportional to the squared modulating signal. However, as shown in the lower right-hand panel, the total instantaneous power in an out-of-band receiver tuned to 1 GHz is an impulsive pulse train with a multiple of 100 ns distance between the pulses. Note that there is no apparent relationship between the magnitude of the modulating signal and the magnitude of the pulses.

Referring to a signal as impulsive implies that the distribution of the instantaneous power of the signal has a high degree of peakedness relative to some standard distribution, such as the Gaussian distribution. A common quantifier of peakedeness would be, for instance, the excess kurtosis (Abramowitz and Stegun, 1972). In this disclosure, however, we adopt the measure of peakedness relative to a constant signal as the "excess-to-average power" ratio, and use the units "decibels relative to constant", or dBc. This measure is explained in Section 3.4.

3.2 Impulsive Nature of Interchannel Interference

As shown in more detail in Section 3.6, the signal components induced in a receiver by out-of-band communication transmitters can be impulsive. For example, if the receiver is a quadrature receiver with identical lowpass filters in the channels, the main term of the total instantaneous power of in-phase and quadrature components resulting from such out-of-band emissions may appear as a pulse train consisting of a linear combination of pulses originating at discrete times and shaped as the squared impulse response of these filters. For a single transmitter, the typical intervals between those discrete times are multiples of the symbol duration (or other discrete time intervals used in the designed modulation scheme, for example, chip and guard intervals). The non-idealities in hardware implementation of designed modulation schemes such as the non-smooth behavior of the modulator around zero, also contribute to additional discrete origins for the pulses. If the typical value of those discrete time intervals is large in comparison with the inverse bandwidth of the receiver, this pulse train will be highly impulsive.

The above paragraph can be restated using mathematical notations as follows. The total emission from various digital transmitters can be written as a linear combination of the terms of the following form:

$$x(t) = A_T(\bar{t})e^{i\omega_c t}, \quad (34)$$

where $\omega_c$ is the frequency of a carrier, $$\bar{t} = \frac{2\pi}{T}t$$

is dimensionless time, and $A_T(\bar{t})$ is the desired (or designed) complex-valued modulating signal representing a data signal with symbol duration T. Let us assume that the impulse response of the lowpass filters in both channels of a quadrature receiver is $$w(t) = \frac{2\pi}{T}h(\bar{t}),$$

and that the order of filter is larger than n so that all derivatives of w(t) of order smaller or equal to n−1 are continuous. (In general, if n is the order of a causal analog filter, then n−1 is the order of the first discontinuous derivative of its impulse response.)

Now let us assume that all derivatives of the same order of the modulating signal $A_T(\bar{t})$ are finite, but the derivative of order n−1 of $A_T(\bar{t})$ has a countable number of step discontinuities at $\{\bar{t}_i\}$. One will encounter discontinuities in a derivative of some order in the modulating signal sooner or later, since any physical pulse shaping is implemented using causal filters.) Then, if $\Delta\omega = 2\pi\Delta f$ is the difference between the carrier and the receiver frequencies, and the bandwidth of the lowpass filter w(t) in the receiver is much smaller than $\Delta f$, the total power in the quadrature receiver due to x(t) can be expressed as $$P_x(t, \Delta f) = \frac{1}{(T\Delta f)^{2n}} \sum_i \alpha_i h(\bar{t} - \bar{t}_i) \sum_j \alpha_j^* h(\bar{t} - \bar{t}_j) \quad (35)$$

for $T\Delta f \gg 1$, where $\alpha_i$ is the value of the ith discontinuity of the order n−1 derivative of $A_T(\bar{t})$, $$\alpha_i = \lim_{\varepsilon \to 0} [A_T^{(n-1)}(\bar{t}_i + \varepsilon) - A_T^{(n-1)}(\bar{t}_i - \varepsilon)] \neq 0. \quad (36)$$

Equation (35) will still accurately represent the total power in the quadrature receiver if the "real" (physical) modulating signal can be expressed as $A(t) = \psi(t) * A_T(t)$, where the convolution kernel $\psi(t)$ is a low-pass filter of bandwidth much larger than $\Delta f$.

A typical value of $t_{i+1} - t_i$ would be of the same order of magnitude as T. If the reciprocal of this value is small in comparison with the bandwidth of the receiver, the contribution of the terms $\alpha_i \alpha_j^* h(\bar{t}-\bar{t}_i) h(\bar{t}-\bar{t}_j)$ for $i \neq j$ is negligible, and (35) describes an impulsive pulse train consisting of a linear combination of pulses shaped as $w^2(t)$ and originating at $\{t_i\}$, namely $$P_x(t, \Delta f) = \frac{1}{(T\Delta f)^{2n}} \sum_i |\alpha_i|^2 h^2(\bar{t} - \bar{t}_i) \quad (37)$$

for sufficiently large T and $\Delta f$.

Figure 19:
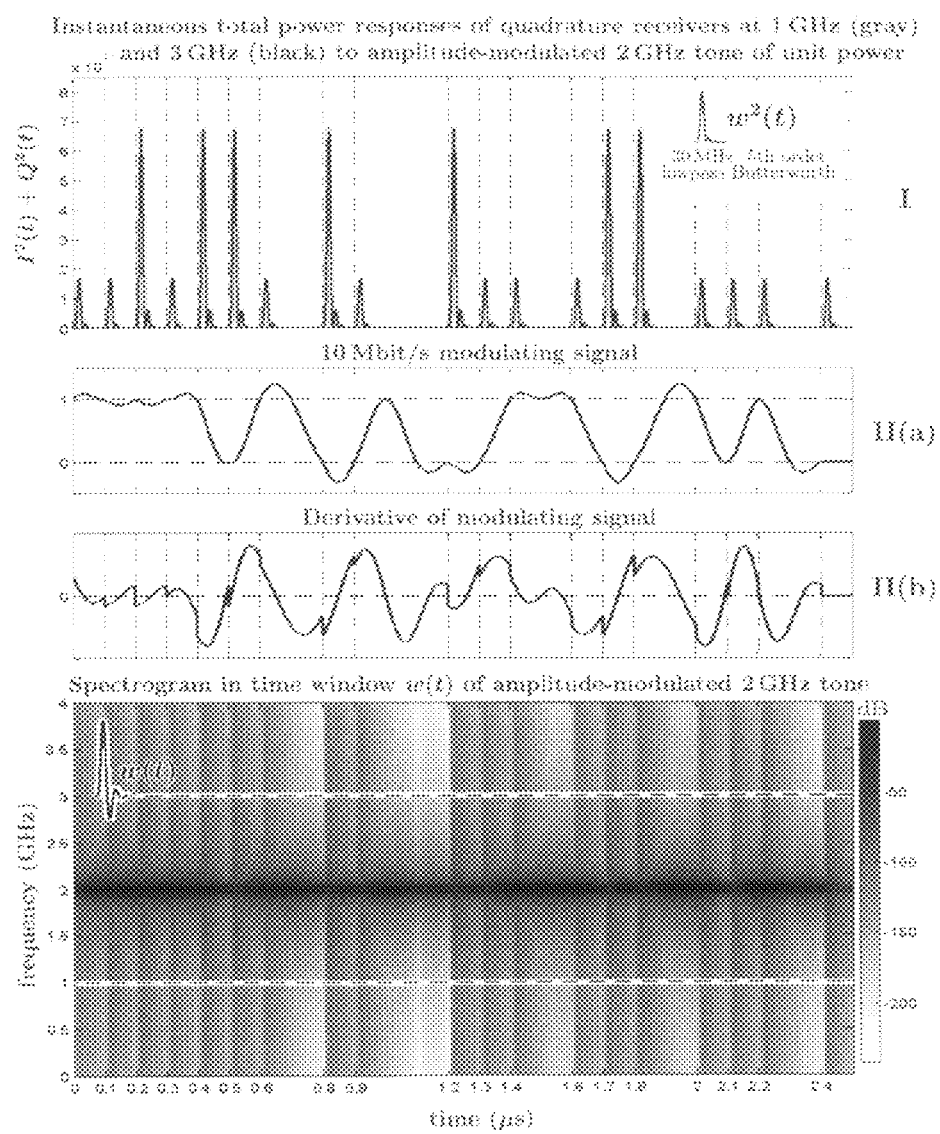
FIG. 19. Panel I of the figure shows simulated instantaneous total power response of quadrature receivers tuned to 1 GHz and 3 GHz frequencies (gray and black lines, respectively) to an amplitude-modulated 2 GHz carrier of unit power. The squared impulse response of the lowpass filters in the receiver channels is shown in the upper right corner of the panel. Panels II(a) and II(b) of the figure show the modulating signal and its first derivative, respectively. For the modulating signal shown in the figure, n=2 in equation (35). The lower panel of the figure shows instantaneous total power response of a quadrature receiver as a spectrogram in the time window w(t) shown in the upper left corner of the panel.

This pulse train is illustrated in Panel I of FIG. 19, which shows simulated instantaneous total power response of quadrature receivers tuned to 1 GHz and 3 GHz frequencies (gray and black lines, respectively) to an amplitude-modulated 2 GHz carrier of unit power. The squared impulse response of the lowpass filter in the receiver channels (30 MHz 5th order Butterworth filter (Schaumann and Van Valkenburg, 2001)) is shown in the upper right corner of the panel.

The modulating signal is shown in Panel II(a) of the figure, and represents a random bit sequence at 10 Mbit/s (T=100 ns). In this example, a highly oversampled FIR raised cosine filter (Proakis and Manolakis, 2006) with roll-off factor 0.35 and group delay 2T was used for pulse shaping. A rather small group delay was chosen to make the discontinuities in the derivative more visible in the figure. Panel II(b) of FIG. 19 shows the first derivative of the modulating signal. This derivative exhibits step discontinuities at the multiple of T time intervals (at the time ticks), and thus n=2 in (35).

It is important to notice that the impulsive pulse train is not necessarily caused directly by the discontinuities in the amplitude and/or phase of the transmitted signal, but rather by the discontinuities in the higher order derivatives of the modulating signal, and is generally unrelated to the magnitude of the envelope and/or the peak-to-average ratio of the transmitted signal. Thus, for instance, continuous phase modulation (CPM), while generally reducing the magnitude of the impulsive interference by increasing the order of the first discontinuous derivative by one, does not eliminate the effect altogether. This is illustrated in Section 3.5.

When viewed as a function of both time and frequency, the interpretation of (35) for the total power in a quadrature receiver is a spectrogram (Cohen, 1995) in the time window w(t) of the term x(t) of the transmitted signal. Such a spectrogram is shown in the lower panel of FIG. 19, where the horizontal dashed lines indicate the receiver frequencies 1 GHz and 3 GHz used in Panel I.

Figure 20:
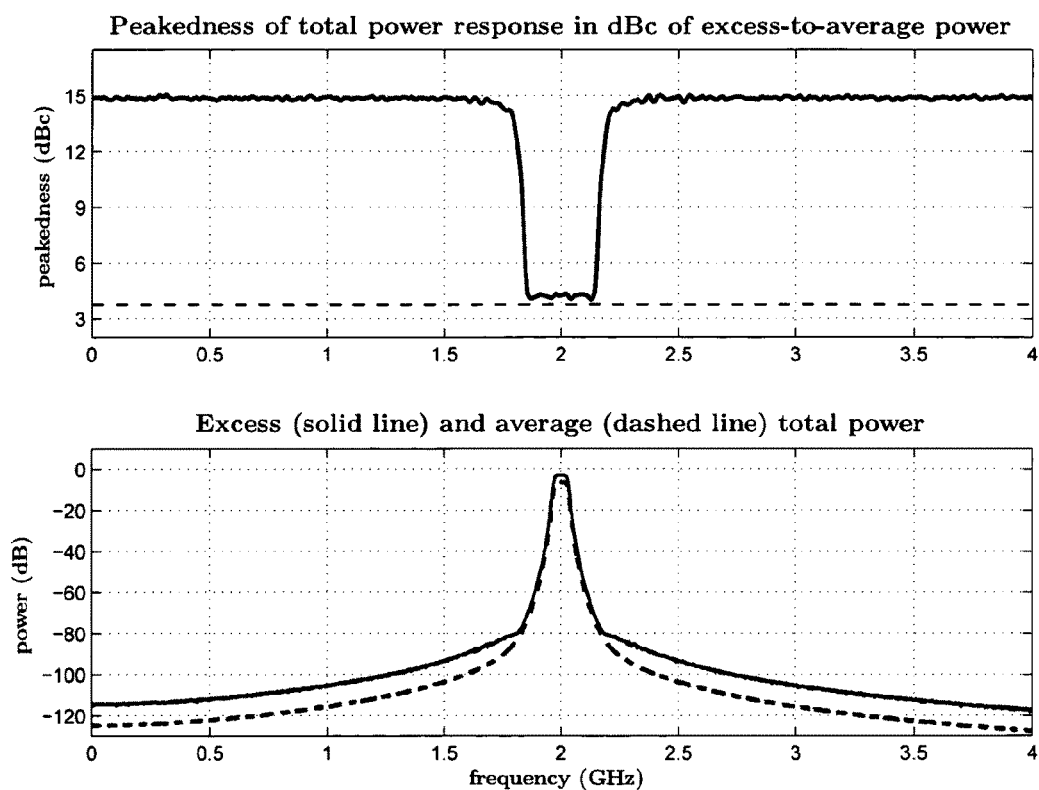
FIG. 20. Upper panel shows peakedness in dBc of the instantaneous total power response of a quadrature receiver as a function of frequency. The horizontal dashed line corresponds to the peakedness of a Gaussian distribution. The lower panel shows the total excess (solid line) and average (dashed line) power in the receiver versus frequency. The transmitted signal is a 2 GHz carrier amplitude-modulated by a random 10 Mbit/s bit stream. The impulse response w(t) of the receiver and the pulse shaping of the modulating signal are as in the example shown in FIG. 19.

For a quantitative illustration of the impulsive nature of the out-of-band interference, the upper panel of FIG. 20 shows the peakedness of the instantaneous total power in a quadrature receiver as a function of frequency for the example used in FIG. 19. The peakedness of the out-of-band signal exceeds the peakedness of the in-band signal by over an order of magnitude.

The lower panel of FIG. 20 shows, for the same examples, the total excess (solid line) and average (dashed line) power in the receiver versus frequency. The excess power of the out-of-band emissions is approximately 10 dB higher than the average power.

Given the designed properties of the transmitted signal, the out-of-band emissions can be partially mitigated by additional filtering. For example, one can apply additional high-order lowpass filtering to the modulating signal, or band-pass filtering to the modulated carrier. However, the bandwidth of those additional filters must be sufficiently large in comparison with the bandwidth of the pulse shaping filter in the modulator in order to not significantly affect the designed signal. Within that bandwidth the above analysis still generally holds, and the impulsive disturbances may significantly exceed the thermal noise level in the receiver even when the average power of the interference remains below that level.

3.3 Naturally Occurring Man-Made Source of Impulsive Noise

Interchannel interference is a "naturally occurring man-made" source of impulsive noise arising from non-smoothness of modulation.

Non-smoothness of modulation can be caused by a variety of hardware imperfections and, more fundamentally, by the very nature of any modulation scheme for digital communications. This non-smoothness sets the conditions for the interference in out-of-band receivers to appear impulsive.

If the coexistence of multiple communication devices in, say, a smartphone is designed based on the average power of interchannel interference, a high excess-to-average power ratio of impulsive disturbances may degrade performance even when operating within the specifications.

On the other hand, the impulsive nature of the interference provides an opportunity to reduce its power. Since the apparent peakedness for a given transmitter depends on the characteristics of the receiver, in particular its bandwidth, an effective approach to mitigating the out-of-band interference can be as follows: (i) allow the initial stage of the receiver to have a relatively large bandwidth so the out-of-band interference remains highly impulsive, then (ii) implement the final reduction of the bandwidth to within the specifications through nonlinear means, such as the analog filters described in (Nikitin and Davidchack, 2003, 2004, 2006 and 2007), and (Nikitin, 2006, 2008, and 2009). In particular, intermittently nonlinear filters described in Section 1 reduce the impulsive component without detrimental effects on the transmitted message and non-impulsive noise.

3.4 Excess-to-Average Power Ratio as Measure of Peakedness

Consider a signal x(t). Then the measure $K_c$ of its peakedness in some time interval can be defined implicitly as the excess-to-average power ratio $$\langle \overline{x^2}(t)\theta[\overline{x^2}(t) - K_c] \rangle_T = \frac{1}{2}, \qquad (38)$$

where $\theta(x)$ is the Heaviside unit step function, $\langle \ldots \rangle_T$ denotes averaging over the time interval, and $\overline{x^2}(t) = x^2(t)/\langle x^2(t) \rangle_T$ is normalized instantaneous signal power. $K_c = 1$ for $x(t) = \text{const}$, and thus $K_{dBc} = 10\lg(K_c)$ expresses excess-to-average power ratio in units of "decibels relative to constant".

For a Gaussian distribution, $K_c$ is the solution of $$\Gamma\left(\frac{3}{2}, \frac{K_c}{2}\right) = \frac{\sqrt{\pi}}{4}, \qquad (39)$$

where $\Gamma(\alpha, x)$ is the (upper) incomplete gamma function (Gradshteyn and Ryzhik, 1994), and thus $K_c \approx 2.366$ ($K_{dBc} \approx 3.74$ dBc).

3.5 Discontinuities in Continuous Phase Modulation

For continuous phase modulation (CPM), equation (34) can be re-written as $$x(t) = A_T(\tilde{t})e^{i\omega_c t} = [A_0 e^{i(T\Delta f_c)\int_{-\infty}^{\tilde{t}} d\tau \alpha_T(\tau)}]e^{i\omega_c t}, \qquad (40)$$

where $\Delta f_c$ is the frequency deviation. Then the derivative of $A_T(\tilde{t})$ is $$A'_T(\tilde{t}) = i(T\Delta f_c)A_T(\tilde{t})\alpha_T(\tilde{t}), \qquad (41)$$

and, if $\alpha_T^{(n-2)}(\tilde{t})$ contains discontinuities, so does $A_T^{(n-1)}(\tilde{t})$, and the rest of the analysis of this disclosure holds.

3.6 Derivation of Equation (35)

Let us examine a short-time Fourier transform of a transmitted signal x(t) in a time window $$w(t) = \frac{2\pi}{T}h(\tilde{t})$$

which vanishes, along with all its derivatives, outside the interval $[0, \infty[$. We will let the window function w(t) represent the impulse response of an analog lowpass filter and be scaled so that $\int_0^\infty dt\, w(t) = 1$.

The short-time (windowed) Fourier transform $X(t,\omega)$ of x(t) can be written as $$\begin{aligned} X(t, \omega) &= \int_{-\infty}^{\infty} d\tau x(\tau)w(t-\tau)e^{-i\omega\tau} \\ &= w(t) * [x(t)e^{-i\omega t}] \\ &= w(t) * [x(t)\cos(\omega t)] - iw(t) * [x(t)\sin(\omega t)] \\ &= I(t, \omega) + iQ(t, \omega), \end{aligned} \qquad (42)$$

where the asterisk denotes convolution, and $I(t,\omega)$ and $Q(t,\omega)$ can be interpreted as the in-phase and quadrature components, respectively, of a quadrature receiver with the local oscillator frequency $\omega$ and the impulse response of lowpass filters in the channels w(t).

Let us use the notation for dimensionless time as $$\tilde{t} = \frac{2\pi}{T}t,$$

and consider a transmitted signal x(t) of the form $$x(t) = A_T(\tilde{t})e^{i\omega_c t}, \qquad (43)$$

where $\omega_c$ is the frequency of the carrier, and $A_T(\tilde{t})$ is the desired (or designed) complex-valued modulating signal representing a data signal with symbol duration T.

The windowed Fourier transform of x(t) can be written as $$\begin{aligned} X(t, \Delta\omega) &= \int_{-\infty}^{\infty} d\tau A_T(\tilde{\tau})w(t-\tau)e^{i\Delta\omega\tau} \\ &= \frac{2\pi}{T}\int_{-\infty}^{\infty} d\tau[A_T(\tilde{\tau})h(\tilde{t}-\tilde{\tau})]\left[\frac{d}{d\tilde{\tau}}\frac{e^{i\Delta\omega\tau}}{i\Delta\omega}\right], \end{aligned} \qquad (44)$$

where $\tilde{\tau} = \frac{2\pi}{T}\tau$ and $\Delta\omega=2\pi\Delta f=\omega_c-\omega$. Since w(t) and all its derivatives vanish outside the interval [0, ∞[, consecutive integration by parts leads to $$X(t, \Delta f) = \frac{i^n}{(T\Delta f)^n} \int_{-\infty}^{\infty} d\bar{\tau} e^{i(T\Delta f)\bar{\tau}} \times \frac{d^n}{d\bar{\tau}^n}[A_T(\bar{\tau})h(\bar{t}-\bar{\tau})] \quad (45)$$

$$= \frac{i^n}{(T\Delta f)^n} \int_{-\infty}^{\infty} d\bar{\tau} e^{i(T\Delta f)\bar{\tau}} \times \sum_{m=0}^{n} \binom{n}{m} \cdot A_T^{(n-m)}(\bar{\tau}) \cdot$$

$$(-1)^m h^{(m)}(\bar{t}-\bar{\tau}),$$

$$\text{where } \binom{n}{m} = \frac{n!}{(n-m)!m!}$$

is a binomial coefficient ("n choose m").

To analyze the relative contributions of the terms in (45), let us first consider the case where all derivatives of order smaller or equal to n−1 of the window function w(t) are continuous, and all derivatives of the same order of the modulating signal $A_T(\bar{t})$ are finite. but the derivative of order n−1 of $A_T(\bar{t})$ has a countable number of step discontinuities at $\{\bar{t}_i\}$:

$$\alpha_i = \lim_{\varepsilon \to 0}[A_T^{(n-1)}(\bar{t}_i+\varepsilon) - A_T^{(n-1)}(\bar{t}_i-\varepsilon)] \neq 0. \quad (46)$$

From (46), it follows that $A_T^{(n)}(\bar{t})$ has a piecewise continuous component, as well as a singular component:

$$A_T^{(n)}(\bar{t}) = \sum_i \alpha_i \delta(\bar{t}-\bar{t}_i) + \text{(piecewise continuous function of } \bar{t}\text{)}, \quad (47)$$

where $\delta(x)$ is the Dirac δ-function (Dirac, 1958).

The significance of (47) lies in the sifting (sampling) property of the Dirac δ-function:

$$\int_{-\infty}^{\infty} dx \delta(x-x_0)h(x)=h(x_0) \quad (48)$$

for a continuous h(x). Then substitution of (47) into (45) leads to the following expression:

$$X(t, \Delta f) = \frac{i^n}{(T\Delta f)^n}\left[\sum_i \alpha_i h(\bar{t}-\bar{t}_i)e^{i(T\Delta f)\bar{t}_i} + \int_{-\infty}^{\infty} d\bar{\tau} e^{i(T\Delta f)\bar{\tau}} \times \text{(continuous function of } \bar{\tau}\text{)}\right]. \quad (49)$$

The second term in the square brackets is a Fourier transform of a continuous function, and it becomes negligible in comparison with the first term as the product TΔf increases. Thus, for the total power P(t,Δf) in a quadrature receiver, $$P_x(t, \Delta f) = |X(t, \Delta f)|^2 \quad (50)$$

$$\approx \frac{1}{(T\Delta f)^{2n}} \sum_i \alpha_i h(\bar{t}-\bar{t}_i) \sum_j \alpha_j^* h(\bar{t}-\bar{t}_j)$$

for $T\Delta f \gg 1$, which is equation (35) of Section 3.2.

4 Real-Time Mitigation of Speckle Noise in Coherent Imaging Systems

Ultrasound images provide the clinician with a valuable non-invasive, low cost, and real-time diagnostic tool. However, although the human eye is able to derive the meaningful information from these images, their usefulness is impeded by the noise and artifacts. Specifically, ultrasonic images (just like all coherent imaging systems) are generally affected by multiplicative shot (or speckle) noise.

Figure 21:
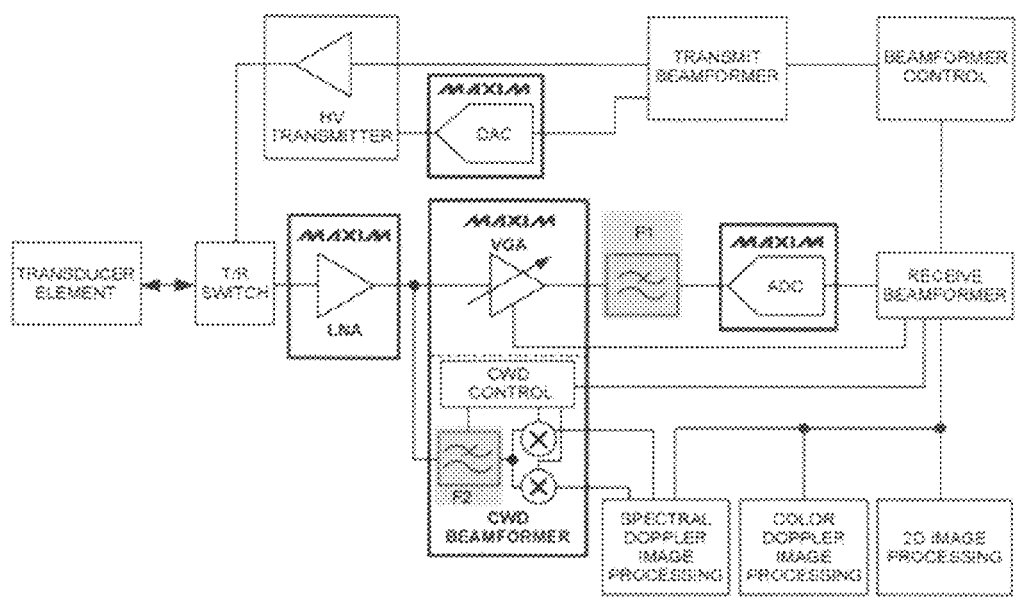
FIG. 21. Single transmit-and-receive channel for a typical phased-array medical ultrasound imaging system. The SPART filters simply replace the the anti-alias filter F1 and the low-pass filter F2 in the VGA control (both highlighted in gray).

Typically, various methods of reduction of the speckle noise involve non-real-time adaptive and non-adaptive speckle filtering of the acquired images, or multi-look processing. The SPART filters of the present invention provide a simple and effective method for real-time mitigation of speckle noise in ultrasound receivers, as well as other imaging systems such as synthetic aperture radars. The SPART filters can be employed in place of the corresponding linear filters in the image acquisition circuit, such as the anti-aliasing filters before the analog-to-digital converters (ADC), and the low-pass filters in the control loops of the variable-gain amplifiers (VGA). This is illustrated in FIG. 21, where the SPART filters replace the anti-alias filter and the low-pass filter in the VGA control (both highlighted in gray). FIG. 21 shows a single transmit-and-receive channel for a typical phased-array medical ultrasound imaging system, and is a modification of FIG. 5 from the article "Optimizing Ultrasound-Receiver VGA Output-Referred Noise and Gain" featured in Maxim's Engineering Journal, vol. 60.

5 Analog Rank-Based Nonlinear Filter with Adjustable Range of Linear Behavior Application of rank-based nonlinear filtering techniques to processing of continuous signals meets with considerable conceptual and practical difficulties. The highly nonlinear nature of rank filters renders the term 'frequency response' inadequate for their description and thus for the design of signal processing systems incorporating such filters. Also, analog implementation of rank filters normally requires delay lines, memory and/or clock circuits. Here we describe a simple analog implementation, without such circuits, of a filter with an essential large signal behavior of a rank filter in an exponential time window. This filter also allows for adjustment of a range where the response of the filter is equivalent to the response of an RC integrator. This enables the design of higher-order filters which combine desired frequency characteristics with such useful property of rank filters as insensitivity to outliers (e.g., impulsive noise). We illustrate the performance of such filters in several representative applications in comparison with 'equivalent' linear filters.

5.1 Introduction

The benefits of the analog implementation of rank filters, which offers real-time processing of continuous-time signals and might lead to simpler circuits with large power and area savings, are widely recognized (see, for example, (Paul and Hüper, 1993; Opris, 1996; Ferreira, 2000; Nikitin and Davidchack, 2003)). A generally adopted approach to such implementation is to mimic the digital filter in that a 'sorting' of continuous signal is implemented, usually by chopping the signal into chunks using a sequence of delay lines followed by a sorting circuit (see, for example, (Vlassis et al., 2000; D iaz-Sánchez et al., 2004)).

Earlier publications (Nikitin and Davidchack, 2003, 2004) proposed an analog implementation of rank filters based on the probabilistic definition of order statistics, namely that the $q^{th}$ order statistic, $X_q$, of a random variable x with a given cumulative distribution function $\Phi(X):=P(x<X)$ is defined implicitly by the equation $$\Phi(X_q)=q, \; 0 \leq q \leq 1. \tag{51}$$

For example, $X_{1/2}$ is the median of x.

For a continuous time signal x(t) in the time interval $t \in [0, T]$, the function analogous to the cumulative distribution function can be introduced. It is defined as the fraction of time the signal x(t) is below a threshold value D. With the help of the Heaviside unit step function $\theta(x)$, this definition can be expressed as follows:

$$\Phi(D) = \frac{1}{T}\int_0^T dt\, \theta[D - x(t)]. \tag{52}$$

This expression can be generalized for a continuous signal within an arbitrary moving time window w(t):

$$\Phi(D,t) = \int_{-\infty}^{\infty} ds\, w(t-s)\theta[D-x(s)] = w(t)*\theta[D-x(t)], \tag{53}$$

where $w(t) \geq 0$, $\int dt\, w(t)=1$, and the asterisk denotes convolution. In practice, it might be more convenient to use a sign (signum) function $\text{sgn}(x)=2\theta(x)-1$ instead of the Heaviside unit step function. Therefore, it is useful to define a shifted function $$\tilde{\Phi}(D_q,t) = w(t)*\text{sgn}[D-x(t)]. \tag{54}$$

By analogy with (51), we can use (54) to define the output of a rank filter of order q as follows:

$$\tilde{\Phi}[D_q(t),t] = w(t)*\text{sgn}[D_q-x(t)] = 2q-1, \; 0 \leq q \leq 1. \tag{55}$$

5.2 Practical Approximation of Rank Filter in Exponential Time Window

The definitions of analog rank filters in arbitrary continuous time windows, and derivations of general formulae for their various implementations can be found elsewhere (see, for example, (Nikitin and Davidchack, 2003; Nikitin et al., 2003; Nikitin and Davidchack, 2004; Nikitin, 2006, 2008, and 2009; Nikitin and Davidchack, 2006 and 2007)). Here we describe a simple practical approximation to a rank filter in an exponential time window, suitable for analog implementation without delay lines, memory and/or clock circuits.

Note that, in equation (51), sgn(x) is a discontinuous function and thus cannot be implemented in an analog circuit. Instead of sgn(x), let us use the following comparator function $\tilde{\mathcal{F}}(x)$:

$$\tilde{\mathcal{F}}(x + \delta x) < \tilde{\mathcal{F}}(x) \text{ for } \delta x > 0 \text{ and any } x, \tag{56}$$

$$\tilde{\mathcal{F}}(x) = -\tilde{\mathcal{F}}(-x),$$

$$\tilde{\mathcal{F}}(x) = gx \text{ for } |x| < (1-\varepsilon)g^{-1}S \text{ and } 0 < \varepsilon \ll 1,$$

$$\lim_{x \to \infty} \tilde{\mathcal{F}}(x) = S.$$

That is, $\tilde{\mathcal{F}}(x)$ is a strictly increasing odd function with horizontal asymptotes $\pm S$ which is linear for $|x| < (1-\varepsilon)g^{-1}S \approx g^{-1}S$. (Note that $g > 0$.) This can be a reasonable approximation to, for example, an operational amplifier with gain g and active output clamping at $\pm S$. It is convenient to denote $\Delta D = g^{-1}S$ as the resolution of the comparator function $\tilde{\mathcal{F}}(x)$. Also note that $\lim_{g \to \infty} S^{-1}\tilde{\mathcal{F}}(x) = \lim_{\Delta D \to 0} S^{-1}\tilde{\mathcal{F}}(x) = \text{sgn}(x)$.

Substitution of (56) into equation (55) leads to $$\tilde{\Phi}(D_q,t) = S^{-1} w(t)*\tilde{\mathcal{F}}[D_q - x(t)] = 2q-1, \tag{57}$$

and if the input and output signals satisfy the condition $|D_q - x(t)| < \Delta D$, equation (57) can be rewritten as a small signal approximation $$D_q(t) = w(t)*x(t) + (2q-1)\Delta D \; (\text{for } |D_q - x(t)| < \Delta D). \tag{58}$$

Now, let us assume that w(t) is an exponential time window represented by the impulse response of an RC integrator with $RC = \tau$, namely by $$w(t) = h_\tau(t) = \theta(t)\frac{e^{-t/\tau}}{\tau}, \tag{59}$$

where $\theta(t)$ is the Heaviside unit step function, and thus the time derivative of w(t) can be expressed as $$\dot{w}(t) = \frac{1}{\tau}[\delta(t) - h_\tau(t)], \tag{60}$$

where $\delta(t)$ is the Dirac delta function. Using equation (60), the expression for a rank filter given by equation (57) can be re-written in an explicit (albeit integro-differential) form, namely as (see Nikitin and Davidchack, 2003, 2004, for example)

$$\frac{D_q}{t} = \frac{(2q-1)S - \tilde{\mathcal{F}}[D_q - x(t)]}{\tau \frac{d}{dD_q}\{h_\tau(t)*\tilde{\mathcal{F}}[D_q - x(t)]\}}. \tag{61}$$

Finally, let us consider two rank filters of orders $q \pm \delta q$, $0 < \delta q \ll 1$, $$h\tau(t)*\tilde{\mathcal{F}}[D_{q\pm} - x(t)] = (2q1 \pm 2\delta q)S. \tag{62}$$

Clearly, since $\tilde{\mathcal{F}}(x)$ is a strictly increasing continuous function, $D_{q-} < D_{q+}$ and $\lim_{\delta q \to 0}(D_{q+} - D_{q-}) = 0$. Thus we can write:

$$\frac{d}{dD_q}\{h_\tau(t)*\tilde{\mathcal{F}}[D_q - x(t)]\} = \lim_{\delta q \to 0} \frac{h_\tau(t)*\tilde{\mathcal{F}}[D_{q+} - x(t)] - h_\tau(t)*\tilde{\mathcal{F}}[D_{q-} - x(t)]}{D_{q+} - D_{q-}} \tag{63}$$

$$= \lim_{\delta q \to 0} \frac{4S\delta q}{D_{q+} - D_{q-}}$$

$$\approx \frac{4S\delta q}{D_{q+}(t) - D_{q-}(t)},$$

and $$D_q(t) \approx \frac{1}{2}[D_{q+}(t) + D_{q-}(t)], \tag{64}$$

where $D_q(t)$ is the output of a rank filter of order q. Combining equations (61), (63) and (64), we arrive at the following approximation to a rank filter in a continuous exponential time window $h_\tau(t)$:

$$D_q(t) = \frac{1}{2}[D_{q+}(t) + D_{q-}(t)], \quad (65)$$

$$D_{q\pm}(t) = \frac{1}{RC}\int dt \frac{1}{A}\{\tilde{\mathcal{F}}[x(t) - D_{q\pm}(t)] + V_{q\pm}\}\{[D_{q+}(t) - D_{q-}(t)]G\},$$

$$V_{q\pm} = (2q - 1 \pm 2\delta q)S, \quad G = A\frac{RC}{4\tau S\delta q} = \frac{A}{V_{q+} - V_{q-}}\frac{RC}{\tau},$$

where the constants RC and A are introduced in relation to the implementation of this approximation in a feedback circuit, as discussed in the section that follows. For convenience, we will further refer to such a circuit as Single Point Analog Rank Tracker (SPART), where 'single point' emphasizes the fact that only current instantaneous value of the input signal x(t) enters the filter equation.

5.3 Operational Amplifier Implementation of SPART

Figure 22:
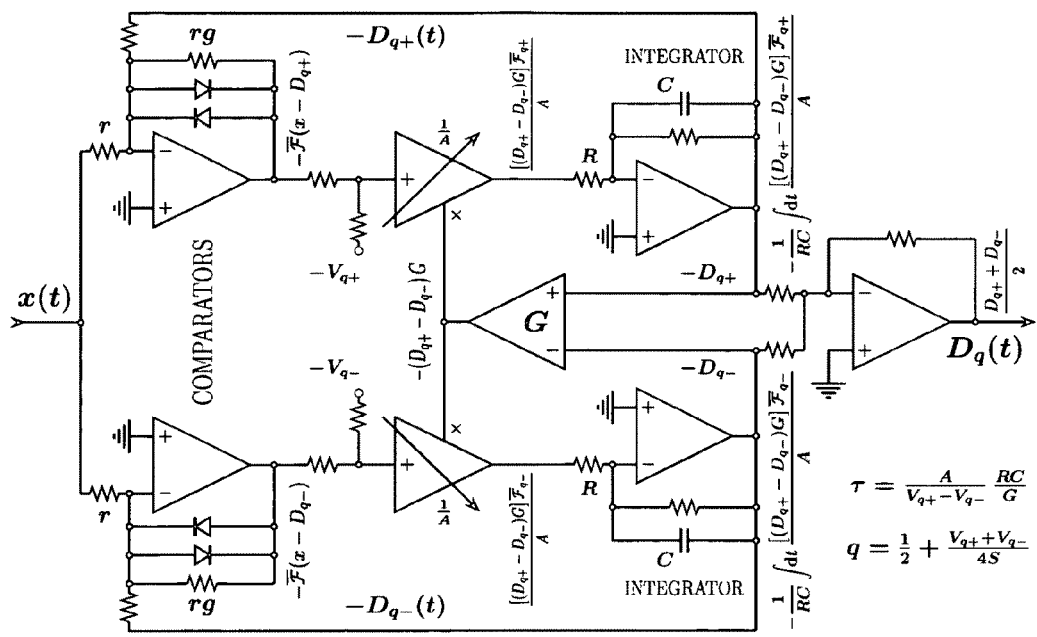
FIG. 22. Example of implementation of SPART using operational amplifiers. The details of the implementations of the differential amplifier and the voltage-controlled amplifiers are omitted.

In the comparators shown in FIG. 22, simple diode clamping is used to limit the output at about ±S. The functional description of the output of such a comparator can be given in terms of the Lambert W-function as $$f(x) = -gx + x_0 W\left[\frac{g\alpha}{x_0}\exp\left(\frac{g|x|}{x_0}\right)\right]\text{sgn}(x), \quad (66)$$

where $\alpha = I_s r$, and $x_0 = nV_T$. ($I_s$ and n are the diode saturation current and ideality factor, respectively, and $V_T$ is the thermal voltage, $V_T = 25.85$ mV at 300 K.) Thus this comparator function can be approximated by equation (56), where g is the small signal gain (set by the ratio of the feedback and the input resistors), and S is approximately the diode 'saturation' voltage (that is, the forward voltage at large current). In practice, for g>>1, S can be approximated by $$S = x_0 \sinh^{-1}\frac{x_0}{\alpha}$$

Figure 23:
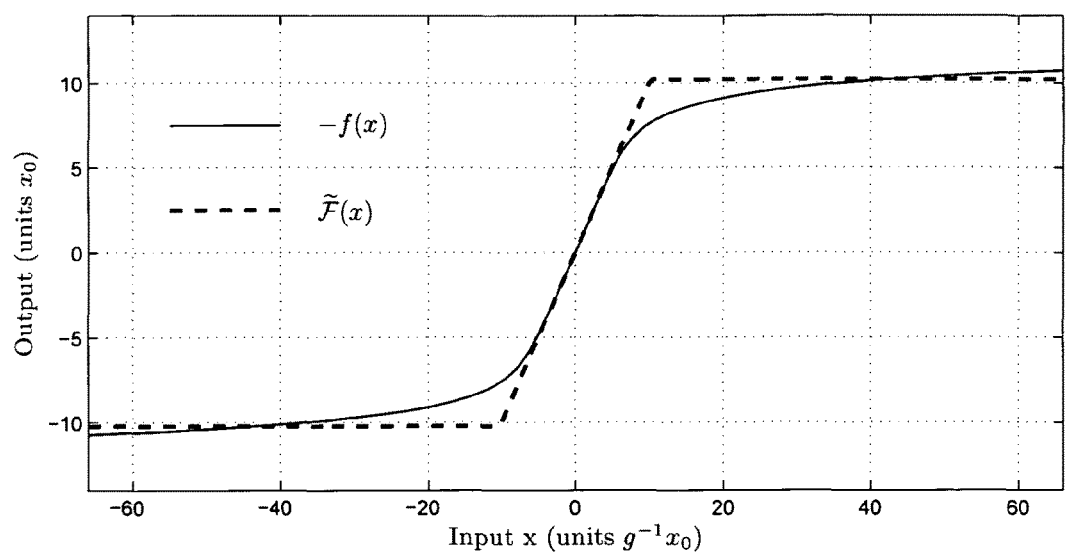
FIG. 23. Comparator functions given by equations (2) and (66) (for g=33 and α=7.3×$10^{-5}$$x_0$).

(see FIG. 23).

Note that, for q=1/2 (median mode), the value of S does not affect τ and/or q, and thus the change of S with temperature will have little impact on the overall performance of SPART.

5.4 Simplified Rank Tracker with Adjustable Range of Linear Behavior (FrankenSPART)

For small signals such that equation (58) is valid, we can rewrite equation (65) as $$D_q(t) = \frac{1}{RC}\int dt\{\tilde{\mathcal{F}}[x(t) - D_q(t)] + V_q\}\frac{1}{g}\frac{RC}{\tau}, \quad (67)$$

where $V_q = (2q-1)S$, and for such signals filters defined by equations (65) and (67) are equivalent. However, as can be easily seen, the output of the filter given by equation (67) is slew rate limited, $2S(q-1) \le g\tau \dot{D}_q(t) \le 2Sq$, as opposed to the filter given by equation (65), which imposes no limitations on the convergence rate.

Now the small signal condition can be written as $$2(q - 1)\mu < \frac{d}{dt}[h_\tau(t) * x(t)] < 2q\mu, \quad (68)$$

where $\mu = (g\tau)^{-1}S$. Thus, an input signal x(t) of the filters given by equations (65) and (67) is small if, given the same input, the slew rate of the output of an RC integrator with RC=τ is limited according to equation (68).

5.5 Operational Amplifier Implementation of FrankenSPART

Figure 24:
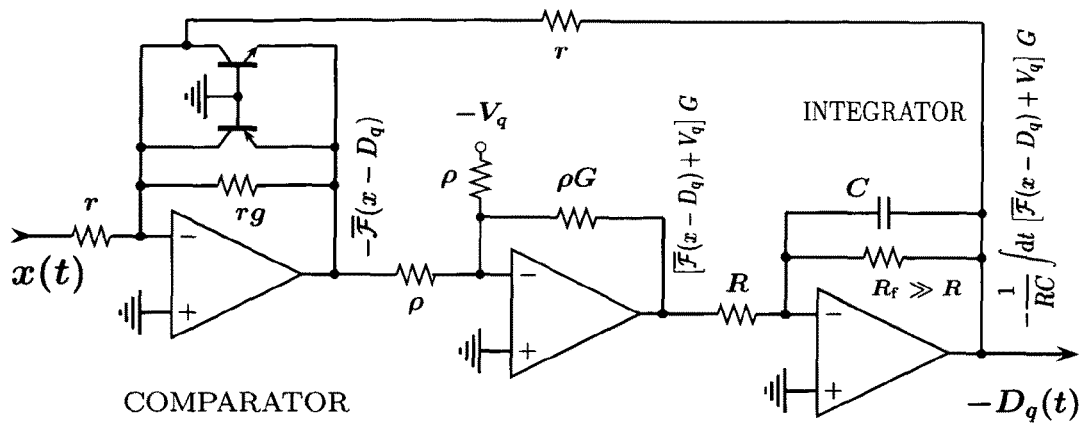
FIG. 24. Example of implementation of FrankenSPART using operational amplifiers.

FIG. 24 provides an example of implementation of FrankenSPART using operational amplifiers. The filter parameters can be expressed as follows:

$$\text{Time constant: } \tau = \frac{1}{gG}RC \quad (69)$$

$$\text{Slew rate parameter: } \mu = G\frac{S}{RC}$$

$$\text{Comparator resolution: } \Delta D = \frac{S}{g} = \mu\tau$$

$$\text{Quantile parameter: } q = \frac{1}{2} + \frac{V_q}{2S},$$

$$2(q-1)\mu \le \dot{D}_q(t) \le 2q\mu$$

5.6 Median Mode FrankenSPART in Comparison with First Order Lowpass RC Filter and Slew Rate Limiting Filter An important special case of a FrankenSPART configuration is the median mode (q=1/2). This mode is achieved by setting $V_q = 0$ in equation (67). In the subsequent discussions it will be assumed by default that a FrankenSPART circuit operates in the median mode unless explicitly specified otherwise. In the median mode, the only two remaining parameters of FrankenSPART are its time constant τ and slew rate parameter μ.

As follows from equation (58), a small signal response of a FrankenSPART circuit in median mode is equivalent to a first order low pass RC filter with RC=τ. We will further refer to the latter as the 'RC filter', or 'RC circuit', and assume, for comparison with FrankenSPART, the equality RC=τ, where τ is the time constant of the FrankenSPART circuit.

For large signals, the (median) FrankenSPART circuit limits the slew rate of the output to $\mu = (g\tau)^{-1}S$, and thus is equivalent to a 'purely' slew rate limiting filter. For comparison with FrankenSPART, a purely slew rate limiting filter can be constructed as another FrankenSPART filter with the same slew rate μ but much smaller time constant, δτ<<τ.

We will now proceed to compare the FrankenSPART with these two filters which manifest the limiting behavior of the FrankenSPART circuit. We will perform such comparison by considering the following examples: (1) the total power response to a harmonic signal at various frequencies, (2) the nonlinear distortions of a harmonic signal at selected frequencies, (3) the response to 'rectangular' (boxcar) pulses of various amplitudes and durations, and (4) the response to white noise of different bandwidth, total power, and impulsivity. This comparison shall provide us with some general guidelines of the FrankenSPART usage in various telecommunication and data acquisition systems.

5.6.1 Attenuation of Harmonic Signals

Figure 25:
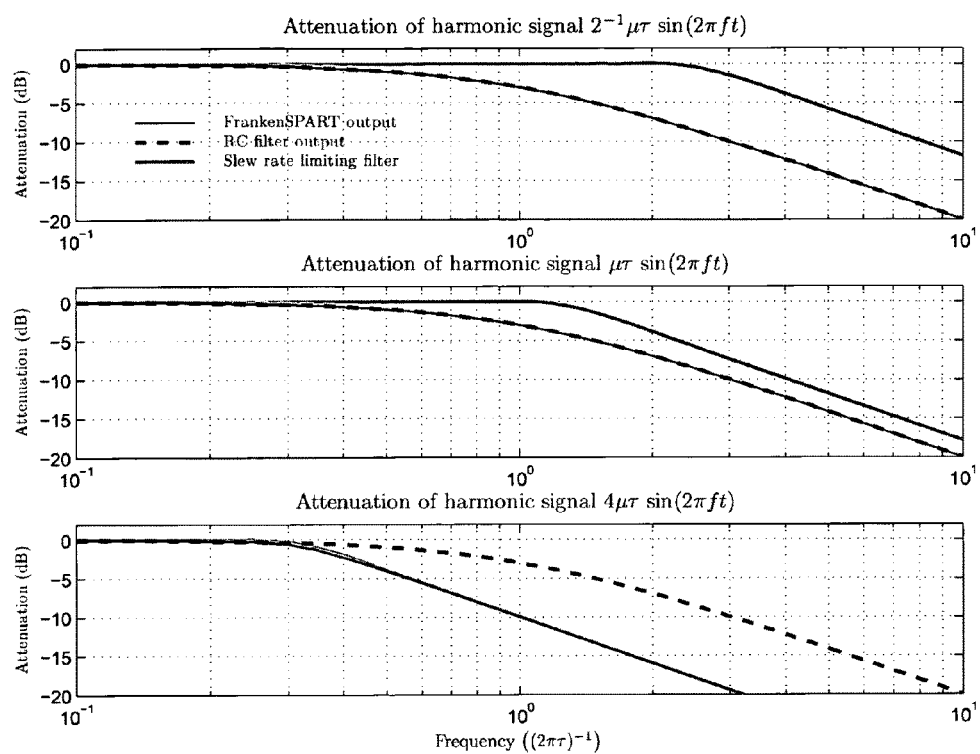
FIG. 25. Attenuation of harmonic signal of various amplitudes and frequencies. Notice that for the signals with the amplitudes below the 'critical' (μτ) amplitude, the FrankenSPART acts as an RC filter, and for the signals with the amplitudes above the critical, the FrankenSPART circuit behaves like a slew rate limiting filter.

It can be easily shown that, given a harmonic input with the amplitude A, the maximum slew rate of the output of an RC filter is A/RC. Thus signals below this 'critical' amplitude will satisfy the small signal condition of equation (58), and the FrankenSPART filter will be equivalent to the RC filter for those signals. In terms of the parameters of the median mode FrankenSPART, the critical amplitude can be expressed as $\mu\tau$. FIG. 25 illustrates our earlier statement that the FrankenSPART response to small signals is equivalent to that of a first order low pass RC filter with RC=$\tau$, while its response to large signals is approaching that of a slew rate limiting filter.

5.6.2 Nonlinear Distortions of Harmonic Signals

Figure 26:
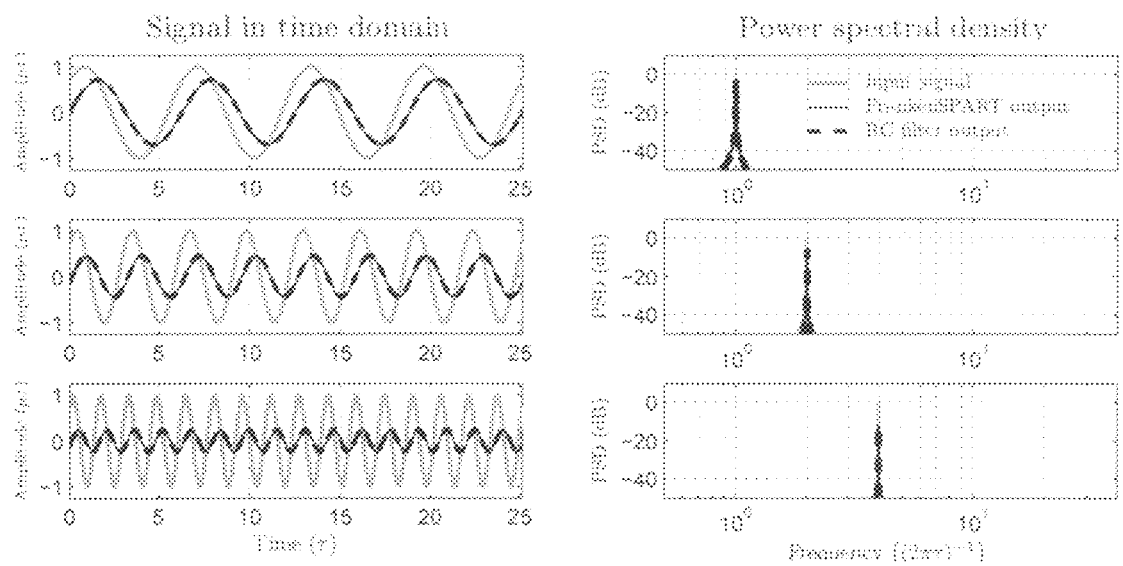
FIG. 26. Illustration of the absence of nonlinear distortions of harmonic signals with the amplitude below critical when filtered by the FrankenSPART circuit.
Figure 27:
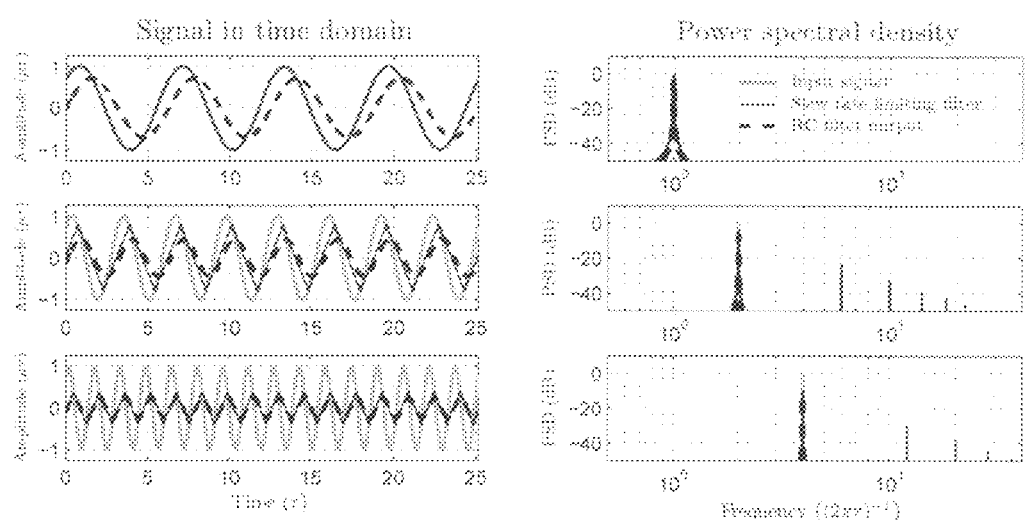
FIG. 27. Nonlinear distortions of harmonic signals with critical amplitude by the slew rate limiting filter. Notice that, since the output of the filter is symmetrical, only odd harmonics are present.

FIG. 26 illustrates the absence of nonlinear distortions of harmonic signals with the amplitude below critical when filtered by the FrankenSPART circuit. For comparison, FIG. 27 shows nonlinear distortions of harmonic signals with critical amplitude by the slew rate limiting filter. Notice that, since the output of the filter is symmetrical, only odd harmonics are present.

Figure 28:
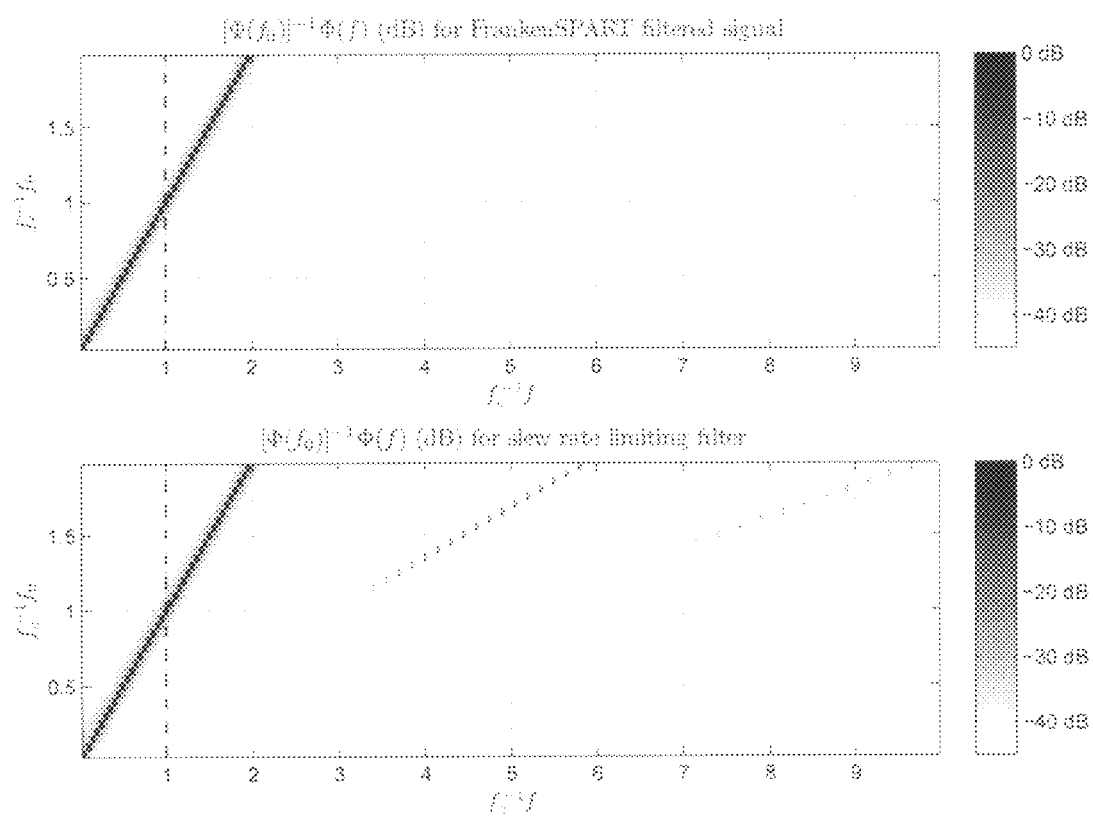
FIG. 28. Nonlinear distortions of harmonic signals with critical amplitude by the FrankenSPART and slew rate limiting filters.

FIG. 28 provides another comparison of nonlinear distortions of harmonic signals with critical amplitude by the FrankenSPART and slew rate limiting filters.

5.6.3 Attenuation of 'Rectangular' (Boxcar) Pulses

Figure 29:
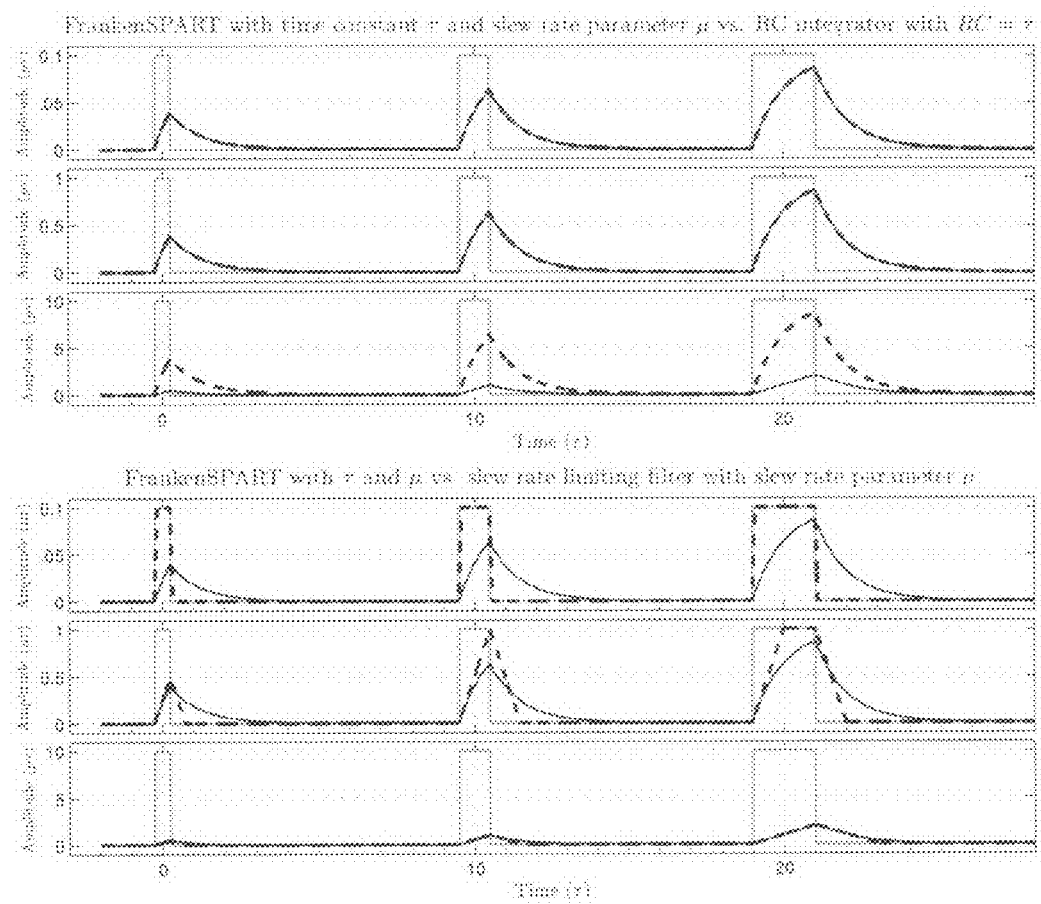
FIG. 29. Response of FrankenSPART to boxcar pulses of various height and duration in comparison with the response of an RC circuit (top three panels) and a slew rate limiting circuit (bottom three panels). In all panels, the gray lines correspond to the input boxcar pulses, the solid black lines correspond to the FrankenSPART output, the dashed lines correspond to the RC and slew rate limiting circuits, left and right respectively. One can see that the attenuation of boxcar pulses by FrankenSPART is significantly higher then by the RC filter for large pulses, and higher then by the slew rate limiting filter for small pulses.
Figure 30:
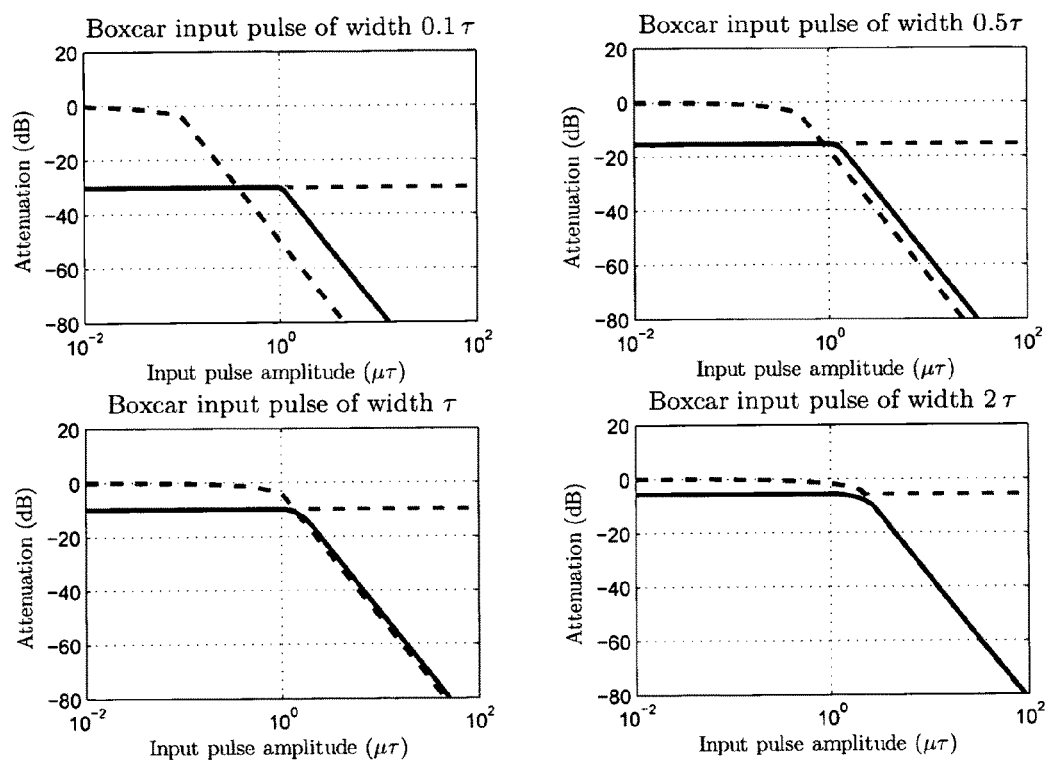
FIG. 30. Comparison of attenuation of boxcar pulses by FrankenSPART (solid lines) in comparison with an RC integrator (gray dashed lines) and a slew rate limiting filter (black dashed lines).

FIG. 29 shows the response of FrankenSPART to boxcar pulses of various height and duration in comparison with the response of an RC circuit (top three panels) and a slew rate limiting circuit (bottom three panels). In all panels, the gray lines correspond to the input boxcar pulses, the solid black lines correspond to the FrankenSPART output, the dashed lines correspond to the RC and slew rate limiting circuits, left and right respectively. One can see that the attenuation of boxcar pulses by FrankenSPART is significantly higher then by the RC filter for large pulses, and higher then by the slew rate limiting filter for small pulses. As can be seen in FIG. 30, FrankenSPART attenuates boxcar pulses with amplitudes up to $\mu\tau$ as effectively as a linear RC filter, and more effectively then a slew rate limiting filter (especially for the pulses narrower than $\tau$). For puses of any width with amplitudes larger than $\mu\tau$, the FrankenSPART circuit has much stronger attenuation than the linear filter. For large pulses of widths greater than $\tau$, FrankenSPART's attenuation is roughly equivalent to that of the slew rate limiting filter. Thus one can conclude that an overall performance of the FrankenSPART circuit in suppression of boxcar pulses is better than either the RC integrator or the slew rate limiting filter.

5.6.4 Response to White Noise of Different Total Power and Impulsivity

Figure 31:
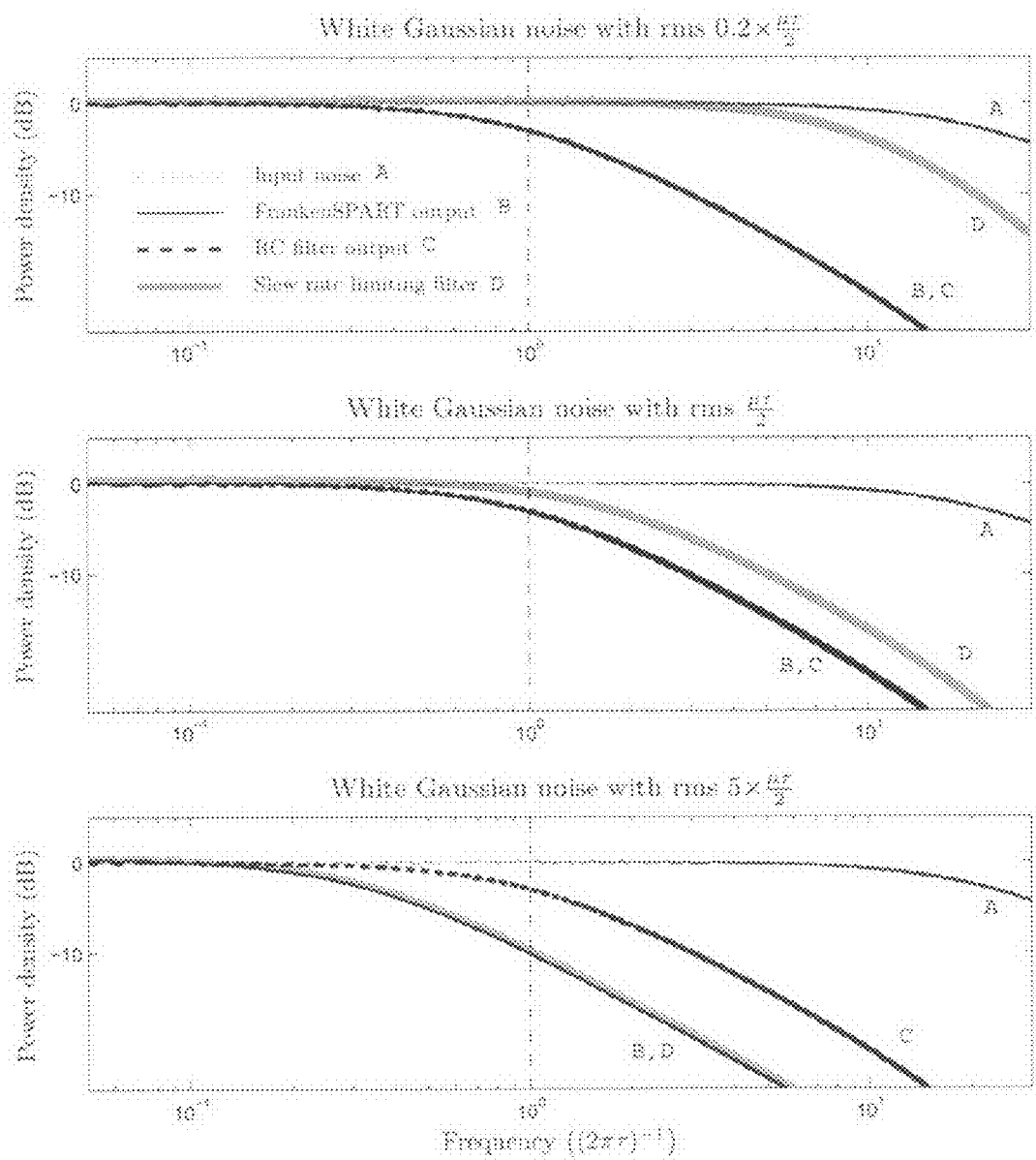
FIG. 31. Response to Gauissian white noise with different rms values. The noise bandwidth is approximately twenty times the bandwidth of the linear RC filter Notice that for the signals with the rms below μτ/2, the FrankenSPART circuit acts as an RC filter, and for the signals with the rms much larger than μτ/2, the FrankenSPART circuit behaves like a slew rate limiting filter.
Figure 32:
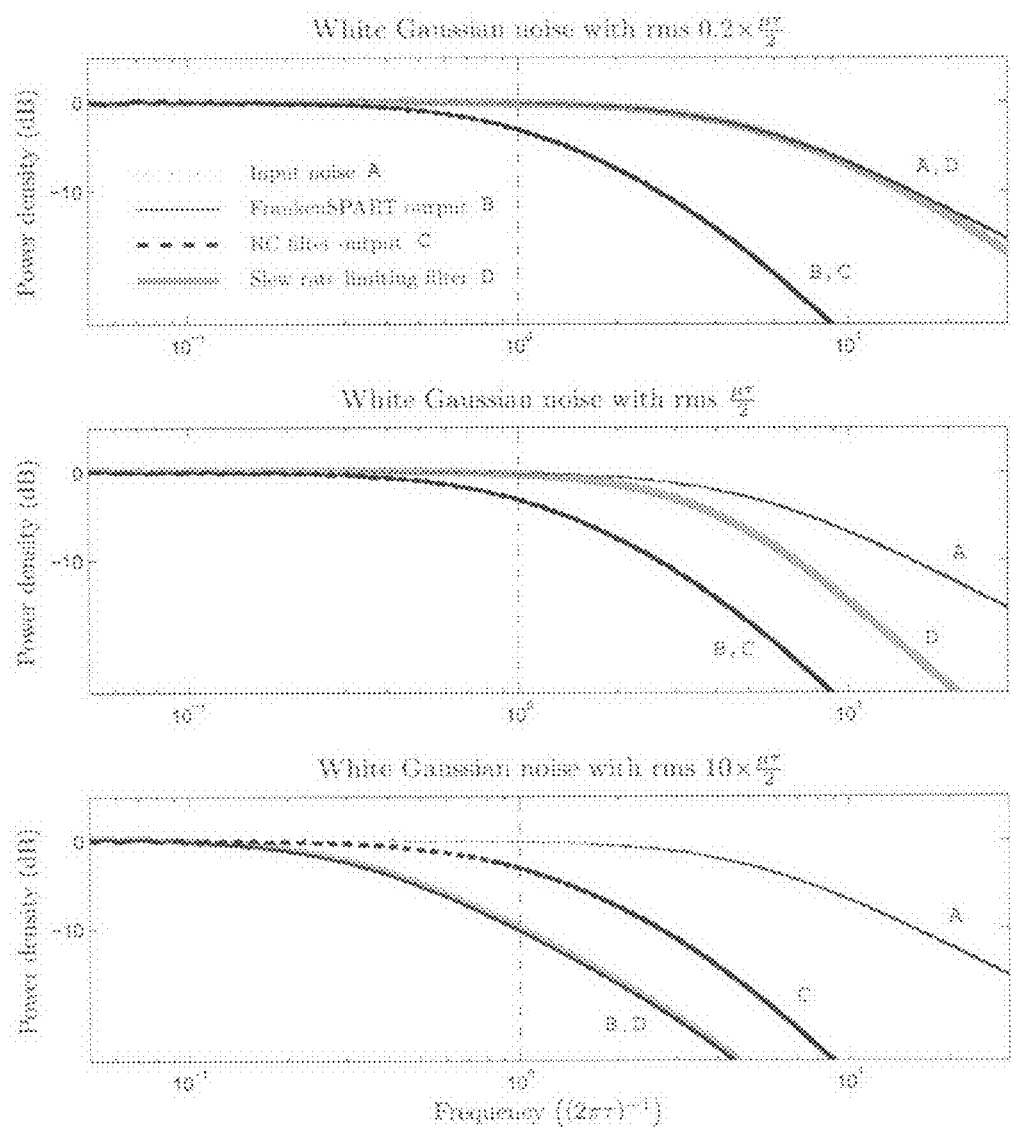
FIG. 32. Response to Gauissian white noise with different rms values. The noise bandwidth is approximately five times the bandwidth of the linear RC filter Notice that for the signals with the rms below μτ/2, the FrankenSPART circuit acts as an RC filter, and for the signals with the rms much larger than μτ/2, the FrankenSPART circuit behaves like a slew rate limiting filter.

FIGS. 31 and 32 provide yet another illustration that the FrankenSPART response to small signals is equivalent to that of a first order low pass RC filter with RC=$\tau$, while its response to large signals is approaching that of a slew rate limiting filter.

5.7 General Use of SPART/FrankenSPART in Filtering Applications

As was discussed earlier, the SPART and FrankenSPART circuits behave like RC circuits for the signals within a certain slew rate range, and thus they can be used as a real pole in any linear filter with such a pole. For example, a FrankenSPART circuit followed by a Sallen-Key stage (see Sallen and Key, 1955, for example) can implement a filter which acts like a third order Butterworth filter for signals within a specified slew rate range, but is insensitive to outliers (resistant to impulsive noise).

Note that, as was discussed earlier, suppression of impulsive noise by the SPART and FrankenSPART circuits is much better for narrow pulses, and thus a SPART/FrankenSPART circuit should be the first stage in such a filter in order not to limit the bandwidth of the noise.

5.7.1 Examples of Impulsive Noise

In general, the amplitude distribution of impulsive noise is a heavy-tailed distribution, such as, for example, the Student's t-distribution or one of the Stable Distribution family.

There are numerous sources of impulsive noise. For example, common electrical impulsive noise is shot noise. Multiplicative noise is typically impulsive. Also, even though white Gaussian noise is not impulsive, product of any number of white Gaussian noises is impulsive. Thus impulsive noise would commonly occur in all nonlinear electronic circuits such as, for example, modulators, since nonlinearity implies multiplication.

A 'telegraph' (square wave) signal filtered by a high-pass filter will produce short duration pulses which can constitute impulsive noise.

The signal components induced in a receiver by out-of-band communication transmitters can be impulsive.

5.7.2 Suppression of Impulsive Noise in Broadband Applications

Figure 33:
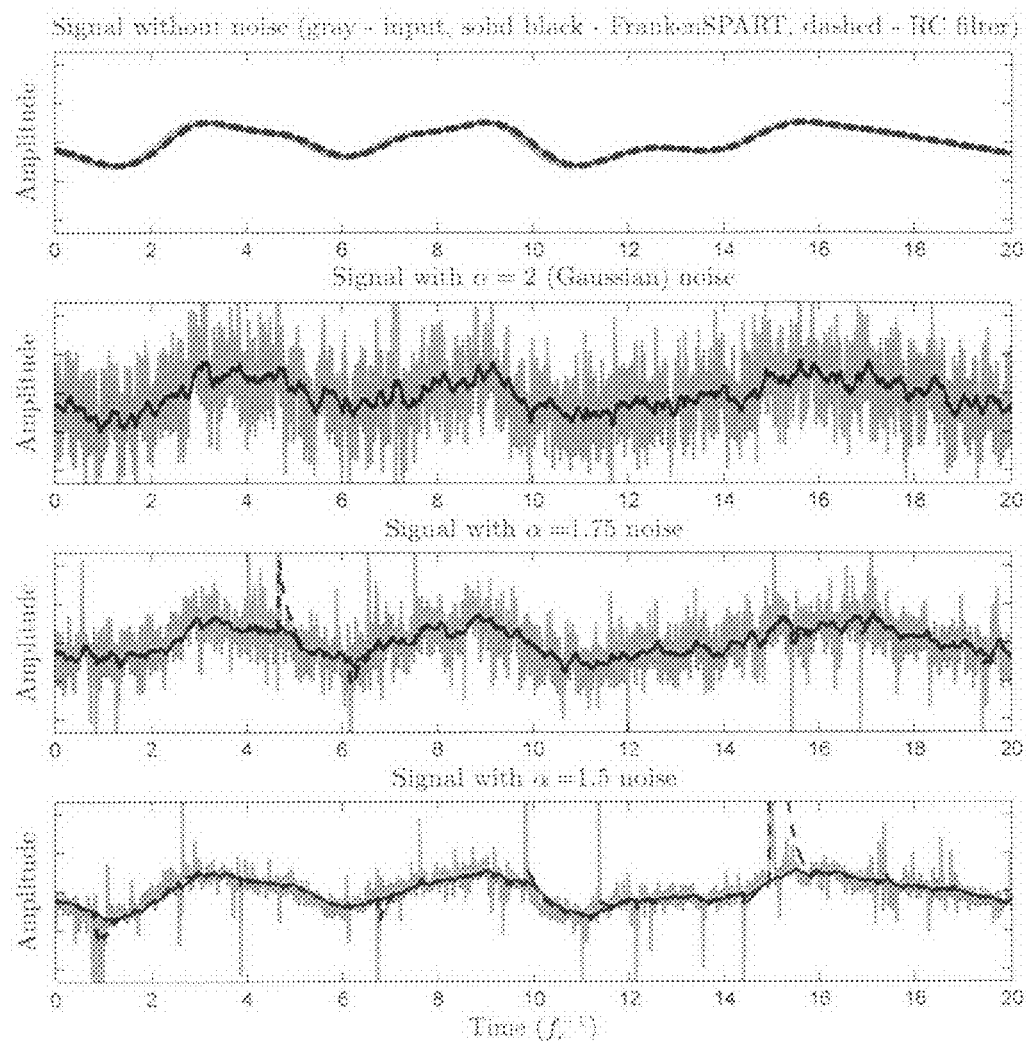
FIG. 33. FrankenSPART attenuation of impulsive white noise in a broadband signal. The noise bandwidth is approximately ten times the bandwidth of the linear RC filter, and its index of stability (characteristic exponent) is α=2 (Gaussian), 1.75, and 1.5. In all panels, the gray lines show the input signal, the solid black lines show the FrankenSPART output, and the dashed lines show the output of the RC filter. In the example, the power signal to noise ratio of the unfiltered noisy signal is maintained constant.
Figure 34:
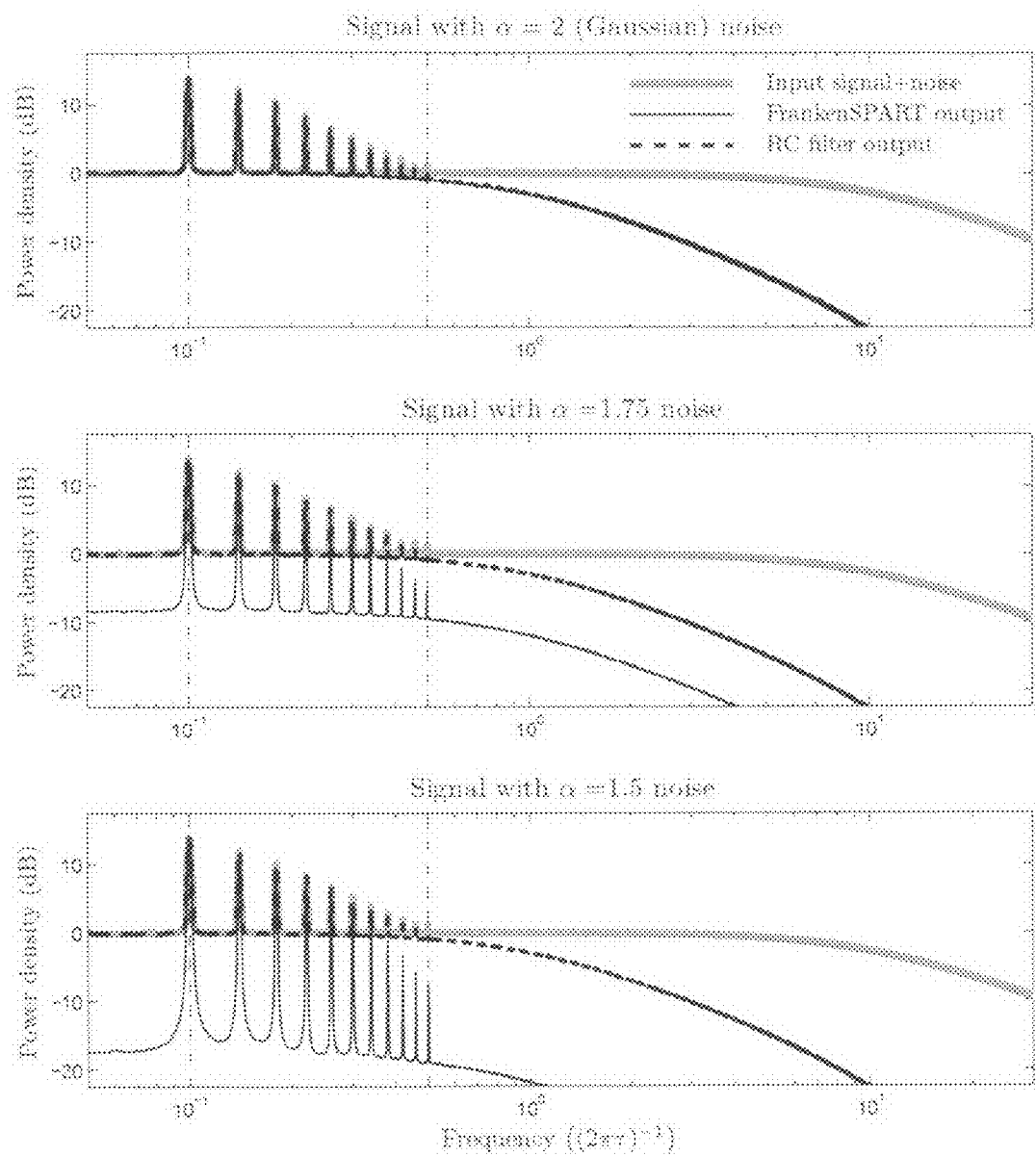
FIG. 34. FrankenSPART attenuation of impulsive white noise in a broadband signal. The noise bandwidth is approximately ten times the bandwidth of the linear RC filter, and its index of stability (characteristic exponent) is α=2 (Gaussian), 1.75, and 1.5. In all panels, the gray lines correspond to the input signal, the solid black lines correspond to the FrankenSPART output, and the dashed lines correspond to the RC filter. In the example, the power signal to noise ratio of the unfiltered noisy signal is maintained constant.

FIGS. 33 and 34 illustrate, in time and frequency domains, respectively, attenuation of impulsive white noise by FrankenSPART in a broadband signal. In the examples, the noise bandwidth is approximately ten times the bandwidth of the corresponding linear RC filter, and its index of stability (characteristic exponent) is $\alpha$=2 (Gaussian), 1.75, and 1.5. In all panels, the gray lines show the input signal, the solid black lines show the FrankenSPART output, and the dashed lines show the output of the RC filter. In the example, the power signal to noise ratio of the unfiltered noisy signal is maintained constant.

5.7.3 Using SPART and FrankenSPART for Demodulation

Figure 35:
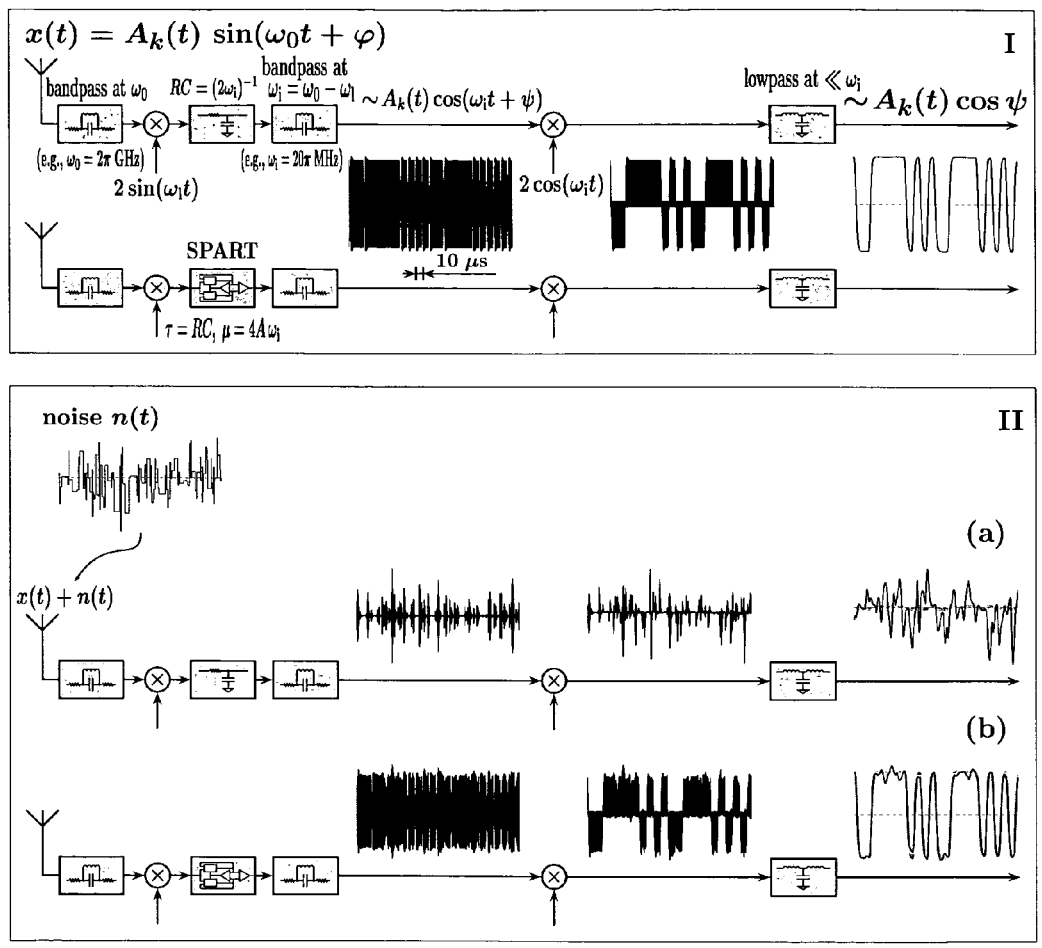
FIG. 35. Demodulation of a binary phase-shift keying (BPSK) signal. Panel I shows that, for a noise-free signal, replacement of an RC filter in the bandpass filter at the intermediate frequency of a superheterodyne receiver does not affect the performance of the receiver. However, as shown in Panel II, the SPART-based receiver greatly improves the performance in the presence of high intensity impulsive noise.

FIG. 35 provides an example of using SPART (or FrankenSPART) in demodulation of a binary phase-shift keying (BPSK) signal. Panel I shows that, for a noise-free signal, replacement of an RC filter in the bandpass filter at the intermediate frequency of a superheterodyne receiver does not affect the performance of the receiver. However, as shown in Panel II, the SPART-based receiver greatly improves the performance in the presence of high intensity impulsive noise.

5.8 Using SPART and FrankenSPART as Non-Median Rank Filters

Figure 36:
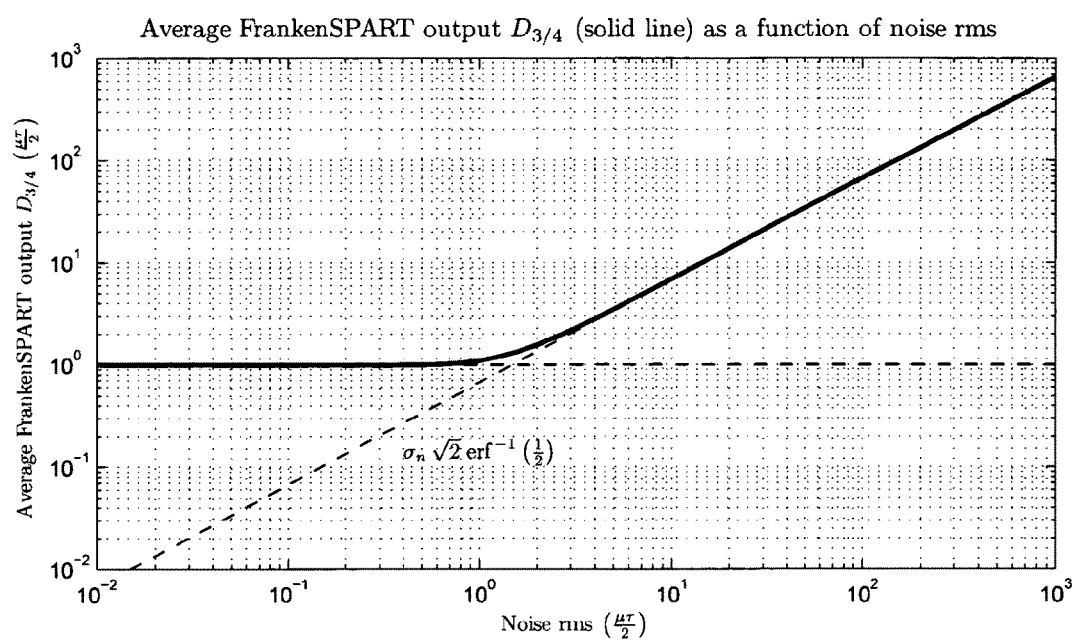
FIG. 36. Average FrankenSPART output $D_{3/4}$ as a function of noise rms.
Figure 37:
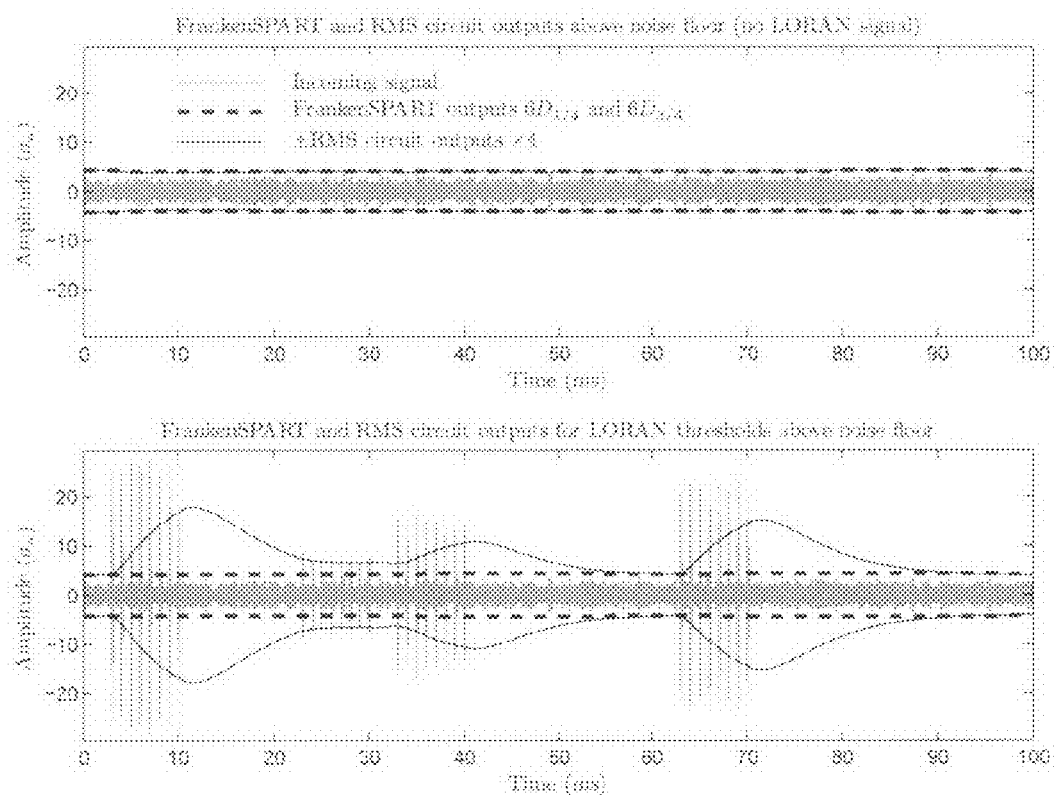
FIG. 37. Comparison of noise thresholds established by FrankenSPART and RMS circuits.

5.8.1 Establishing LORAN Threshold Above Noise Floor with FrankenSPART Circuit A FrankenSPART circuit with the quantile parameter q≠1/2 can be used to establish the noise floor for a navigation signal such as LORAN. For example, for q=3/4 (third quartile), the output of a FrankenSPART circuit will be $\mu\tau/2$ for a low level noise (that is, the noise with rms $\sigma_n$ below $\mu\tau/2$), and will be approaching $\sigma_n\sqrt{2}\text{erf}^{-1}(1/2)$ for a high level noise (see FIG. 36). The example in FIG. 37 shows several LORAN pulses protruding from the noise, and the threshold levels established by a FrankenSPART circuit with $\tau$=3.4 ms and $\mu$=2 V/s, and a RMS circuit with the same time constant as the FrankenSPART. (Each circuit is followed by an RC integrator with RC=$\tau$ and the gain 6 and 4, respectively.)

From FIG. 37, one can see that the output of the FrankenSPART threshold circuit is largely unaffected by the signal pulses (and thus is immune to the cross rate interference), or by high level outliers such as lightning.

6 Method for Signal Sampling

6.1 Synopsis

Multimodal Pulse Shaping

Figure 38:
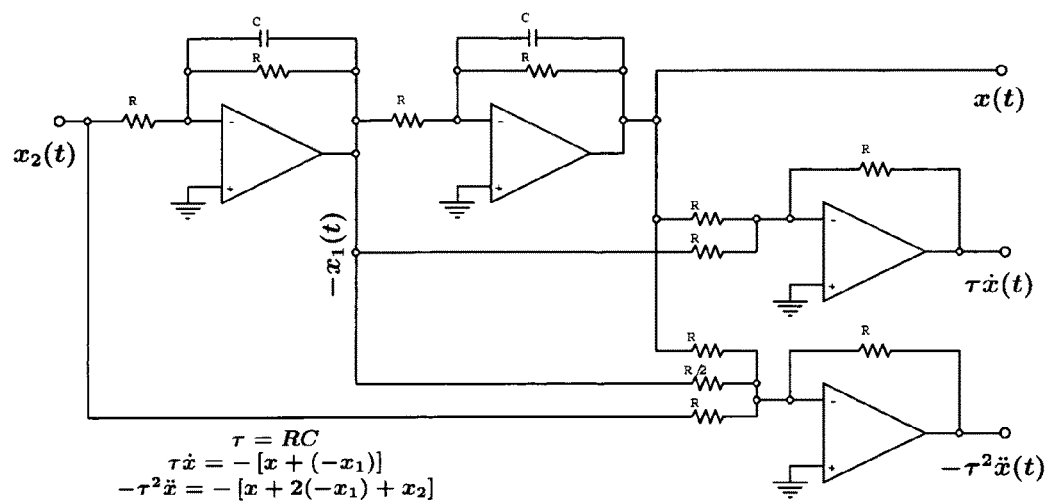
FIG. 38. Example of a circuit for obtaining the prime and the first two derivative signals.
Figure 39:
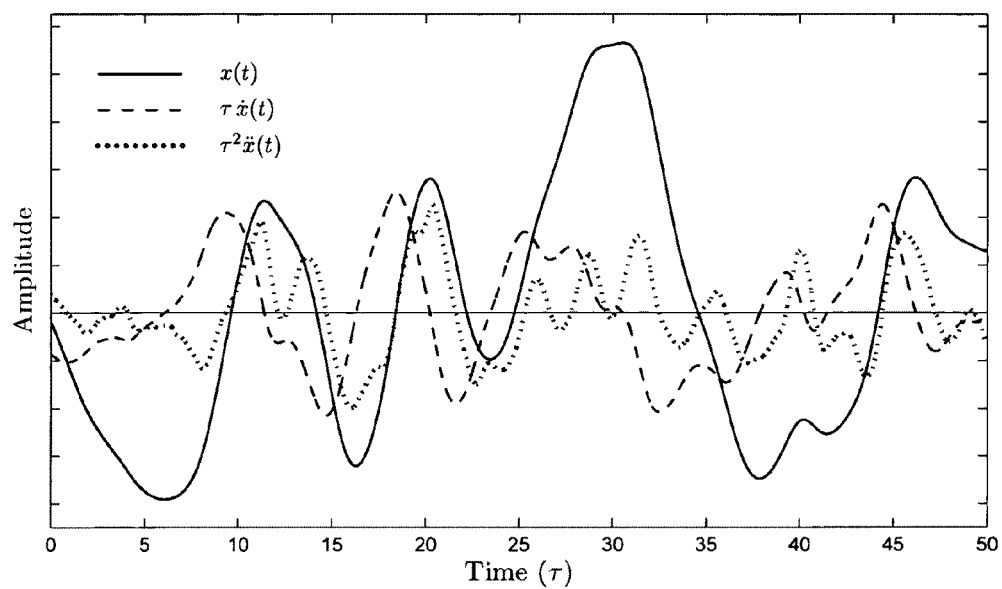
FIG. 39. Prime (solid) and first two derivative (dashed and dotted, respectively) outputs of the circuit shown in FIG. 38.

Given an input signal, one can construct a simple analog network to output a filtered output signal x(t) ('prime signal') along with any number of the signals proportional to any order time derivatives of the output signal ('derivative signals'), $$\tau^n \frac{d^n}{dt^n} x(t),$$

or any linear combination of the derivatives. For a bandlimited signal, this can be done with or without affecting the bandwidth of the input signal. An example of a circuit for obtaining the prime and the first two derivative signals is given in FIG. 38. FIG. 39 shows the prime (solid line) and the first two derivative (dashed and dotted lines, respectively) outputs of the circuit shown in FIG. 38.

Sampling at Zero Crossings or Other Values of Modes

In multimodal pulse shaping, zero crossings $t_i$ of a mode of order n correspond to the extrema of the mode of order n−1. Thus one can use such zero crossings to construct a (non-periodic) Dirac comb $\Sigma_i\delta(t-t_i)$ to sample the prime and the derivative signals at the points where certain time derivatives of the prime signal either vanish (for example, at stationary and inflection points), or take certain range of values Reconstruction by Polynomial Interpolation The knowledge, in addition to the prime signal values, of the derivatives at the sampling times allows one to construct a polynomial interpolation (for example, using Hermite polynomials) with well defined boundary conditions. This allows, for example, construction of high order monotone polynomial interpolations without preprocessing. For instance, sampling the prime signal values at stationary points (that is, at zero control tangents of cubic Hermite splines) allows monotone cubic interpolation through stationary points, while sampling the prime signal values at stationary and inflection points and sampling the values of the first derivative signal at the inflection points allows monotone cubic interpolation through both stationary and inflection points Imposing Additional Constraints Various additional constraints can be imposed on the sampling, enabling sentient acquisition of nonlinear and nonstationary signals. Such constraints can be applied to the values of the sampled modes (e.g., sampling only at certain threshold crossings of different modes), or to the sampling times (e.g., introducing extended or nonextended dead time into the process of generation of the Dirac comb). For instance, sampling the prime signal at the downward zero crossings of the first derivative signal allows one to obtain the upper envelope of the prime signal, while sampling at the upward zero crossings provides the lower envelope

6.1.1 Example of Dead Time Constraints on Sampling at Stationary and Inflection Points Please note that a particular formulation of the algorithm can take various different in the language but equivalent forms, and the order of the steps in a particular implementation can vary to a degree without affecting the outcome.

(1) Generate prime timing pulses $t_i$ (pulse train $\Sigma_i\delta(t-t_i)$) from zero crossings of the first derivative signal, and generate the prime dead time condition signal from the timing pulses $t_i$ (for example, as the signal $1-\Sigma_i[\theta(t-t_i)-\theta(t+t_d-t_i)]$, where the zero values correspond to the times affected by a prime nonextended dead time $t_d$)

(2) Generate intermediate timing pulses $t'_j$ from zero crossings of the second derivative signal under the prime dead time condition of step (1) (e.g., as $\Sigma_i\delta(t-t_i)\{1-\Sigma_i[\theta(t-t_i)-\theta(t+t_d-t_i)]\}$, where $t_j$ are the zero crossings of the second derivative signal), and generate the secondary dead time condition signal from the intermediate timing pulses $t'_j$ (3) Generate secondary timing pulses $t_j$ by imposing the secondary dead time condition of step (2) on the intermediate timing pulses $t'_j$ of step (2) (that is, by applying the secondary dead time condition signal of step (2) to the pulse train $\Sigma_j\delta(t-t'_j)$)

(4) Obtain samples $x_i=x(t_i)$ and $x_j=x(t_j)$ of the prime signal at the prime times $t_i$ of step (1) and the secondary times $t_j$ of step (3), and obtain samples $\tau\dot{x}_j=\tau\dot{x}(t_j)$ of the first derivative signal at the secondary times $t_j$ of step (3)

Figure 40:
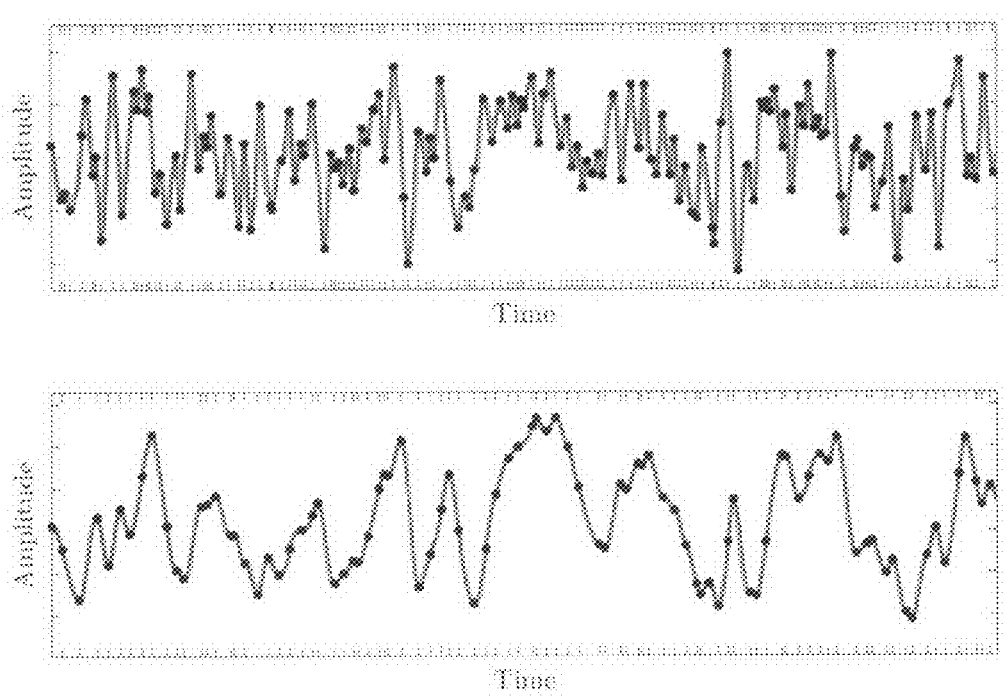
FIG. 40. Example of sampling according to the algorithm of Section 6.1.1. The incoming prime signal is shown by the gray lines, the samples are shown by the dots, and the black lines show the signals reconstructed by cubic splines. The ticks at the x-axis indicate the sampling times.

FIG. 40 provides an example of sampling according to the algorithm of Section 6.1.1. The incoming prime signal is shown by the gray lines, the samples are shown by the dots, and the black lines show the signals reconstructed by cubic splines. The ticks at the x-axis indicate the sampling times.

7 Method for Low Frequency Terrestrial Navigation

Using a LORAN-C receiver as an example, we describe a method for low frequency terrestrial navigation.

This method enables the development of simple, low cost, low electrical and computational power, passive terrestrial navigation systems based on a low frequency carrier and narrow bandwidth pulses. A receiver for such a system can be implemented in an inexpensive analog IC and incorporated in a handset without a noticeable increase in consumption of the handset's power and computational resources.

7.1 Technology Elements

7.1.1 Bimodal Pulse Shaping (BPS) and Signal Sampling at Extrema

Figure 41:
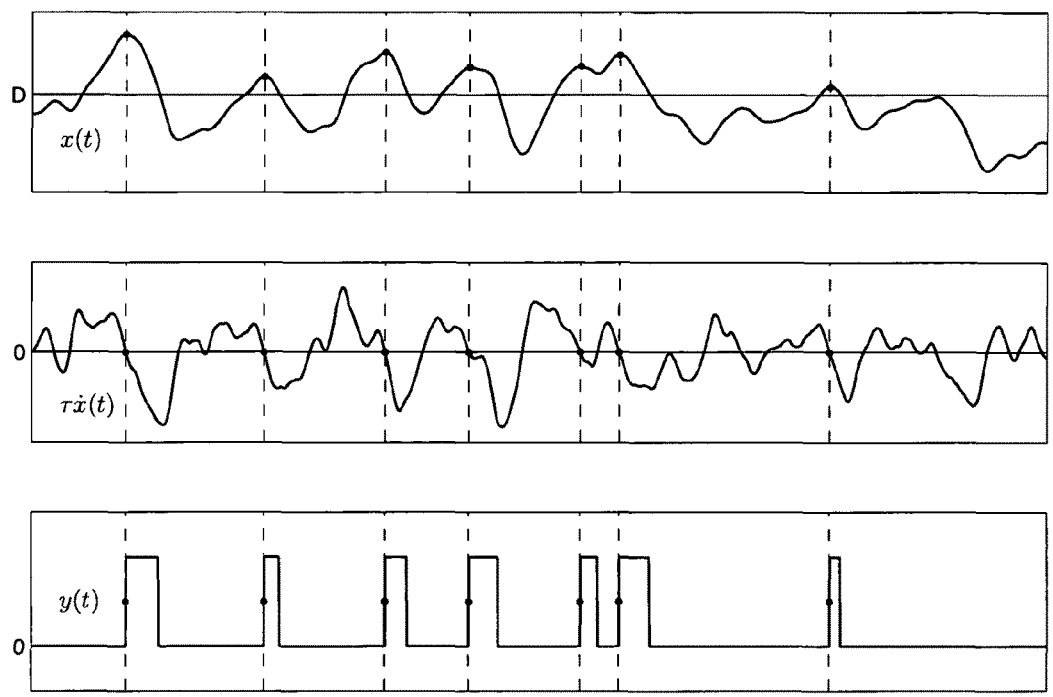
FIG. 41. Timing the maxima of a prime signal above a threshold by downward zero crossings of an auxiliary signal proportional to the first time derivative of the prime signal.

Let us consider two signals which we shall call, for convenience, a prime signal and an auxiliary signal, such that the auxiliary signal is proportional to the first time derivative of the prime signal. Then, by definition of an extremum, the times of local maxima in the prime signal are equal to the times of downward zero crossings in the auxiliary signal. If we denote the prime and the auxiliary signals as x(t) and $\tau\dot{x}(t)$, respectively, then the signal y(t) defined as $$y(t)=\theta[x(t)-D]\theta[-\tau\dot{x}(t)], \tag{70}$$

where θ(x) is Heaviside unit step function, will consist of non-overlapping rectangular ('box-car') pulses of unit amplitude with the onsets (front edges) of the pulses located at the times of the maxima of the prime signal x(t) above the threshold D. This is illustrated in FIG. 41.

In practice, a step function can be easily implemented by a comparator, and a product of two step functions can be realized by an analog AND gate.

Figure 42:
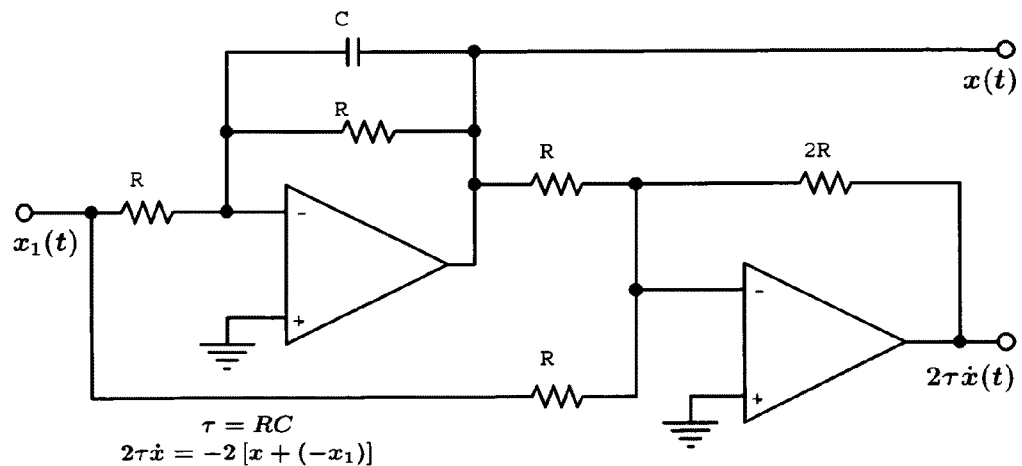
FIG. 42. Example of a circuit for constructing prime and auxiliary signals from an input signal $x_1(t)$.

An example of a circuit which can be used to construct prime and auxiliary signals from a given input signal $x_1(t)$ is shown in FIG. 42.

Figure 43:
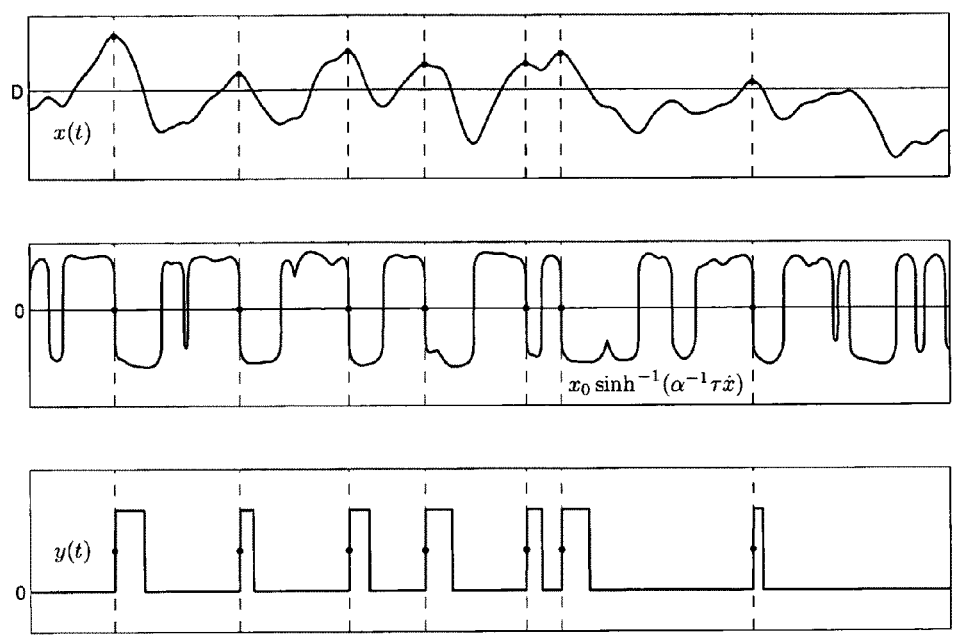
FIG. 43. Increasing timing accuracy of the BPS by using an auxiliary signal which is an even function of the derivative of the prime signal, such that the first derivative of this function has a sharp extremum at zero (for example, an inverse hyperbolic tangent).
Figure 44:
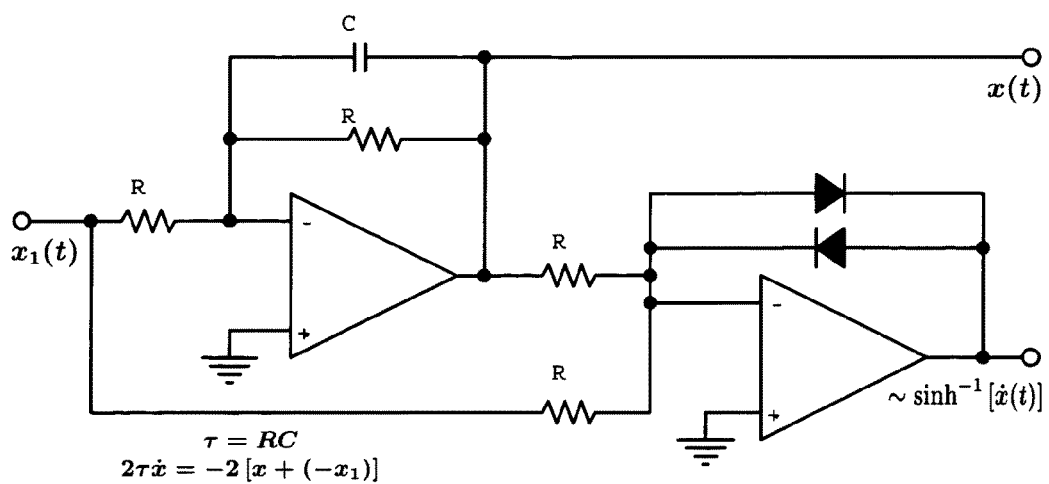
FIG. 44. Example of a BPS circuit with increased slew rate of zero crossings by the auxiliary signal.

Note that the timing accuracy of the BPS is proportional to the slew rate of the auxiliary signal around zero crossings. Thus this accuracy can be increased by using an auxiliary signal which is an even function of the derivative of the prime signal, such that the first derivative of this function has a sharp extremum at zero. An example of such a function can be, for example, an inverse hyperbolic tangent, as illustrated in FIG. 43. FIG. 44 provides an example of a BPS circuit with increased slew rate of zero crossings by the auxiliary signal.

7.1.2 Establishing LORAN Threshold Above Noise Floor with FrankenSPART Circuit A FrankenSPART circuit with the quantile parameter $q \neq 1/2$ can be used to establish the noise floor for a navigation signal such as LORAN. For example, for q=3/4 (third quartile), the output of a FrankenSPART circuit will be $\mu\tau/2$ for a low level noise (that is, the noise with rms $\sigma_n$ below $\mu\tau/2$), and will be approaching $\sigma_n\sqrt{2}\text{erf}^{-1}(1/2)$ for a high level noise (see FIG. 36). The example in FIG. 37 shows several LORAN pulses protruding from the noise, and the threshold levels established by a FrankenSPART circuit with $\tau$=3.4 ms and $\mu$=2 V/s, and a RMS circuit with the same time constant as the FrankenSPART. (Each circuit is followed by an RC integrator with RC=$\tau$ and the gain 6 and 4, respectively.)

From FIG. 37, one can see that the output of the FrankenSPART threshold circuit is largely unaffected by the signal pulses (and thus is immune to the cross rate interference), or by high level outliers such as lightning.

7.1.3 Monotonic Nonlinear Amplification of Prime Signal

Figure 45:
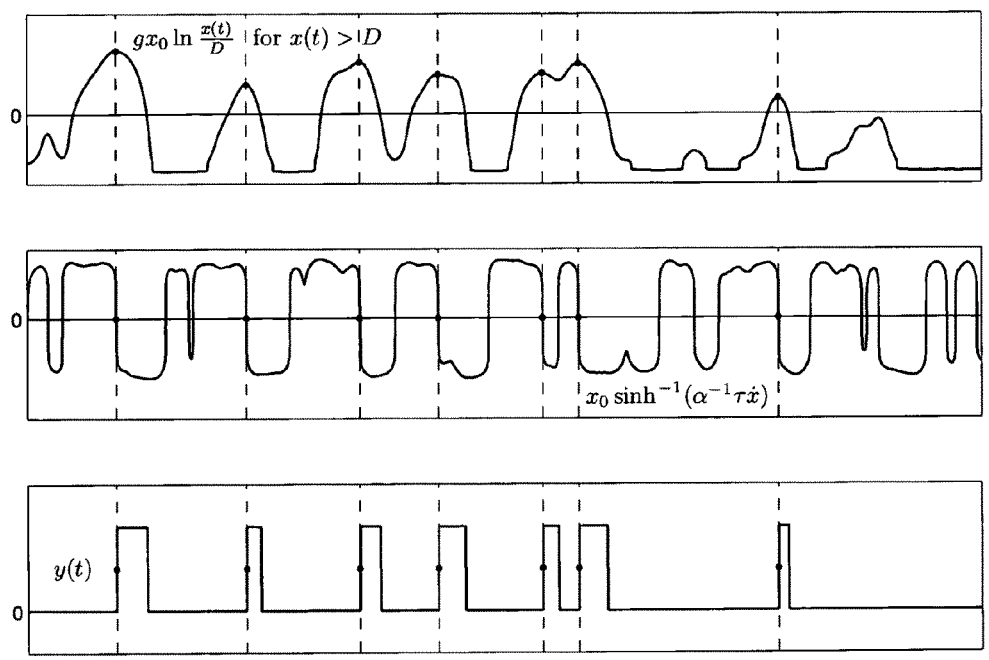
FIG. 45. Improving precision and extending the dynamic range of the amplitude measurements by using nonlinear BPS.
Figure 46:
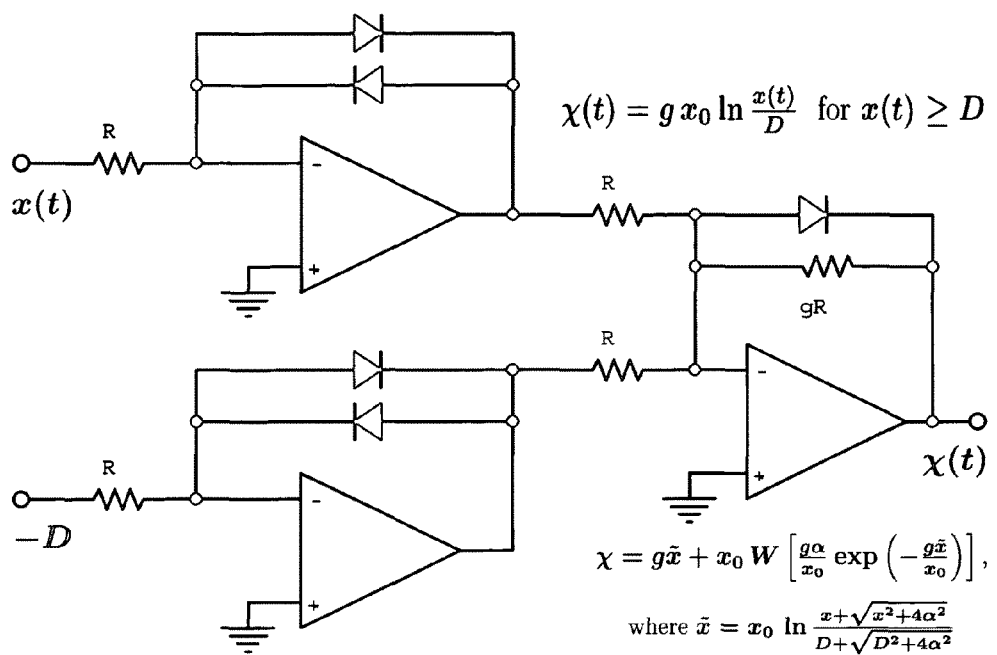
FIG. 46. Example of implementation of monotonic nonlinear amplifier for logarithmic transformation of the prime signal.

In addition to improving the timing accuracy, the precision of amplitude measurements can be increased by 'flattening' the maxima of the prime signal above a threshold thorough using an appropriate monotonic nonlinear transformation. If, for example, a logarithmic transformation is used, it will also extend the dynamic range of the amplitude measurements. This is illustrated in FIG. 45. In the figure, the positive part of the prime signal is proportional to the logarithm of the ratio of the prime signal x(t) before the transformation and the threshold D. FIG. 46 shows an example of a circuit for logarithmic transformation of the prime signal.

Bimodal pulse shaping enables coherent signal sampling, which leads to many benefits discussed later in this disclosure. In addition, it reduces (in combination with the sensibly established threshold) the data storage and processing needs by at least an order of magnitude, and increases accuracy and precision since the samples are taken only at the stationary points of the prime signal. Also, nonlinear BPS further improves precision and extends the dynamic range of the amplitude measurements.

7.1.4 Receiver Block Diagram

Figure 47:
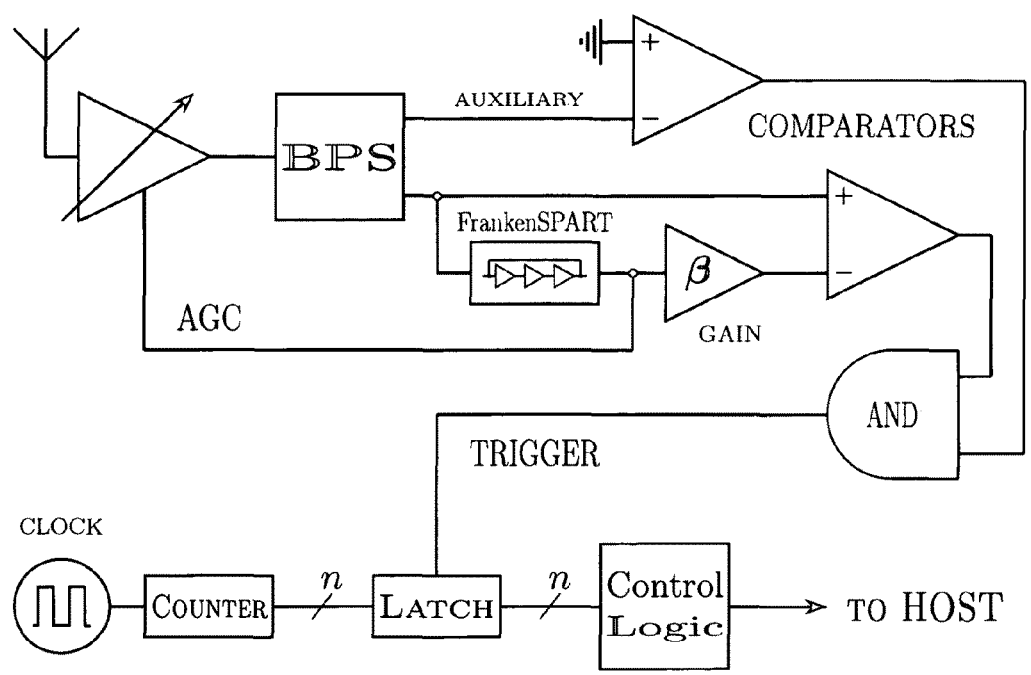
FIG. 47. Simplified receiver block diagram.

A simplified block diagram of a receiver is shown in FIG. 47.

The signal to host processor consists of a sequence of time values of the occurrence of the peaks above the FrankenSPART threshold (established as a β-gained third quartile output of the FrankenSPART filter), represented by n-bit numbers.

7.2 Post-Processing by Host DSP

The prototype LORAN receiver and receiver system shown in FIG. 47 implement coherent data sampling of only the time values of the signal peaks above the noise threshold. This reduces the data storage and processing needs by at least an order of magnitude, and increases timing accuracy since the samples are taken only at the stationary points of the prime signal. It also increases accuracy, precision, and resistance to noise by enabling post-processing based on order statistics.

After obtaining a record of said time values for a duration of at least several Group Repetition Intervals (GRIs), through post-processing by the host processor, we can then complete the tasks including, but not limited to, the following:

(1) for each GRI chain, detect and identify the master and the slaves;
(2) for each pulse group, construct a resulting single pulse synchronized with said pulse group;
(3) obtain the times of occurrence (as modulo GRI values) of any individual peak in said resulting single pulse;
(4) obtain the deviations of said times of occurrence;
(5) obtain the signs (polarity), and the amplitudes of said individual peaks;
(6) identify corresponding individual peaks in different single pulses synchronized with different pulse groups;
(7) obtain time delays between said corresponding individual peaks in different single pulses synchronized with different pulse groups;
(8) synchronize different GRI chains with each other, and
(9) obtain time delays between corresponding individual peaks in different single pulses synchronized with different pulse groups in different GRI chains.

ARTICLES OF MANUFACTURE

Various embodiments of the invention may include hardware, firmware, and software embodiments, that is, may be wholly constructed with hardware components, programmed into firmware, or be implemented in the form of a computer program code.

Still further, the invention disclosed herein may take the form of an article of manufacture. For example, such an article of manufacture can be a computer-usable medium containing a computer-readable code which causes a computer to execute the inventive method.

REFERENCES

M. Abramowitz and I. A. Stegun, editors. *Handbook of Mathematical Functions with Formulas, Graphs, and Mathematical Tables*. 9th printing. New York: Dover, 1972.

L. Cohen. *Time-frequency analysis*. Prentice-Hall, Englewood, N.J., 1995.

A. D iaz-Sánchez, J. Ramí irez-Angulo, A. Lopez-Martin, and E. Sánchez Sinencio. A fully parallel CMOS analog median filter. *IEEE Trans. Circuits & Systems II*, vol. 51:116-123, March 2004.

P. A. M. Dirac. *The Principles of Quantum Mechanics*. Oxford University Press, London, 4th edition, 1958.

P. J. S. G. Ferreira. Sorting continuous-time signals and the analog median filter. *IEEE Signal Processing Letters*, 7 (10):281-283, 2000.

I. S. Gradshteyn and I. M. Ryzhik. *Table of Integrals, Series, and Products*. Academic Press, 5th edition, 1994.

A. V. Nikitin. Method and apparatus for real-time signal conditioning, processing, analysis, quantification, comparison, and control, 2006, 2008, and 2009. U.S. Pat. No. 7,107,306 (Sep. 12, 2006), U.S. Pat. No. 7,418,469 (Aug. 26, 2008), and U.S. Pat. No. 7,617,270 (Nov. 10, 2009).

A. V. Nikitin. On the impulsive nature of interchannel interference in digital communication systems. In *Radio and Wireless Symposium (RWS)*. IEEE, 2011.

A. V. Nikitin and R. L. Davidchack. Signal analysis through analog representation. *Proc. R. Soc. Lond. A*, 459 (2033): 1171-1192, 2003.

A. V. Nikitin and R. L. Davidchack. Adaptive approximation of feedback rank filters for continuous signals. *Signal Processing*, 84 (4):805-811, 2004.

A. V. Nikitin and R. L. Davidchack. Method and apparatus for analysis of variables, 2006 and 2007. U.S. Pat. No. 7,133,568 (Nov. 7, 2006) and U.S. Pat. No. 7,242,808 (Jul. 10, 2007).

A. V. Nikitin, M. G. Frei, N. C. Bhavaraju, I. Osorio, and R. L. Davidchack. Method, computer program, and system for automated real-time signal analysis for detection, quantification, and prediction of signal changes. U.S. Pat. No. 6,768,969 (Jul. 27, 2004), U.S. Pat. No. 6,904,390 (Jun. 7, 2005), and U.S. Pat. No. 7,188,053 (Mar. 6, 2007).

A. V. Nikitin, R. L. Davidchack, and T. P. Armstrong. Analog multivariate counting analyzers. *Nucl. Instr. & Meth.*, A496 (2-3):465-480, 2003.

I. E. Opris. *Analog Rank Extractors and Sorting Networks*. Ph.D. Thesis, Stanford University, Calif., 1996.

S. Paul and K. Hüper. Analog rank filtering. *IEEE Trans. Circuits Syst.—I*, 40 (7):469-476, July 1993.

J. G. Proakis and D. G. Manolakis. *Digital signal processing: principles, algorithms, and applications*. Prentice Hall, 4th edition, 2006.

S. O. Rice. Mathematical analysis of random noise. *Bell System Technical Journal*, 23: 282-332, 1944. *Ibid.* 24:46-156, 1945. Reprinted in: Nelson Wax, editor, *Selected papers on noise and stochastic processes. Dover, N.Y.*, 1954.

R. P. Sallen and E. L. Key. A practical method of designing RC active filters. *IRE Transactions on Circuit Theory*, CT-2, 1955.

R. Schaumann and M. E. Van Valkenburg. *Design of Analog Filters*. Oxford University Press, 2001.

C. E. Shannon. Communication in the presence of noise. *Proc. Institute of Radio Engineers*, 37(1):10-21, January 1949.

S. Vlassis, K. Doris, S. Siskos, and I. Pitas. Analog implementation of erosion/dilation, median and order statistics filters. *Pattern Recognition*, 33(6):1023-1032, 2000.

Regarding the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A method for signal processing comprising the following steps:

(a) forming an output of a comparator by applying said comparator to the difference of a physical input signal and a feedback of a filtered output signal, where said comparator is characterized by a resolution parameter and said resolution parameter is proportional to the product of a time parameter and a slew rate parameter;

(b) forming a product output of said comparator by multiplying said output of the comparator by a value proportional to said slew rate parameter; and (c) integrating said product output of said comparator to obtain said filtered output signal.

2. A method for signal processing as recited in claim 1 wherein said method is additionally characterized by a quantile parameter and wherein an offset value indicative of said quantile parameter is added to said output of the comparator.

3. A method for signal processing as recited in claim 1 wherein said slew rate parameter is proportional to a measure of a range of the difference between said input signal and the response of a 1st order lowpass filter to said input signal, and wherein the time constant of said 1st order lowpass filter is equal to said time parameter.

4. A method for signal processing as recited in claim 3 wherein said measure of a range is a quantile value of the distribution of the absolute values of said difference.

5. A method for signal processing as recited in claim 3 wherein said measure of a range is an interquantile range of the distribution of said difference.

6. A method for signal processing as recited in claim 1 wherein said method as recited in claim 1 is a first instance of said method and wherein with respect to said first instance of said method said slew rate parameter is a control slew rate parameter, and comprising the following additional step:

(a) obtaining the absolute value of the difference between said input signal and said output signal; and further comprising a second instance of the method for signal processing as recited in claim 1, wherein said input signal is said absolute value of the difference obtained in step (a), and wherein said filtered output signal is proportional to said control slew rate parameter.

7. A method for signal processing as recited in claim 1 wherein said method as recited in claim 1 is a first instance of said method and wherein, with respect to said first instance of said method, said slew rate parameter is a control slew rate parameter, and comprising the following additional steps:

(a) obtaining a first difference between said input signal and said output signal;

(b) further comprising a second instance of the method for signal processing as recited in claim 1, wherein said method is additionally characterized by a quantile parameter, said quantile parameter is a first quantile parameter, and wherein a value indicative of said first quantile parameter is added to said output of the comparator, and wherein said input signal is said first difference obtained in step (a), and wherein said filtered output signal is a first output signal;

(c) further comprising a third instance of the method for signal processing as recited in claim 1 wherein said method is additionally characterized by a quantile parameter, said quantile parameter is a second quantile parameter different from said first quantile parameter, and wherein a value indicative of said second quantile parameter is added to said output of the comparator, and wherein said input signal is said first difference obtained in step (a), and wherein said filtered output signal is a second output signal; and (d) obtaining a second difference between said first output signal and said second output signal, wherein said second difference is proportional to said control slew rate parameter.

8. A method for signal processing as recited in claim 1 wherein said method as recited in claim 1 is a first instance of said method and wherein with respect to said first instance of said method said slew rate parameter is a control slew rate parameter, said time parameter is a first time parameter, and comprising the following additional steps:
- (a) obtaining the absolute value of the difference between said input signal and the response of a 1st order lowpass filter to said input signal, wherein the time constant of said 1st order lowpass filter is equal to said first time parameter; and
- (b) further comprising a second instance of the method for signal processing as recited in claim 1 wherein said input signal is said absolute value of the difference obtained in step (a), and wherein said filtered output signal is proportional to said control slew rate parameter.

9. A method for signal processing as recited in claim 1 wherein said method as recited in claim 1 is a first instance of said method and wherein with respect to said first instance of said method said slew rate parameter is a control slew rate parameter, said time parameter is a first time parameter, and comprising the following additional steps:
- (a) obtaining a first difference between said input signal and the response of a 1st order lowpass filter to said input signal, wherein the time constant of said 1st order lowpass filter is equal to said first time parameter;
- (b) further comprising a second instance of the method for signal processing as recited in claim 1 wherein said method is additionally characterized by a quantile parameter, said quantile parameter is a first quantile parameter, and wherein a value indicative of said first quantile parameter is added to said output of the comparator, and wherein said input signal is said first difference obtained in step (a), and wherein said filtered output signal is a first output signal;
- (c) further comprising a third instance of the method for signal processing as recited in claim 1 wherein said method is additionally characterized by a quantile parameter, said quantile parameter is a second quantile parameter different from said first quantile parameter, and wherein a value indicative of said second quantile parameter is added to said output of the comparator, and wherein said input signal is said first difference obtained in step (a), and wherein said filtered output signal is a second output signal; and
- (d) obtaining a second difference between said first output signal and said second output signal, wherein said second difference is proportional to said control slew rate parameter.

10. A method for signal processing as recited in claim 1 wherein said input signal is affected by non-Gaussian noise and wherein said slew rate parameter is chosen to improve quality of said filtered output signal.

11. A method for signal processing as recited in claim 10 wherein said non-Gaussian noise is characterized by an amplitude distribution and wherein said amplitude distribution is different from a Gaussian distribution.

12. A method for signal processing as recited in claim 1 wherein said input signal is affected by impulsive noise and wherein said slew rate parameter is chosen to improve quality of said filtered output signal.

13. A method for signal processing as recited in claim 12 wherein said impulsive noise is characterized by a high degree of peakedness.

14. A method for signal processing as recited in claim 1 wherein said slew rate parameter is proportional to a measure of a range of the difference between said input signal and said output signal.

15. A method for signal processing as recited in claim 14 wherein said measure of a range is a quantile value of the distribution of the absolute values of said difference.

16. A method for signal processing as recited in claim 14 wherein said measure of a range is an interquantile range of the distribution of said difference.

17. A method for signal processing as recited in claim 1 wherein said comparator is a clamping amplifier characterized by a gain value and a clamping value, and wherein when the magnitude of the input of said clamping amplifier is below the ratio of said clamping value and said gain value then the output of said clamping amplifier equals to the product of said input of said clamping amplifier and said gain value, and wherein when the magnitude of the input of said clamping amplifier is above said ratio then the output of said clamping amplifier is approximately equal to said clamping value, and wherein said resolution parameter equals to said ratio, and wherein the step of forming said product output of said comparator is accomplished by setting said clamping value.

18. A method for signal processing as recited in claim 17 wherein said method is additionally characterized by a quantile parameter and wherein an offset value indicative of said quantile parameter is added to said output of the comparator.

19. A method for signal processing as recited in claim 17 wherein said method as recited in claim 17 is a first instance of said method and wherein with respect to said first instance of said method said slew rate parameter is a control slew rate parameter, and comprising the following additional steps:
- (a) obtaining the absolute value of the difference between said input signal and said output signal; and
- (b) further comprising a second instance of the method for signal processing as recited in claim 17 wherein said input signal is said absolute value of the difference obtained in step (a), and wherein said filtered output signal is proportional to said control slew rate parameter.

20. A method for signal processing as recited in claim 17 wherein said method as recited in claim 17 is a first instance of said method and wherein, with respect to said first instance of said method, said slew rate parameter is a control slew rate parameter, and comprising the following additional steps:
- (a) obtaining a first difference between said input signal and said output signal;
- (b) further comprising a second instance of the method for signal processing as recited in claim 17 wherein said method is additionally characterized by a quantile parameter, said quantile parameter is a first quantile parameter, and wherein a value indicative of said first quantile parameter is added to said output of the comparator, and wherein said input signal is said first difference obtained in step (a), and wherein said filtered output signal is a first output signal;
- (c) further comprising a third instance of the method for signal processing as recited in claim 17 wherein said method is additionally characterized by a quantile parameter, said quantile parameter is a second quantile parameter different from said first quantile parameter, and wherein a value indicative of said second quantile parameter is added to said output of the comparator, and wherein said input signal is said first difference obtained in step (a), and wherein said filtered output signal is a second output signal; and (d) obtaining a second difference between said first output signal and said second output signal, wherein said second difference is proportional to said control slew rate parameter.

21. A method for signal processing as recited in claim 17 wherein said method as recited in claim 17 is a first instance of said method and wherein with respect to said first instance of said method said slew rate parameter is a control slew rate parameter, said time parameter is a first time parameter, and comprising the following additional steps:
(a) obtaining the absolute value of the difference between said input signal and the response of a 1st order lowpass filter to said input signal, wherein the time constant of said 1st order lowpass filter is equal to said first time parameter; and
(b) further comprising a second instance of the method for signal processing as recited in claim 17 wherein said input signal is said absolute value of the difference obtained in step (a), and wherein said filtered output signal is proportional to said control slew rate parameter.

22. A method for signal processing as recited in claim 17 wherein said method as recited in claim 17 is a first instance of said method and wherein with respect to said first instance of said method said slew rate parameter is a control slew rate parameter, said time parameter is a first time parameter, and comprising the following additional steps:
(a) obtaining a first difference between said input signal and the response of a 1st order lowpass filter to said input signal, wherein the time constant of said 1st order lowpass filter is equal to said first time parameter;
(b) further comprising a second instance of the method for signal processing as recited in claim 17 wherein said method is additionally characterized by a quantile parameter, said quantile parameter is a first quantile parameter, and wherein a value indicative of said first quantile parameter is added to said output of the comparator, and wherein said input signal is said first difference obtained in step (a), and wherein said filtered output signal is a first output signal;
(c) further comprising a third instance of the method for signal processing as recited in claim 17 wherein said method is additionally characterized by a quantile parameter, said quantile parameter is a second quantile parameter different from said first quantile parameter, and wherein a value indicative of said second quantile parameter is added to said output of the comparator, and wherein said input signal is said first difference obtained in step (a), and wherein said filtered output signal is a second output signal; and
(d) obtaining a second difference between said first output signal and said second output signal, wherein said second difference is proportional to said control slew rate parameter.

23. A method for signal processing as recited in claim 17 wherein said input signal is affected by non-Gaussian noise and wherein said slew rate parameter is chosen to improve quality of said filtered output signal.

24. A method for signal processing as recited in claim 23 wherein said non-Gaussian noise is characterized by an amplitude distribution and wherein said amplitude distribution is different from a Gaussian distribution.

25. A method for signal processing as recited in claim 17 wherein said input signal is affected by impulsive noise and wherein said slew rate parameter is chosen to improve quality of said filtered output signal.

26. A method for signal processing as recited in claim 25 wherein said impulsive noise is characterized by a high degree of peakedness.

27. A method for signal processing as recited in claim 17 wherein said slew rate parameter is proportional to a measure of a range of the difference between said input signal and said output signal.

28. A method for signal processing as recited in claim 27 wherein said measure of a range is a quantile value of the distribution of the absolute values of said difference.

29. A method for signal processing as recited in claim 27 wherein said measure of a range is an interquantile range of the distribution of said difference.

30. A method for signal processing as recited in claim 17 wherein said slew rate parameter is proportional to a measure of a range of the difference between said input signal and the response of a 1st order lowpass filter to said input signal, and wherein the time constant of said 1st order lowpass filter is equal to said time parameter.

31. A method for signal processing as recited in claim 30 wherein said measure of a range is a quantile value of the distribution of the absolute values of said difference.

32. A method for signal processing as recited in claim 30 wherein said measure of a range is an interquantile range of the distribution of said difference.

33. An apparatus for signal processing operable to transform an input signal into a filtered output signal, comprising:
(a) a comparator operable to transform the difference of said input signal and a feedback of said filtered output signal into an output of a comparator, where said comparator is characterized by a resolution parameter and said resolution parameter is proportional to the product of a time parameter and a slew rate parameter;
(b) a multiplier operable to form a product of said output of said comparator and a value proportional to said slew rate parameter; and
(c) an integrator operable to integrate said product output of said comparator and to produce said filtered output signal.

34. An apparatus for signal processing as recited in claim 33 wherein said apparatus is additionally characterized by a quantile parameter and is additionally comprising an adder operable to add an offset value indicative of said quantile parameter to said output of the comparator.

35. An apparatus for signal processing as recited in claim 33 wherein said slew rate parameter is proportional to a measure of a range of the difference between said input signal and the response of a 1st order lowpass filter to said input signal, and wherein the time constant of said 1st order lowpass filter is equal to said time parameter.

36. An apparatus for signal processing as recited in claim 35 wherein said measure of a range is a quantile value of the distribution of the absolute values of said difference.

37. An apparatus for signal processing as recited in claim 35 wherein said measure of a range is an interquantile range of the distribution of said difference.

38. An apparatus for signal processing as recited in claim 33 wherein said apparatus as recited in claim 33 is a first instance of said apparatus and wherein with respect to said first instance of said apparatus said slew rate parameter is a control slew rate parameter, further comprising:
(a) a rectifier operable to provide the absolute value of the difference between said input signal and said output signal; and
(b) a second instance of the apparatus for signal processing as recited in claim 33 wherein said input signal is said absolute value of the difference provided by said rectifier, and wherein said filtered output signal is proportional to said control slew rate parameter.

39. An apparatus for signal processing as recited in claim 33 wherein said apparatus as recited in claim 33 is a first instance of said apparatus and wherein with respect to said first instance of said apparatus said slew rate parameter is a control slew rate parameter, further comprising:
  (a) a first difference circuit operable to obtain a first difference between said input signal and said output signal;
  (b) a second instance of the apparatus for signal processing as recited in claim 33 wherein said apparatus is additionally characterized by a quantile parameter, said quantile parameter is a first quantile parameter, and is additionally comprising an adder operable to add an offset value indicative of said first quantile parameter to said output of the comparator, and wherein said input signal is said first difference, and wherein said filtered output signal is a first output signal;
  (c) a third instance of the apparatus for signal processing as recited in claim 33 wherein said apparatus is additionally characterized by a quantile parameter, said quantile parameter is a second quantile parameter different from said first quantile parameter, and is additionally comprising an adder operable to add an offset value indicative of said second quantile parameter to said output of the comparator, and wherein said input signal is said first difference, and wherein said filtered output signal is a second output signal; and
  (d) a second difference circuit operable to obtain a second difference between said first output signal and said second output signal, wherein said second difference is proportional to said control slew rate parameter.

40. An apparatus for signal processing as recited in claim 33 wherein said apparatus as recited in claim 33 is a first instance of said apparatus and wherein with respect to said first instance of said apparatus said slew rate parameter is a control slew rate parameter, and wherein said time parameter is a first time parameter, further comprising:
  (a) a 1st order lowpass filter operable to produce a response to said input signal, wherein the time constant of said 1st order lowpass filter is equal to said first time parameter;
  (b) a rectifier operable to provide the absolute value of the difference between said input signal and said response to said input signal; and
  (c) a second instance of the apparatus for signal processing as recited in claim 33 wherein said input signal is said absolute value of the difference provided by said rectifier, and wherein said filtered output signal is proportional to said control slew rate parameter.

41. An apparatus for signal processing as recited in claim 33 wherein said apparatus as recited in claim 33 is a first instance of said apparatus and wherein with respect to said first instance of said apparatus said slew rate parameter is a control slew rate parameter, and wherein said time parameter is a first time parameter, further comprising:
  (a) a 1st order lowpass filter operable to produce a response to said input signal, wherein the time constant of said 1st order lowpass filter is equal to said first time parameter;
  (b) a first difference circuit operable to obtain a first difference between said input signal and said response to said input signal;
  (c) a second instance of the apparatus for signal processing as recited in claim 33 wherein said apparatus is additionally characterized by a quantile parameter, said quantile parameter is a first quantile parameter, and is additionally comprising an adder operable to add an offset value indicative of said first quantile parameter to said output of the comparator, and wherein said input signal is said first difference, and wherein said filtered output signal is a first output signal;
  (d) a third instance of the apparatus for signal processing as recited in claim 33 wherein said apparatus is additionally characterized by a quantile parameter, said quantile parameter is a second quantile parameter different from said first quantile parameter, and is additionally comprising an adder operable to add an offset value indicative of said second quantile parameter to said output of the comparator, and wherein said input signal is said first difference, and wherein said filtered output signal is a second output signal; and
  (e) a second difference circuit operable to obtain a second difference between said first output signal and said second output signal, wherein said second difference is proportional to said control slew rate parameter.

42. An apparatus for signal processing as recited in claim 33 wherein said input signal is affected by non-Gaussian noise and wherein said slew rate parameter is chosen to improve quality of said filtered output signal.

43. An apparatus for signal processing as recited in claim 42 wherein said non-Gaussian noise is characterized by an amplitude distribution and wherein said amplitude distribution is different from a Gaussian distribution.

44. An apparatus for signal processing as recited in claim 33 wherein said input signal is affected by impulsive noise and wherein said slew rate parameter is chosen to improve quality of said filtered output signal.

45. An apparatus for signal processing as recited in claim 44 wherein said impulsive noise is characterized by a high degree of peakedness.

46. An apparatus for signal processing as recited in claim 33 wherein said slew rate parameter is proportional to a measure of a range of the difference between said input signal and said output signal.

47. An apparatus for signal processing as recited in claim 46 wherein said measure of a range is a quantile value of the distribution of the absolute values of said difference.

48. An apparatus for signal processing as recited in claim 46 wherein said measure of a range is an interquantile range of the distribution of said difference.

49. An apparatus for signal processing as recited in claim 33 wherein said comparator is a clamping amplifier characterized by a gain value and a clamping value, and wherein when the magnitude of the input of said clamping amplifier is below the ratio of said clamping value and said gain value then the output of said clamping amplifier equals to the product of said input of said clamping amplifier and said gain value, and wherein when the magnitude of the input of said clamping amplifier is above said ratio then the output of said clamping amplifier is approximately equal to said clamping value, and wherein said resolution parameter equals to said ratio, and wherein the step of forming said product output of said comparator is accomplished by setting said clamping value.

50. An apparatus for signal processing as recited in claim 49 wherein said apparatus is additionally characterized by a quantile parameter and is additionally comprised of an adder operable to add an offset value indicative of said quantile parameter to said output of the comparator.

51. An apparatus for signal processing as recited in claim 49 wherein said apparatus as recited in claim 49 is a first instance of said apparatus and wherein with respect to said first instance of said apparatus said slew rate parameter is a control slew rate parameter, further comprising:

(a) a rectifier operable to provide the absolute value of the difference between said input signal and said output signal; and (b) a second instance of the apparatus for signal processing as recited in claim 49 wherein said input signal is said absolute value of the difference provided by said rectifier, and wherein said filtered output signal is proportional to said control slew rate parameter.

52. An apparatus for signal processing as recited in claim 49 wherein said apparatus as recited in claim 49 is a first instance of said apparatus and wherein with respect to said first instance of said apparatus said slew rate parameter is a control slew rate parameter, further comprising:

(a) a first difference circuit operable to obtain a first difference between said input signal and said output signal;

(b) a second instance of the apparatus for signal processing as recited in claim 49 wherein said apparatus is additionally characterized by a quantile parameter, said quantile parameter is a first quantile parameter, and is additionally comprising an adder operable to add an offset value indicative of said first quantile parameter to said output of the comparator, and wherein said input signal is said first difference, and wherein said filtered output signal is a first output signal;

(c) a third instance of the apparatus for signal processing as recited in claim 49 wherein said apparatus is additionally characterized by a quantile parameter, said quantile parameter is a second quantile parameter different from said first quantile parameter, and is additionally comprising an adder operable to add an offset value indicative of said second quantile parameter to said output of the comparator, and wherein said input signal is said first difference, and wherein said filtered output signal is a second output signal; and (d) a second difference circuit operable to obtain a second difference between said first output signal and said second output signal, wherein said second difference is proportional to said control slew rate parameter.

53. An apparatus for signal processing as recited in claim 49 wherein said apparatus as recited in claim 49 is a first instance of said apparatus and wherein with respect to said first instance of said apparatus said slew rate parameter is a control slew rate parameter, and wherein said time parameter is a first time parameter, further comprising:

(a) a 1st order lowpass filter operable to produce a response to said input signal, wherein the time constant of said 1st order lowpass filter is equal to said first time parameter;

(b) a rectifier operable to provide the absolute value of the difference between said input signal and said response to said input signal; and (c) a second instance of the apparatus for signal processing as recited in claim 49 wherein said input signal is said absolute value of the difference provided by said rectifier, and wherein said filtered output signal is proportional to said control slew rate parameter.

54. An apparatus for signal processing as recited in claim 49 wherein said apparatus as recited in claim 49 is a first instance of said apparatus and wherein with respect to said first instance of said apparatus said slew rate parameter is a control slew rate parameter, and wherein said time parameter is a first time parameter, further comprising:

(a) a 1st order lowpass filter operable to produce a response to said input signal, wherein the time constant of said 1st order lowpass filter is equal to said first time parameter;

(b) a first difference circuit operable to obtain a first difference between said input signal and said response to said input signal;

(c) a second instance of the apparatus for signal processing as recited in claim 49 wherein said apparatus is additionally characterized by a quantile parameter, said quantile parameter is a first quantile parameter, and is additionally comprising an adder operable to add an offset value indicative of said first quantile parameter to said output of the comparator, and wherein said input signal is said first difference, and wherein said filtered output signal is a first output signal;

(d) a third instance of the apparatus for signal processing as recited in claim 49 wherein said apparatus is additionally characterized by a quantile parameter, said quantile parameter is a second quantile parameter different from said first quantile parameter, and is additionally comprising an adder operable to add an offset value indicative of said second quantile parameter to said output of the comparator, and wherein said input signal is said first difference, and wherein said filtered output signal is a second output signal; and (e) a second difference circuit operable to obtain a second difference between said first output signal and said second output signal, wherein said second difference is proportional to said control slew rate parameter.

55. An apparatus for signal processing as recited in claim 49 wherein said input signal is affected by non-Gaussian noise and wherein said slew rate parameter is chosen to improve quality of said filtered output signal.

56. An apparatus for signal processing as recited in claim 55 wherein said non-Gaussian noise is characterized by an amplitude distribution and wherein said amplitude distribution is different from a Gaussian distribution.

57. An apparatus for signal processing as recited in claim 49 wherein said input signal is affected by impulsive noise and wherein said slew rate parameter is chosen to improve quality of said filtered output signal.

58. An apparatus for signal processing as recited in claim 57 wherein said impulsive noise is characterized by a high degree of peakedness.

59. An apparatus for signal processing as recited in claim 49 wherein said slew rate parameter is proportional to a measure of a range of the difference between said input signal and said output signal.

60. An apparatus for signal processing as recited in claim 59 wherein said measure of a range is a quantile value of the distribution of the absolute values of said difference.

61. An apparatus for signal processing as recited in claim 59 wherein said measure of a range is an interquantile range of the distribution of said difference.

62. An apparatus for signal processing as recited in claim 49 wherein said slew rate parameter is proportional to a measure of a range of the difference between said input signal and the response of a 1st order lowpass filter to said input signal, and wherein the time constant of said 1st order lowpass filter is equal to said time parameter.

63. An apparatus for signal processing as recited in claim 62 wherein said measure of a range is a quantile value of the distribution of the absolute values of said difference.

64. An apparatus for signal processing as recited in claim 62 wherein said measure of a range is an interquantile range of the distribution of said difference.

* * * * *